US008969150B2

(12) United States Patent  
Katou et al.

(10) Patent No.: US 8,969,150 B2  
(45) Date of Patent: Mar. 3, 2015

(54) SEMICONDUCTOR DEVICE AND METHOD FOR MANUFACTURING THE SAME

(71) Applicant: Renesas Electronics Corporation, Kawasaki-shi, Kanagawa (JP)

(72) Inventors: Hiroaki Katou, Kanagawa (JP); Taro Moriya, Kanagawa (JP); Hiroyoshi Kudou, Kanagawa (JP); Satoshi Uchiya, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/324,632

(22) Filed: Jul. 7, 2014

(65) Prior Publication Data

US 2014/0322877 A1     Oct. 30, 2014

Related U.S. Application Data

(62) Division of application No. 13/766,148, filed on Feb. 13, 2013, now Pat. No. 8,803,226.

(30) Foreign Application Priority Data

Mar. 30, 2012   (JP) ................................. 2012-079892

(51) Int. Cl.
  *H01L 29/78*   (2006.01)
  *H01L 29/66*   (2006.01)

(52) U.S. Cl.
  CPC .............................. *H01L 29/66666* (2013.01)
  USPC ........... 438/237; 438/488; 438/489; 257/328; 257/330

(58) Field of Classification Search
  CPC ................................... H01L 29/7813–29/7818
  USPC .................................................. 257/324–330
  See application file for complete search history.

(56) References Cited

U.S. PATENT DOCUMENTS

| 6,351,018 | B1 | 2/2002 | Sapp |
| 2009/0230467 | A1 | 9/2009 | Nakazawa et al. |
| 2011/0068392 | A1 | 3/2011 | Matsuura et al. |
| 2013/0214378 | A1 | 8/2013 | Shirai et al. |

FOREIGN PATENT DOCUMENTS

| JP | 5-267588 A | 10/1993 |
| JP | 2002-538602 A | 11/2002 |
| JP | 2006-324412 A | 11/2006 |

*Primary Examiner* — Mamadou Diallo  
(74) *Attorney, Agent, or Firm* — Sughrue Mion, PLLC

(57) ABSTRACT

A trench gate type MISFET and a diode are formed in a semiconductor substrate. First and second trenches are formed in the semiconductor substrate. A gate electrode is formed in the first trench through a gate insulating film. A dummy gate electrode is formed in the second trench through a dummy gate insulating film. A cathode $n^+$-type semiconductor region and an anode p-type semiconductor region are formed in the semiconductor substrate and the second trench is formed so as to surround the $n^+$-type semiconductor region in a planar view. A part of the anode p-type semiconductor region is formed directly below the $n^+$-type semiconductor region, so that a PN junction is formed between the part of the anode p-type semiconductor region and the $n^+$-type semiconductor region. Thereby a diode is formed. The dummy gate electrode is electrically coupled to one of an anode and a cathode.

9 Claims, 45 Drawing Sheets

SEMICONDUCTOR DEVICE AND METHOD FOR MANUFACTURING THE SAME

CROSS-REFERENCE TO RELATED APPLICATIONS

This is a divisional application based upon U.S. patent application Ser. No. 13/766,148 filed Feb. 13, 2013, claiming priority based on Japanese Patent Application No. 2012-079892 filed Mar. 30, 2012, the contents of all of which are incorporated herein by reference in their entirety.

BACKGROUND

The present invention relates to a semiconductor device and a method for manufacturing the same. For example, the present invention can be suitably used to a semiconductor device including a trench gate type MISFET and a diode and a method for manufacturing the semiconductor device.

The trench gate type MISFET has a structure in which a gate electrode is buried in a trench dug in a main surface of a semiconductor substrate through a gate insulating film.

Japanese Unexamined Patent Publication No. Hei 5 (1993)-267588 describes a technique related to a semiconductor protection device suitable to prevent an internal circuit such as a bipolar transistor and a diode from being damaged.

Japanese Unexamined Patent Publication (Translation of PCT Application) No. 2002-538602 describes a technique related to a Schottky diode monolithically integrated along with a trenched-gate MOSFET.

In Japanese Unexamined Patent Publication No. 2006-324412 describes a technique related to a semiconductor device in which a PN junction diode is mounted to be able to detect operating temperature of a transistor element provided in an SOI layer surrounded by trench isolation regions in an SOI substrate.

SUMMARY

There is a case in which a diode is included in a semiconductor device including a trench gate type MISFET. It is desired that performance of such a semiconductor device is improved as much as possible.

Other problems and new features will be clear from the description of the present specification and the attached drawings.

According to an embodiment, in a semiconductor device including a trench gate type field effect transistor and a diode which are formed in a semiconductor substrate, a first semiconductor region of a first conductivity type and a second semiconductor region of a second conductivity type, which are used for the diode, are formed in the semiconductor substrate. A trench in which a conductive material is buried is formed in the semiconductor substrate so as to surround the second semiconductor region in a planar view. A part of the first semiconductor region is located directly below the second semiconductor region and a PN junction for the diode is formed between the second semiconductor region and the part of the first semiconductor region. The conductive material buried in the trench is electrically coupled to the first semiconductor region or the second semiconductor region.

According to another embodiment, a method for manufacturing a semiconductor device including a trench gate type field effect transistor and a diode which are formed in a semiconductor substrate forms a first trench and a second trench in the semiconductor substrate, and thereafter, forms a gate electrode of the trench gate type field effect transistor in the first trench through a gate insulating film and forms a dummy gate electrode in the second trench through a dummy gate insulating film. The method also forms a first semiconductor region of a first conductivity type and a second semiconductor region of a second conductivity type, which are used for the diode, in the semiconductor substrate. At this time, the second semiconductor region is planarly surrounded by the second trench, and a part of the first semiconductor region is formed directly below the second semiconductor region to form a PN junction for the diode between the second semiconductor region and the part of the first semiconductor region. The conductive material buried in the trench is electrically coupled to the first semiconductor region or the second semiconductor region.

According to an embodiment, the performance of the semiconductor device can be improved.

DETAILED DESCRIPTION

Figure 1:
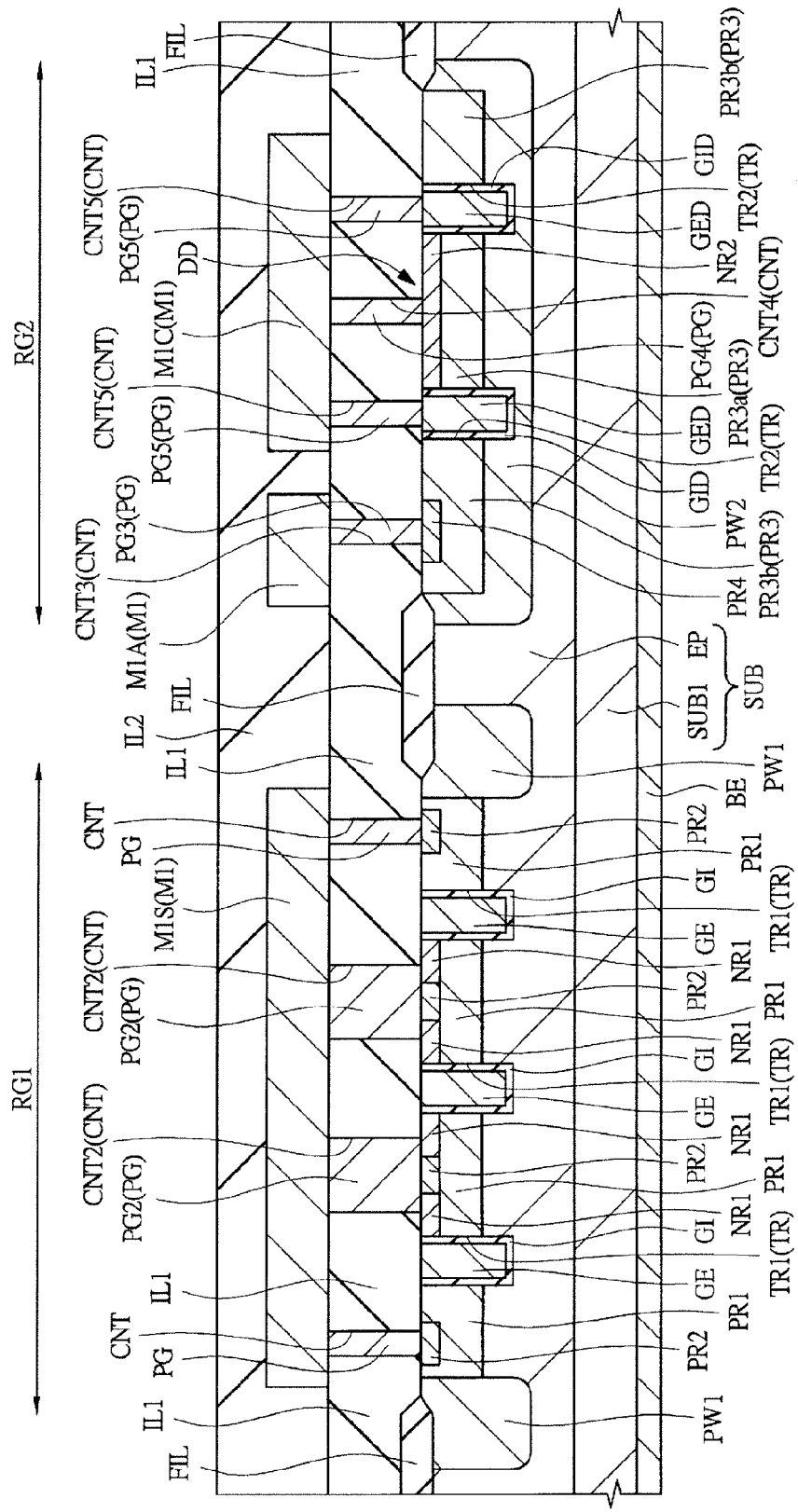
FIG. 1 is a main part cross-sectional view of a semiconductor device according to an embodiment.

In the embodiments described below, the present invention will be described in a plurality of sections or embodiments when required as a matter of convenience. However, these sections or embodiments are not irrelevant to each other unless otherwise stated, and the one relates to the entire or a part of the other as a modified example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, the embodiments will be described in detail with reference to the drawings. Still further, components having the same function are denoted by the same reference symbols throughout the drawings for describing the embodiments, and the repetitive description thereof is omitted. In the embodiments described below, in principle, the same or similar component will not be repeatedly described unless otherwise required.

Still further, in the drawings used in the embodiments, hatching may be omitted even in a cross-sectional view so as to make the drawings easy to see. On the other hand, hatching may be used even in a plan view so as to make the drawings easy to see.

First Embodiment

<Structure of Semiconductor Device>

Figure 2:
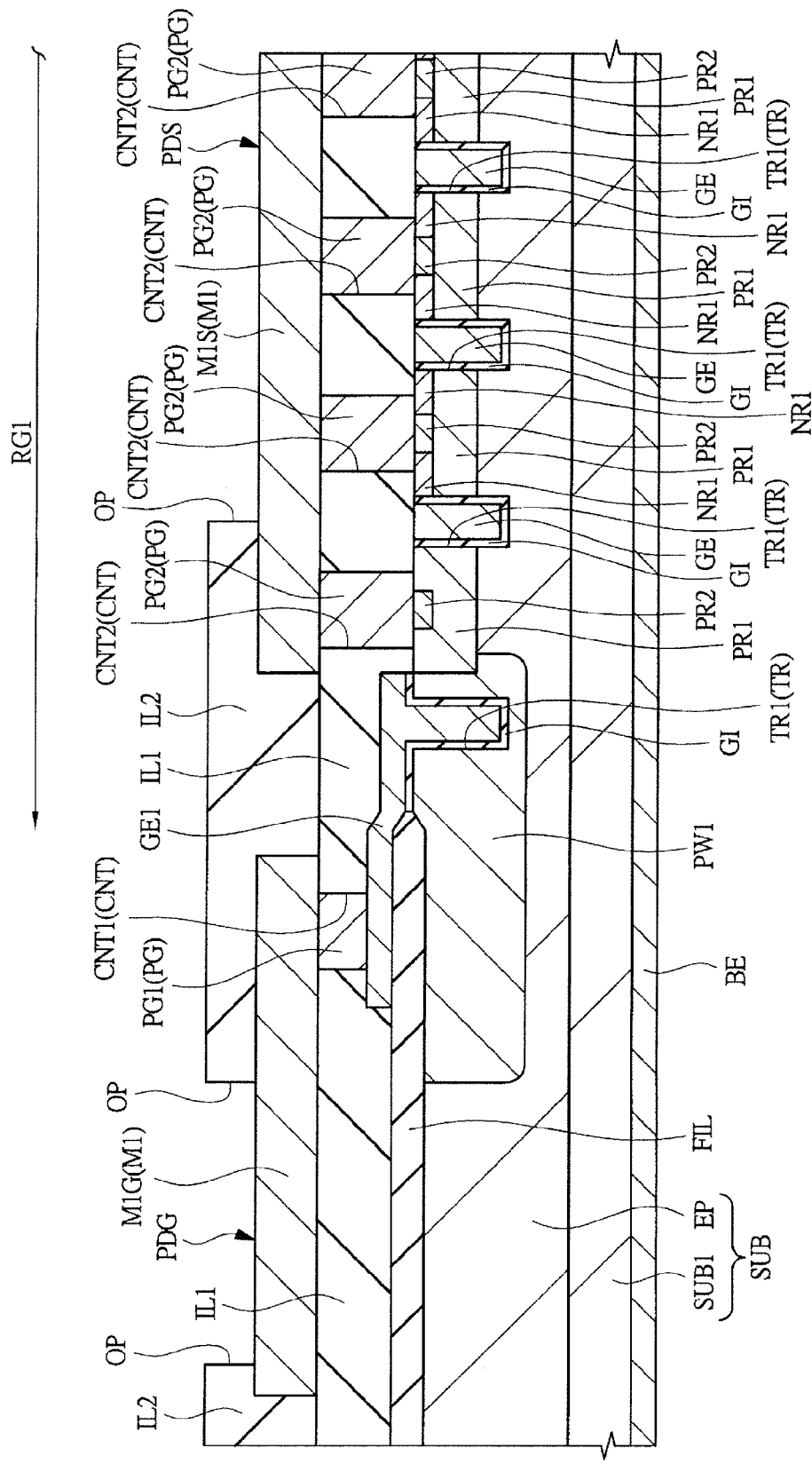
FIG. 2 is a main part cross-sectional view of the semiconductor device according to the embodiment.
Figure 3:
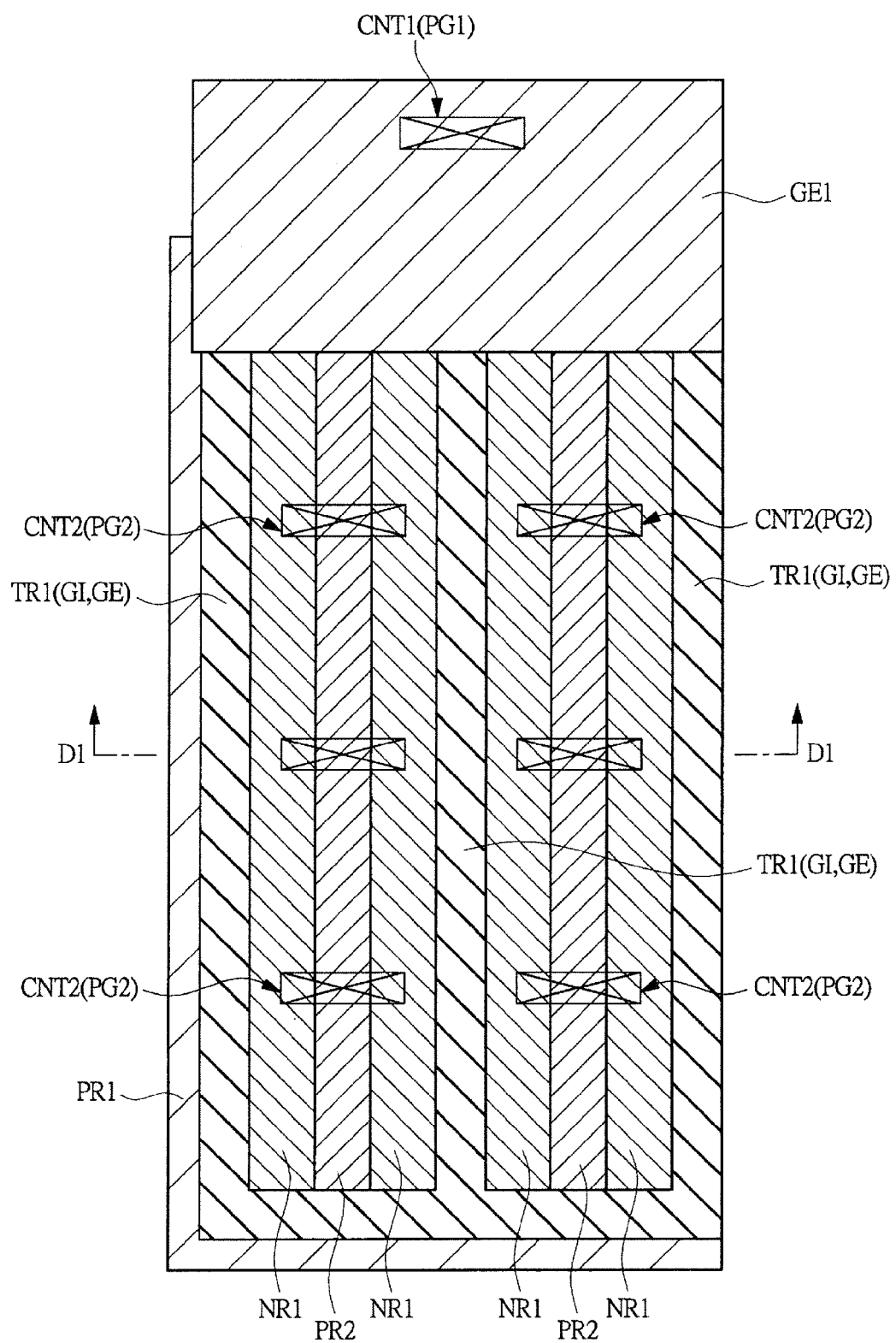
FIG. 3 is a main part plan view of the semiconductor device according to the embodiment.
Figure 4:
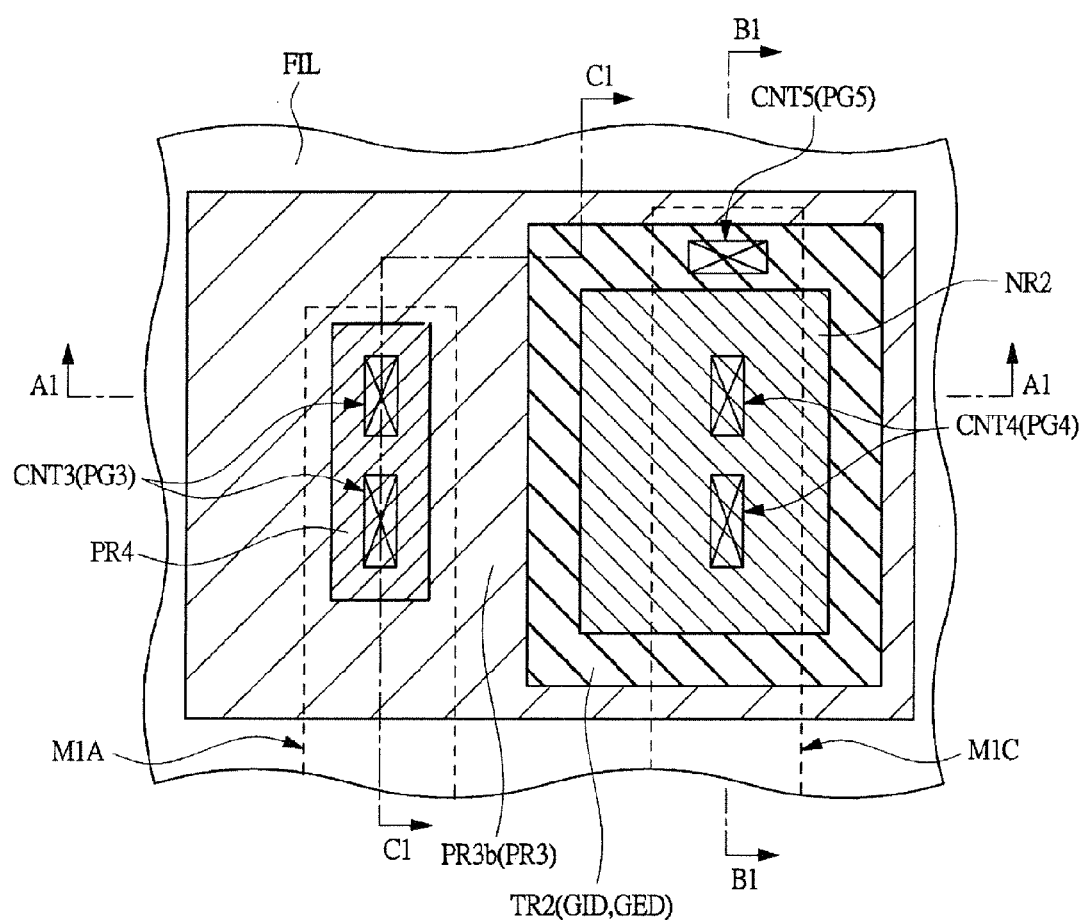
FIG. 4 is a main part plan view of the semiconductor device according to the embodiment.
Figure 5:
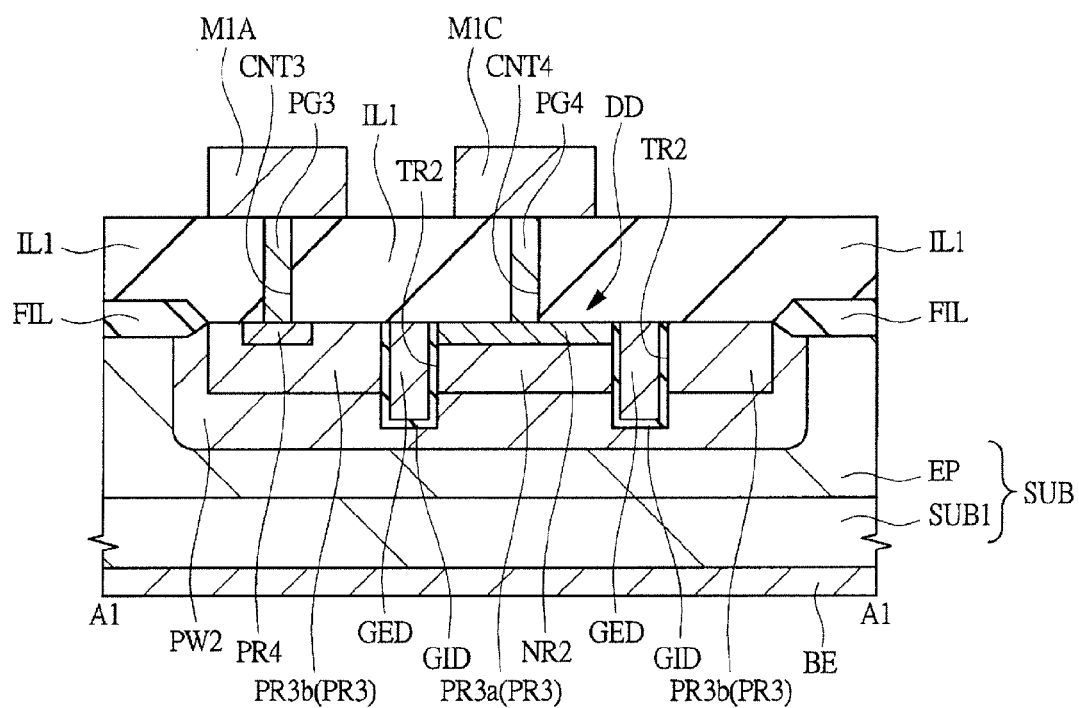
FIG. 5 is a cross-sectional view taken along a line A1-A1 in FIG. 4.
Figure 6:
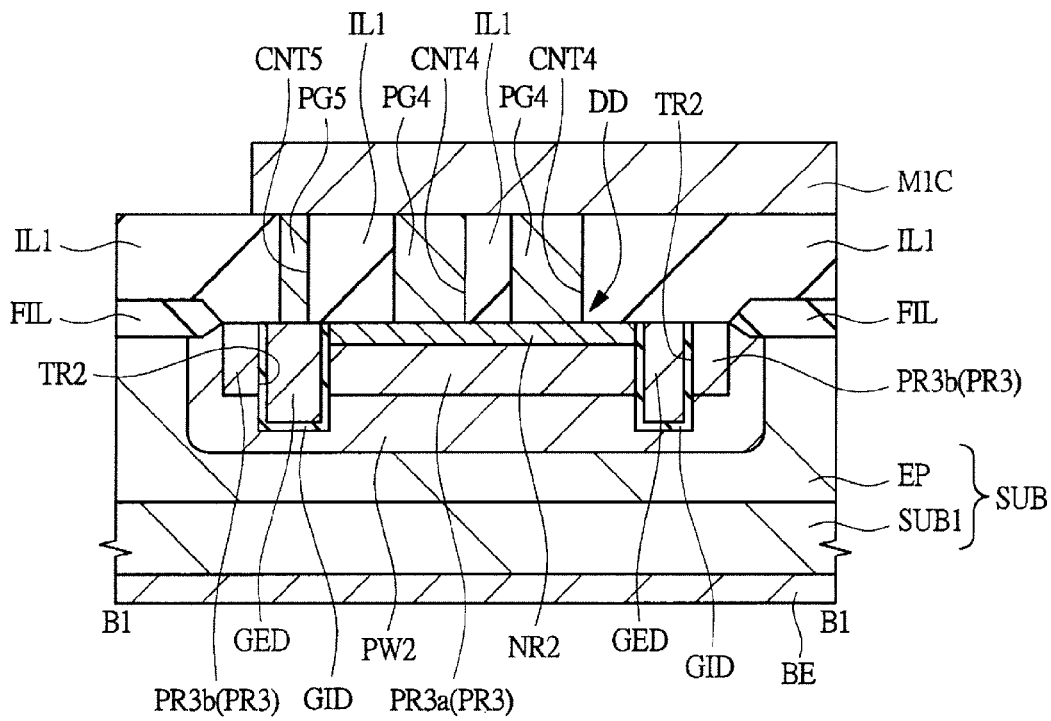
FIG. 6 is a cross-sectional view taken along a line B1-B1 in FIG. 4.
Figure 7:
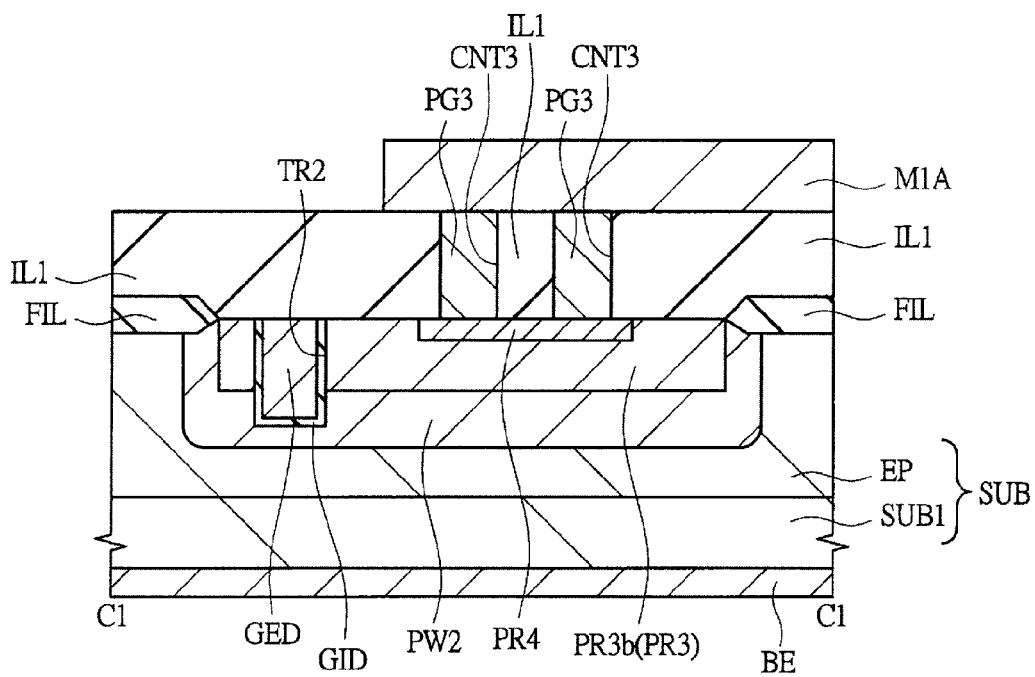
FIG. 7 is a cross-sectional view taken along a line C1-C1 in FIG. 4.

FIGS. 1 and 2 are main part cross-sectional views of a semiconductor device according to the present embodiment. FIG. 3 is a main part plan view of the semiconductor device according to the present embodiment and shows a main part plan view of a MISFET forming region RG1. A cross section of the MISFET forming region RG1 in FIG. 1 substantially corresponds to a cross section taken along a line D1-D1 in FIG. 3. FIG. 4 is a main part plan view of the semiconductor device according to the present embodiment and shows a plan view of a diode forming region RG2. FIGS. 5 to 7 are main part cross-sectional views of the semiconductor device according to the present embodiment and show a cross section of the diode forming area RG2. A cross-sectional view taken along a line A1-A1 in FIG. 4 corresponds to FIG. 5. A cross-sectional view taken along a line B1-B1 in FIG. 4 corresponds to FIG. 6. A cross-sectional view taken along a line C1-C1 in FIG. 4 corresponds to FIG. 7. In FIGS. 5 to 7, an insulating film IL2 is not shown so as to make the drawings easy to see.

FIG. 3 is a plan view showing a main surface of a substrate SUB. In FIG. 3, to make the drawing easy to see, hatching is applied to p-type semiconductor regions PR1 and PR2, an n+-type semiconductor region NR1, a trench TR1, and a gate leader wiring part GE1. FIG. 4 is a plan view showing the main surface of the substrate SUB. In FIG. 4, to make the drawing easy to see, hatching is applied to a p-type semiconductor region PR3b, a p+-type semiconductor region RP4, an n+-type semiconductor region NR2, and a trench TR2. A gate electrode GE is buried in the trench TR1 through a gate insulating film GI. In FIG. 3, hatching with bold lines is applied to a region (planar region) where the trench TR1 is formed. FIG. 3 also shows the gate leader wiring part GE1. The gate leader wiring part GE1 is integrally formed with the gate electrode GE buried in the trench TR1. A dummy gate electrode GED is buried in the trench TR2 through a dummy gate insulating film GID. In FIG. 4, hatching with bold lines is applied to a region (planar region) where the trench TR2 is formed.

The semiconductor device according to the present embodiment is a semiconductor device including a diode and a trench gate type field effect transistor, for example, a trench gate type MISFET (Metal Insulator Semiconductor Field Effect Transistor). Therefore, the semiconductor device according to the present embodiment includes a MISFET forming region RG1 in which the trench gate type MISFET is formed and a diode forming region RG2 in which the diode is formed. The MISFET forming region RG1 and the diode forming region RG2 are formed in regions different from each other in the main surface of the same semiconductor substrate SUB.

Although FIG. 1 shows a case in which the diode forming region RG2 is arranged adjacent to the MISFET forming region RG1, it is not limited to this, and the MISFET forming region RG1 and the diode forming region RG2 need not be adjacent to each other. However, the MISFET forming region RG1 and the diode forming region RG2 are formed in the same semiconductor substrate SUB.

FIG. 2 shows not only the MISFET forming region RG1, but also a region (gate leader region) which leads the gate electrode of the trench gate type MISFET formed in the MISFET forming region RG1 by the gate leader wiring part GE1.

Hereinafter, a structure of the semiconductor device according to the present embodiment will be specifically described with reference to FIGS. 1 to 3.

A trench gate type MISFET (MISFET having a trench type gate structure) and a diode are formed over a main surface of a semiconductor substrate (hereinafter simply referred to as a substrate) SUB. As shown in FIG. 1, the substrate SUB includes, for example, a substrate main body (semiconductor substrate, semiconductor wafer) SUB1 formed of n+-type single crystal silicon doped with arsenic (As) and the like and an epitaxial layer (semiconductor layer) EP formed of, for example, n−-type single crystal silicon formed over the main surface of the substrate main body SUB1. Therefore, the substrate SUB is a so-called epitaxial wafer. Although, the substrate main body SUB1 and the epitaxial layer EP have the same conductivity type (here, n-type), the impurity concentration (n-type impurity concentration) of the substrate main body SUB1 is higher than that of the epitaxial layer EP and the resistivity (specific resistance) of the substrate main body SUB1 is lower than that of the epitaxial layer EP. The epitaxial layer EP is formed by epitaxial growth over the main surface of the substrate main body SUB1.

A field insulating film (element separation region) FIL formed of, for example, silicon oxide is formed over a main surface of the epitaxial layer EP. The field insulating film FIL is formed of an insulator such as silicon oxide and can function as an element separation region to define (demarcate) an active region. The MISFET forming region RG1 and the diode forming region RG2 are electrically separated from each other by the field insulating film FIL. In other words, the MISFET forming region RG1 and the diode forming region RG2 are active regions which are electrically separated from each other by the field insulating film FIL (that is, active regions, each of which is planarly surrounded by the field insulating film FIL).

A trench gate type MISFET is formed in the epitaxial layer EP in the MISFET forming region RG1 and a diode element is formed in the epitaxial layer EP in the diode forming region RG2. First, a configuration of the trench gate type MISFET formed in the MISFET forming region RG1 will be described. The trench gate type MISFET is a MISFET having a trench type gate structure (a structure in which a gate electrode is buried in a trench provided in the substrate).

In the MISFET forming region RG1, a plurality of unit transistor cells are formed in an active region surrounded by the field insulating film FIL and a p-type well PW1 below the field insulating film FIL. These unit transistor cells provided in the MISFET forming region RG1 are coupled in parallel, so that a power MISFETQ1 is formed. Each unit transistor cell is formed by a trench gate type MISFET (MISFET having a trench type gate structure). The trench gate type MISFET that forms each unit transistor cell is an n-channel type MISFET.

The substrate main body SUB1 and the epitaxial layer EP (epitaxial layer EP in the MISFET forming region RG1) have a function as a drain region of the unit transistor cell. Over the entire surface of the back surface of the substrate SUB (that is, the back surface of the substrate main body SUB1), a back surface electrode (back surface drain electrode, drain electrode) BE for the drain electrode is formed. The back surface electrode BE can be formed by, for example, a laminated film including a titanium (Ti) layer, a nickel (Ni) layer, and a gold (Au) layer in order from the back surface of the substrate SUB.

In the substrate SUB, the main surface opposite to the surface over which the epitaxial layer EP is formed is referred to as the back surface of the substrate SUB. In the substrate main body SUB1, the main surface opposite to the surface over which the epitaxial layer EP is formed is referred to as the back surface of the substrate main body SUB1. Therefore, the back surface of the substrate SUB and the back surface of the substrate main body SUB1 are the same.

A p-type semiconductor region PR1 is formed in the epitaxial layer EP in the MISFET forming region RG1. The p-type semiconductor region PR1 has a function as a channel forming region of the unit transistor cell.

In the epitaxial layer EP of the MISFET forming region RG1, an n+-type semiconductor region NR1 is formed above the p-type semiconductor region PR1. The n+-type semiconductor region NR1 has a function as the source region of the unit transistor cell. Therefore, the n+-type semiconductor region NR1 is a source semiconductor region.

In the epitaxial layer EP of the MISFET forming region RG1, a p+-type semiconductor region PR2 is formed above the p-type semiconductor region PR1. The p+-type semiconductor region PR2 is formed adjacent to the n+-type semiconductor region NR1 as seen in the horizontal direction (the horizontal direction corresponds to a direction in parallel with the main surface of the substrate SUB). In other words, in the epitaxial layer EP of the MISFET forming region RG1, the n+-type semiconductor region NR1 is formed adjacent to the trench TR1 and the p+-type semiconductor region PR2 is formed away from the trench TR1 by the length of the n+-type semiconductor region NR1. Specifically, the n+-type semiconductor region NR1 and the p+-type semiconductor region PR2 are formed above the p-type semiconductor region PR1, the n+-type semiconductor region NR1 is formed adjacent to the trench TR1, and the p+-type semiconductor region PR2 is formed between the n+-type semiconductor regions NR1 adjacent to each other. Although the p+-type semiconductor region PR2 and the p-type semiconductor region PR1 have the same conductivity type, the impurity concentration (p-type impurity concentration) of the p+-type semiconductor region PR2 is higher than that of the p-type semiconductor region PR1.

In the substrate SUB, a trench TR extending from the main surface of the substrate SUB in the thickness direction of the substrate SUB is formed. As the trench TR, there are the trench TR1 formed in the epitaxial layer EP in the MISFET forming region RG1 and the trench TR2 formed in the epitaxial layer EP in the diode forming region RG2. The trench TR1 formed in the epitaxial layer EP in the MISFET forming region RG1 and the trench TR2 formed in the epitaxial layer EP in the diode forming region RG2 are formed in the same process. Therefore the depth (the depth position of the bottom) of the trench TR1 and the depth (the depth position of the bottom) of the trench TR2 are substantially the same.

The "depth" or the "depth position" corresponds to a distance (that is, a distance in a direction perpendicular to the main surface of the substrate SUB) from the main surface of the substrate SUB (that is, the main surface of the epitaxial layer EP). An area near the main surface of the substrate SUB (that is, the main surface of the epitaxial layer EP) is defined as a shallow area and an area far from the main surface of the substrate SUB (that is, the main surface of the epitaxial layer EP) is defined as a deep area (in other words, an area near the back surface of the substrate SUB is defined as a deep area).

In the MISFET forming region RG1, the trench TR1 is formed so that the trench TR1 penetrates (passes through) the n+-type semiconductor region NR1 and the p-type semiconductor region PR1 from the upper surface of the n+-type semiconductor region NR1 and terminates in the epitaxial layer EP below the p-type semiconductor region PR1. In other words, the bottom surface of the trench TR1 is deeper than the lower surface (bottom surface) of the p-type semiconductor region PR1. However, the bottom surface of the trench TR1 does not reach the substrate main body SUB1 and is located at an intermediate position in the epitaxial layer EP (an intermediate position in the depth direction).

The gate insulating film GI formed of an insulating film such as a silicon oxide film is formed over the bottom surface and the side surfaces of the trench TR1. The gate electrode GE is buried in the trench TR1 through the gate insulating film GI. The gate electrode GE is formed of a conductive film (conductive material film) buried in the trench TR1, for example, formed of a polycrystalline silicon film (doped silicon film) doped with n-type impurities (for example, phosphorus). The gate electrode GE has a function as the gate electrode of the unit transistor cell.

The gate leader wiring part (gate leader part) GE1 formed of a conductive film of the same layer as that of the gate electrode GE is formed over a part of the field insulating film FIL. The gate leader wiring part GE1 and the gate electrode GE are integrally formed together and electrically coupled to each other. The gate leader wiring part GE1 is a portion formed by elongating the gate electrode GE in the trench TR1 to the surface of the substrate SUB and extending the gate electrode GE over the surface of the substrate SUB, so that the gate leader wiring part GE1 can be assumed to be the gate leader part. In other words, the gate leader wiring part GE1 is the gate leader part which is integrally formed with the gate electrode GE buried in the trench TR1 and extends to a region over the substrate SUB outside the trench TR1.

The p-type well PW1 is formed in a peripheral part of the MISFET forming region RG1. The p-type well PW1 is located below the gate leader wiring part GE1. The bottom of the p-type well PW1 is deeper than the bottom of the trench TR1. Although the p-type well PW1 is adjacent to the p-type semiconductor region PR1 in a peripheral part of the MISFET forming region RG1, the bottom of the p-type well PW1 is deeper than the bottom of the p-type semiconductor region PR1.

Although the trenches TR1 shown in FIGS. 1 and 2 and the gate electrodes GE buried in the trenches TR1 extend in a direction perpendicular to the pages of FIGS. 1 and 2, the gate electrodes GE are integrally coupled together in a region not shown in the cross-sectional views of FIGS. 1 and 2. Therefore, the gate electrodes GE of the unit transistor cells formed in the MISFET forming region RG1 are electrically coupled to each other and also electrically coupled to the gate leader wiring part GE1.

Next, a configuration of the diode formed in the diode forming region RG2 will be described.

As shown in FIGS. 1 and 2, in the substrate SUB (more specifically, epitaxial layer EP) in the diode forming region RG2, a p-type well PW2, a p-type semiconductor region PR3, a p+-type semiconductor region PR4, an n+-type semiconductor region NR2, and a trench TR2 are formed. In the trench TR2, the dummy gate electrode GED is formed (buried) in the trench TR2 through the dummy gate insulating film GID.

The p-type well PW2, which is a p-type semiconductor region, is formed in the epitaxial layer EP in the diode forming region RG2. The p-type well PW2 is formed in the same process (the same ion implantation process) as that of the p-type well PW1 in the MISFET forming region RG1. Therefore, the p-type wells PW1 and PW2 are formed from the main surface of the epitaxial layer EP to a predetermined depth, and the depth of the p-type well PW2 in the diode forming region RG2 (the coupling depth, the depth position of the bottom) is substantially the same as the depth of the p-type well PW1 in the MISFET forming region RG1 (a coupling depth, a depth position of the bottom). The impurity concentration of the p-type well PW2 is substantially the same as that of the p-type well PW1.

In the diode forming region RG2, in an upper layer portion of the p-type well PW2, the p-type semiconductor region (p-type base region) PR3 is formed. In an upper layer portion of the p-type semiconductor region PR3, the p+-type semiconductor region PR4 and the n+-type semiconductor region NR2 are formed.

Although the p+-type semiconductor region PR4 and the p-type semiconductor region PR3 have the same conductivity type, the impurity concentration (p-type impurity concentration) of the p+-type semiconductor region PR4 is higher than that of the p-type semiconductor region PR3. Although the p-type semiconductor region PR3 and the p-type well PW2 have the same conductivity type, the impurity concentration (p-type impurity concentration) of the p-type semiconductor region PR3 is higher than that of the p-type well PW2.

The depth (the depth position of the bottom) of the p-type semiconductor region PR3 is shallower than the depth (the depth position of the bottom) of the p-type well PW2 and the depth (the depth position of the bottom) of the p+-type semiconductor region PR4 and the n+-type semiconductor region NR2 is shallower than the depth (the depth position of the bottom) of the p-type semiconductor region PR3. The depth (the depth position of the bottom) of the p+-type semiconductor region PR4 and the depth (the depth position of the bottom) of the n⁺-type semiconductor region NR2 may be the same or different from each other, and for example, they are substantially the same.

In the diode forming region RG2, the trench TR2 is formed in (the epitaxial layer EP of) the substrate SUB and the dummy gate insulating film GID formed of an insulating film such as a silicon oxide film is formed over the bottom surface and the side surfaces of the trench TR2. The dummy gate insulating film GID is an insulating film formed in the same process as that of the gate insulating film GI in the MISFET forming region RG1 and is formed of the same type (the same layer) of insulating layer as that of the gate insulating film GI. Therefore, the dummy gate insulating film GID and the gate insulating film GI are formed of the same insulating material. For example, when the gate insulating film GI is a silicon oxide film, the dummy gate insulating film GID is also formed of a silicon oxide film. The dummy gate insulating film GID and the gate insulating film GI are formed in the same process, so that they have substantially the same thickness.

The dummy gate electrode GED, which is a conductive material, is buried in the trench TR2 through the dummy gate insulating film GID, which is an insulating film. The dummy gate electrode GED is a conductive material and is formed of a conductive film (conductive material film) buried in the trench TR2. The dummy gate electrode GED is formed in the same process as that of the gate electrode GE in the MISFET forming region RG1. In other words, the dummy gate electrode GED is formed of a conductive material film formed in the same process as that of the gate electrode GE in the MISFET forming region RG1. Therefore, the dummy gate electrode GED is formed of the same type (the same layer) of conductive material film as that of the gate electrode GE. Therefore, the dummy gate electrode GED and the gate electrode GE are formed of the same material. For example, when the gate electrode GE is a polycrystalline silicon film, the dummy gate electrode GED is also formed of a polycrystalline silicon film.

Although the dummy gate electrode GED and the dummy gate insulating film GID are formed in the same process as that of the gate electrode GE and the gate insulating film GI that form the trench gate type MISFET, the dummy gate electrode GED and the dummy gate insulating film GID do not form the trench gate type MISFET. As a result, the dummy gate electrode GED does not function as the gate electrode of a transistor and the dummy gate insulating film GID does not function as the gate insulating film of a transistor. Therefore, the dummy gate electrode GED is a dummy (pseudo) gate electrode that does not function as the gate electrode of a transistor and the dummy gate insulating film GID is a dummy (pseudo) gate insulating film that does not function as the gate insulating film of a transistor.

As described above, the trench TR2, the dummy gate insulating film GID, and the dummy gate electrode GED in the diode forming region RG2 are formed in the same process as that of the trench TR1, the gate insulating film GI, and the gate electrode GE in the MISFET forming region RG1, so that they basically have similar cross section structures. However, positions (positions in a plan view) and functions of the trench TR2, the dummy gate insulating film GID, and the dummy gate electrode GED are different from those of the trench TR1, the gate insulating film GI, and the gate electrode GE.

The trench TR2 is formed so that the trench TR2 terminates in the p-type well PW2 in the diode forming region RG2. As a result, the bottom surface of the trench TR2 is deeper than each bottom surface (lower surface) of the p-type semiconductor region PR3, the p⁺-type semiconductor region PR4, and the n⁺-type semiconductor region NR2. However, the bottom surface of the trench TR2 is shallower than the bottom surface (lower surface) of the p-type well PW2. Therefore, the bottom surface of the trench TR2 does not reach the epitaxial layer EP which is an n⁻-type portion. The bottom surface is located at an intermediate position in the p-type well PW2 (an intermediate position in the depth direction) and the p-type well PW2 also extends directly below the trench TR2.

The n⁺-type semiconductor region NR2 in the diode forming region RG2 functions as the cathode of a diode. However, as found in FIGS. 4 to 7, the circumference of the n⁺-type semiconductor region NR2 is surrounded by the trench TR2 (the trench TR2 in which the dummy gate electrode GED is buried through the dummy gate insulating film GID) in a planar view. Therefore, the n⁺-type semiconductor region NR2 is adjacent to the trench TR2 in a planar view. However, the bottom surface of the n⁺-type semiconductor region NR2 is shallower than the bottom surface of the trench TR2. The "in a planar view" or "planarly" means a case in which components are seen in a plan view which is in parallel with the main surface of the substrate SUB.

The depth (the depth position of the bottom surface) of the p-type semiconductor region PR3 is shallower than the bottom of the trench TR2, so that the p-type semiconductor region PR3 is divided (separated) by the trench TR2. In other words, the p-type semiconductor region PR3 includes a p-type semiconductor region PR3a located directly below the n⁺-type semiconductor region NR2 and a p-type semiconductor region PR3b which does not overlap the n⁺-type semiconductor region NR2 in a planar view. Therefore, a portion (region) of the p-type semiconductor region PR3 which is located directly below the n⁺-type semiconductor region NR2 corresponds to the p-type semiconductor region PR3a and a portion (region) of the p-type semiconductor region PR3 other than the portion of the p-type semiconductor region PR3 which is located directly below the n⁺-type semiconductor region NR2 (that is, the p-type semiconductor region PR3a) corresponds to the p-type semiconductor region PR3b.

The n⁺-type semiconductor region NR2 and the p-type semiconductor region PR3a overlap each other in the vertical direction (that is, the thickness direction of the substrate SUB). However, the p-type semiconductor region PR3b does not overlap the n⁺-type semiconductor region NR2. The p-type semiconductor region PR3a and the p-type semiconductor region PR3b are separated by the trench TR2 (the trench TR2 in which the dummy gate insulating film GID and the dummy gate electrode GED are buried). Specifically, in a planar view, there is the trench TR2 (the trench TR2 in which the dummy gate insulating film GID and the dummy gate electrode GED are buried) between the p-type semiconductor region PR3a and the p-type semiconductor region PR3b and the depth of the trench TR2 is deeper than the depth (the depth position of the bottom) of the p-type semiconductor regions PR3a and PR3b, so that the p-type semiconductor region PR3a and the p-type semiconductor region PR3b are not in direct contact with each other.

In the present embodiment, the p-type semiconductor region PR3a is formed directly below the n⁺-type semiconductor region NR2 in the same planer region as the n⁺-type semiconductor region NR2, so that, in FIG. 4, the region where the p-type semiconductor region PR3a is formed is the same (in a planar view) as the region where the n⁺-type semiconductor region NR2 is formed.

There is the trench TR2 (the trench TR2 in which the dummy gate insulating film GID and the dummy gate electrode GED are buried) between a laminated structure of the n⁺-type semiconductor region NR2 and the p-type semiconductor region PR3a which overlap each other in the vertical direction and the p-type semiconductor region PR3b. Specifically, the trench TR2 (the trench TR2 in which the dummy gate insulating film GID and the dummy gate electrode GED are buried) surrounds the circumference (the circumference in a planar view) of the laminated structure of the n$^+$-type semiconductor region NR2 and the p-type semiconductor region PR3a which overlap each other in the vertical direction. Therefore, the p-type semiconductor region PR3b is not in contact with any of the n$^+$-type semiconductor region NR2 and the p-type semiconductor region PR3a. In summary, the n$^+$-type semiconductor region NR2 is in contact with the p-type semiconductor region PR3a, but not in contact with the p-type semiconductor region PR3b, the p-type semiconductor region PR3a is in contact with the n$^+$-type semiconductor region NR2, but not in contact with the p-type semiconductor region PR3b, and the p-type semiconductor region PR3b is not in contact with either of the n$^+$-type semiconductor region NR2 or the p-type semiconductor region PR3a.

The p$^+$-type semiconductor region PR4 is formed so that the depth (the depth position of the bottom) thereof is shallower than the depth (the depth position of the bottom) of the p-type semiconductor region PR3b. The p$^+$-type semiconductor region PR4 is formed so that the upper surface thereof is exposed in the surface of the substrate SUB and the side surface and the bottom surface thereof are in contact with the p-type semiconductor region PR3b. In other words, the p$^+$-type semiconductor region PR4 is formed to be enclosed by an upper portion of the p-type semiconductor region PR3b. Therefore, the p$^+$-type semiconductor region PR4 is in contact with the p-type semiconductor region PR3b and is electrically coupled to the p-type semiconductor region PR3b. The p$^+$-type semiconductor region PR4 does not overlap either of the n$^+$-type semiconductor region NR2 or the p-type semiconductor region PR3a in a planar view and is not in contact with either of them. The p$^+$-type semiconductor region PR4 is formed to reduce the contact resistance of a plug PG3. The plug PG3 described later is formed over the p$^+$-type semiconductor region PR4.

The depth (the depth position of the bottom) of the p-type well PW2 is deeper than the depth (the depth position of the bottom) of the trench TR2. The p-type well PW2 is in contact with both the p-type semiconductor region PR3a and the p-type semiconductor region PR3b and also extends below the trench TR2 located between the p-type semiconductor region PR3a and the p-type semiconductor region PR3b. In other words, the p-type well PW2 is continuously formed over a region directly below the p-type semiconductor region PR3a, a region directly below the trench TR2 located between the p-type semiconductor region PR3a and the p-type semiconductor region PR3b, and a region directly below the p-type semiconductor region PR3b. Therefore, the p-type semiconductor region PR3a and the p-type semiconductor region PR3b are electrically coupled to each other through the p-type well PW2. Therefore, the p-type semiconductor region PR3a is electrically coupled to the p$^+$-type semiconductor region PR4 through the p-type well PW2 and the p-type semiconductor region PR3b. The p-type well PW2, the p-type semiconductor region PR3a, the p-type semiconductor region PR3b, and the p$^+$-type semiconductor region PR4 are semiconductor regions having the same conductivity type (here, p-type) and these regions (PW2, PR3, and PW4) are in contact with each other, so that the p-type well PW2, the p-type semiconductor region PR3a, the p-type semiconductor region PR3b, and the p$^+$-type semiconductor region PR4 are electrically coupled to each other.

Therefore, when seeing a cross section of the diode forming region RG2, which is perpendicular to the main surface of the substrate SUB, there is the p-type semiconductor region PR3a below the n$^+$-type semiconductor region NR2, there is the p-type well PW2 below the p-type semiconductor region PR3a, and further, there is the epitaxial layer EP, which is an n$^-$-type portion, below the p-type well PW2. Further, when seeing a cross section of the diode forming region RG2, which is perpendicular to the main surface of the substrate SUB, there is the p-type semiconductor region PR3b below the p$^+$-type semiconductor region PR4, there is the p-type well PW2 below the p-type semiconductor region PR3b, and further, there is the epitaxial layer EP, which is an n$^-$-type portion, below the p-type well PW2.

The n$^+$-type semiconductor region NR2 in the diode forming region RG2 functions as the cathode of a diode and the p-type semiconductor region PR3a in contact with the n$^+$-type semiconductor region NR2 (that is, the p-type semiconductor region PR3a which is located below the n$^+$-type semiconductor region NR2 and is in contact with the n$^+$-type semiconductor region NR2) functions as the anode of a diode. In other words, the n$^+$-type semiconductor region NR2 and the p-type semiconductor region PR3a are adjacent to each other in the depth direction and a PN junction is formed (on an interface) between the n$^+$-type semiconductor region NR2 and the p-type semiconductor region PR3a, so that a diode (diode element, PN diode, diode DD) is formed. Hereinafter, the diode formed in the diode forming region RG2 is referred to as a diode DD. The depth direction and the thickness direction of the substrate SUB are different words having the same meaning and both directions are directions substantially perpendicular to the main surface of the substrate SUB.

As described above, the trench gate type MISFET is formed in (the epitaxial layer EP of) the substrate SUB in the MISFET forming region RG1 and the diode element (diode DD) is formed in (the epitaxial layer EP of) the substrate SUB in the diode forming region RG2.

Next, a structure of layers higher than the epitaxial layer EP will be described.

An insulating film (interlayer insulating film) IL1 is formed over the main surface of the substrate SUB (that is, the main surface of the epitaxial layer EP) so as to cover the gate leader wiring part GE1, the gate electrode GE, and the dummy gate electrode GED. The insulating film IL1 is an interlayer insulating film, which is formed of, for example, a silicon oxide film.

Contact holes (opening portion, through hole) CNT are formed in the insulating film IL1. A contact hole (opening portion, through hole) CNT1 of the contact holes CNT is formed (arranged) above the gate leader wiring part GE1. A part of the gate leader wiring part GE1 is exposed at the bottom of the contact hole CNT1. A contact hole (opening portion, through hole) CNT2 of the contact holes CNT is formed (arranged) between the trenches TR1 adjacent to each other in a planar view in the MISFET forming region RG1. The n$^+$-type semiconductor region NR1 and the p$^+$-type semiconductor region PR2 are exposed at the bottom of the contact hole CNT2.

A contact hole (opening portion, through hole) CNT3 of the contact holes CNT formed in the insulating film IL1 is formed (arranged) above the p$^+$-type semiconductor region PR4 in the diode forming region RG2. A part of the p$^+$-type semiconductor region PR4 is exposed at the bottom of the contact hole CNT3. A contact hole (opening portion, through hole) CNT4 of the contact holes CNT is formed (arranged) above the n$^+$-type semiconductor region NR2 in the diode forming region RG2. A part of the p$^+$-type semiconductor region PR4 is exposed at the bottom of the contact hole CNT4. A contact hole (opening portion, through hole) CNT5 of the contact holes CNT is formed (arranged) above the dummy gate electrode GED in the diode forming region RG2. A part of the dummy gate electrode GED is exposed at the bottom of the contact hole CNT5.

An electrically conductive plug PG is buried in the contact hole CNT as a conductive material (a coupling conductor).

Although the plug PG is formed by a thin barrier conductor film formed over the bottom and the side wall (side surface) of the contact hole CNT and a main conductor film formed to bury the contact hole CNT over the barrier conductor film, for simplicity of the drawing, the barrier conductor film and the main conductor film which form the plug PG are integrally shown in FIG. 1. The barrier conductor film included in the plug PG may be, for example, a titanium film, a titanium nitride film, or a laminated film of these. The main conductor film included in the plug PG may be a tungsten film. The plug PG can be integrally formed with a wiring M1 described later. In this case, the plug PG is formed by a part of the wiring M1.

A plug PG1 of the plug PGs, which is buried in the contact hole CNT1, is in contact with the gate leader wiring part GE1 at the bottom of the plug PG1. Therefore, the plug PG1 is electrically coupled to the gate leader wiring part GE1 at the bottom of the plug PG1. A plug PG2 of the plug PGs, which is buried in the contact hole CNT2 in the MISFET forming region RG1, is in contact with the $n^+$-type semiconductor region NR1 and the $p^+$-type semiconductor region PR2 at the bottom of the plug PG2. Therefore, the plug PG2 is electrically coupled to the $n^+$-type semiconductor region NR1 and the $p^+$-type semiconductor region PR2 at the bottom of the plug PG2. The plug PG2 is electrically coupled to the $n^+$-type semiconductor region NR1 and also electrically coupled to the $p^+$-type semiconductor region PR2, and the $p^+$-type semiconductor region PR2 is in contact with the p-type semiconductor region PR1 and electrically coupled to the p-type semiconductor region PR1. Therefore, the plug PG2 is electrically coupled to the channel forming p-type semiconductor region PR1 through the $p^+$-type semiconductor region PR2. The plug PG2 is electrically coupled to a source wiring M1S. Therefore, the source wiring M1S is electrically coupled not only to the source $n^+$-type semiconductor region NR1, but also to the channel forming p-type semiconductor region PR1, so that the base potential can be held constant.

A plug PG3 of the plug PGs, which is buried in the contact hole CNT3 in the diode forming region RG2, is in contact with the $p^+$-type semiconductor region PR4 at the bottom of the plug PG3. Therefore, the plug PG3 is electrically coupled to the $p^+$-type semiconductor region PR4 at the bottom of the plug PG3. A plug PG4 of the plug PGs, which is buried in the contact hole CNT4 in the diode forming region RG2, is in contact with the $n^+$-type semiconductor region NR2 at the bottom of the plug PG4. Therefore, the plug PG4 is electrically coupled to the $n^+$-type semiconductor region NR2 at the bottom of the plug PG4. A plug PG5 of the plug PGs, which is buried in the contact hole CNT5 in the diode forming region RG2, is in contact with the dummy gate electrode GED at the bottom of the plug PG5. Therefore, the plug PG5 is electrically coupled to the dummy gate electrode GED at the bottom of the plug PG5.

The wiring M1 formed of a conductive film is formed over the insulating film IL1 in which the plugs PG are buried. The wiring M1 includes a gate wiring M1G, a source wiring M1S, an anode wiring M1A, and a cathode wiring M1C.

A part of the gate wiring M1G of the wiring M1 extends over the plug PG1 and is in contact with the plug PG1, so that the gate wiring M1G is electrically coupled to the plug PG1. Therefore, the gate wiring M1G is electrically coupled to the gate leader wiring part GE1 through the plug PG1. Thus, the gate wiring M1G is electrically coupled to the gate electrode GE in the MISFET forming region RG1 through the plug PG1 and the gate leader wiring part GE1.

A part of the source wiring M1S of the wiring M1 extends over the plug PG2 and is in contact with the plug PG2, so that the source wiring M1S is electrically coupled to the plug PG2. Therefore, the source wiring M1S is electrically coupled to the $n^+$-type semiconductor region NR1 and the $p^+$-type semiconductor region PR2 through the plug PG2.

A part of the anode wiring M1A of the wiring M1 extends over the plug PG3 and is in contact with the plug PG3, so that the anode wiring M1A is electrically coupled to the plug PG3. Therefore, the anode wiring M1A is electrically coupled to the $p^+$-type semiconductor region PR4 through the plug PG3.

A part of the cathode wiring M1C of the wiring M1 extends over the plug PG4 and is in contact with the plug PG4, so that the cathode wiring M1C is electrically coupled to the plug PG4. Therefore, the cathode wiring M1C is electrically coupled to the $n^+$-type semiconductor region NR2 through the plug PG4.

The cathode wiring M1C is electrically coupled to the $n^+$-type semiconductor region NR2 through the plug PG4 and the anode wiring M1A is electrically coupled to the p-type semiconductor region PR3$a$ through the plug PG3, the $p^+$-type semiconductor region PR4, the p-type semiconductor region PR3$b$, and the p-type well PW2. Further, a PN junction is formed between the p-type semiconductor region PR3$a$ and the $n^+$-type semiconductor region NR2, so that the diode DD is formed.

In other words, the diode DD is formed by forming the PN junction between the $n^+$-type semiconductor region NR2 and the p-type semiconductor region PR3$a$, so that the cathode of the diode DD (the $n^+$-type semiconductor region NR2) is electrically coupled to the cathode wiring M1C through the plug PG4. The anode of the diode DD (the p-type semiconductor region PR3$a$) is electrically coupled to the anode wiring M1A through the p-type well PW2, the $p^+$-type semiconductor region PR4, and the plug PG3.

A part of one of the anode wiring M1A to which the plug PG3 is coupled and the cathode wiring M1C to which the plug PG4 is coupled extends over the plug PG5 and is in contact with the plug PG5, so that the part is electrically coupled to the plug PG5. Therefore, the dummy gate electrode GED is electrically coupled to one of the anode wiring M1A and the cathode wiring M1C through the plug PG5.

Specifically, the contact hole CNT5 is formed above the trench TR2 surrounding the circumference (the circumference in a planar view) of the $n^+$-type semiconductor region NR2 and the plug PG5 buried in the contact hole CNT5 is in contact with the dummy gate electrode GED buried in the trench TR2 and is electrically coupled to the dummy gate electrode GED. The plug PG5 is electrically coupled to one of the anode wiring M1A and the cathode wiring M1C. Although FIGS. 1 and 4 to 7 show a case in which the dummy gate electrode GED is electrically coupled to the cathode wiring M1C through the plug PG5, as shown in FIGS. 36 to 39 described later, the dummy gate electrode GED can be coupled to the anode wiring M1A instead of the cathode wiring M1C through the plug PG5.

In the case of FIG. 4, the contact hole CNT5 is formed to be enclosed by the trench TR2 in a planar view. In this case, the bottom of the plug PG5 buried in the contact hole CNT5 is in contact with only the dummy gate electrode GED (or the dummy gate electrode GED and the dummy gate insulating film GID).

However, when the plug PG5 is coupled to the cathode wiring M1C (that is, when the dummy gate electrode GED is electrically coupled to the n⁺-type semiconductor region NR2), the contact hole CNT5 may protrude from the trench TR2 in a planar view and a part of the n⁺-type semiconductor region NR2 can be exposed from the contact hole CNT5. In this case, the bottom of the plug PG5 buried in the contact hole CNT5 is in contact with both the dummy gate electrode GED and the n⁺-type semiconductor region NR2 and electrically coupled to them.

On the other hand, when the plug PG5 is coupled to the anode wiring M1A (that is, when the dummy gate electrode GED is electrically coupled to the p-type semiconductor region), the contact hole CNT5 may protrude from the trench TR2 in a planar view and a part of the p-type semiconductor region PR3a (or the p⁺-type semiconductor region PR4) can be exposed from the contact hole CNT5. In this case, the bottom of the plug PG5 buried in the contact hole CNT5 is in contact with both the dummy gate electrode GED and the p-type semiconductor region PR3a (or the p⁺-type semiconductor region PR4) and electrically coupled to them.

Regarding the width of the trench TR2, a portion where the contact hole CNT5 is formed (a portion to which the plug PG5 is coupled) can be wider than the other portions. Also in this case, it is preferable that the trench TR2 have a width where the trench TR2 can be buried with the dummy gate electrode GED (that is, can be buried with a conductive material film CDP described later).

The gate wiring M1G, the source wiring M1S, the anode wiring M1A, and the cathode wiring M1C are formed by forming a conductive film (conductive material film) over the insulating film IL1 in which the plugs PG are buried and patterning the conductive film. In other words, the gate wiring M1G, the source wiring M1S, the anode wiring M1A, and the cathode wiring M1C are formed by a patterned conductive film. The conductive film is formed of a metal film and is preferably formed of an aluminum film or an aluminum alloy film. Therefore, the gate wiring M1G, the source wiring M1S, the anode wiring M1A, and the cathode wiring M1C are formed of a conductive film of the same layer. However, the gate wiring M1G, the source wiring M1S, the anode wiring M1A, and the cathode wiring M1C are separated from each other.

FIGS. 1, 2, and 5 to 7 show a case in which the plugs PG and the wiring M1 are formed separately from each other. As another form, the plugs PG and the wiring M1 are formed integrally. In this case, the plug PG1 and the gate wiring M1G are formed integrally, the plug PG2 and the source wiring M1S are formed integrally, the plug PG3 and the anode wiring M1A are formed integrally, the plug PG4 and the cathode wiring M1C are formed integrally, and the plug PG5 and the cathode wiring M1C or the anode wiring M1A are formed integrally.

The wiring M1 (the gate wiring M1G, the source wiring M1S, the anode wiring M1A, and the cathode wiring M1C) is covered by an insulating film (protective film, surface protective film) IL2 for surface protection, which is formed of, for example, a polyimide resin. In other words, the insulating film IL2 is formed over the insulating film IL1 so as to cover the wiring M1 (the gate wiring M1G, the source wiring M1S, the anode wiring M1A, and the cathode wiring M1C). The insulating film IL2 is the uppermost film (insulating film) of the semiconductor device (semiconductor chip). A plurality of opening portions OP are formed in the insulating film IL2 and a part of the wiring M1 is exposed from each opening portion OP. The wiring M1 exposed from the opening portion OP is a bonding pad (pad electrode).

Specifically, a gate bonding pad PDG is formed by the gate wiring M1G exposed from an opening portion OP (an opening portion OP for forming a bonding pad for the gate among the opening portions OP) formed in the insulating film IL2. A source bonding pad PDS is formed by the source wiring M1S exposed from an opening portion OP (an opening portion OP for forming a bonding pad for the source among the opening portions OP) formed in the insulating film IL2. An anode pad electrode (not shown in the drawings) is formed by the anode wiring M1A exposed from an opening portion OP (an opening portion OP for forming a bonding pad for the anode among the opening portions OP) formed in the insulating film IL2. A cathode pad electrode (not shown in the drawings) is formed by the cathode wiring M1C exposed from an opening portion OP (an opening portion OP for forming a bonding pad for the cathode among the opening portions OP) formed in the insulating film IL2.

In the semiconductor device having such a configuration, an operating current of the trench gate type MISFET formed in the MISFET forming region RG1 flows in the thickness direction of the substrate SUB along the side surface of the gate electrode GE (that is, the side surface of the trench TR1) between the drain epitaxial layer EP and the source n⁺-type semiconductor region NR1. As a result, a channel is formed along the thickness direction of the substrate SUB. In the p-type semiconductor region PR1, a region adjacent to the gate electrode GE with the gate insulating film GI in between, that is, a region along the trench TR1 between the n⁺-type semiconductor region NR1 and the epitaxial layer EP is a channel forming region (channel layer).

Therefore, the trench gate type MISFET formed in the MISFET forming region RG1 is a vertical MISFET. Here, the vertical MISFET corresponds to a MISFET where a source-drain current flows in the thickness direction (a direction substantially perpendicular to the main surface of the semiconductor substrate) of the semiconductor substrate (here, the substrate SUB).

To flow a current in the trench gate type MISFET, a voltage greater than or equal to $V_{th}$ (turnover voltage of the channel, threshold voltage) is applied to the gate electrode GE from the bonding pad for the gate through the gate wiring M1G and the like. Thereby, it is possible to flow a current between the bonding pad PDS for the source and the back surface electrode BE through the source wiring M1S, the source region (n⁺-type semiconductor region NR1), the channel layer, the epitaxial layer EP (drain region), and the substrate main body SUB1.

In the present embodiment, as described above, the dummy gate electrode GED is coupled to one of the cathode wiring M1C and the anode wiring M1A. When the dummy gate electrode GED is coupled to the cathode wiring M1C, the dummy gate electrode GED is electrically coupled to the n⁺-type semiconductor region NR2 through the plug PG5, the cathode wiring M1C, and the plug PG4. When the dummy gate electrode GED is coupled to the anode wiring M1A, the dummy gate electrode GED is electrically coupled to the p⁺-type semiconductor region PR4 through the plug PG5, the anode wiring M1A, and the plug PG3.

In other words, the dummy gate electrode GED buried in the trench TR2 which surrounds the circumference (the circumference in a planar view) of the n⁺-type semiconductor region NR2 is electrically coupled to one of the anode and the cathode of the diode DD. When the dummy gate electrode GED is coupled to the cathode of the diode DD, the plug PG5 may be coupled to the cathode wiring M1C. Thereby, the dummy gate electrode GED is electrically coupled to the n⁺-type semiconductor region NR2 (cathode region) through the plug PG5, the cathode wiring M1C, and the plug PG4. On the other hand, when the dummy gate electrode GED is coupled to the anode of the diode DD, the plug PG5 may be coupled to the anode wiring M1A. Thereby, the dummy gate electrode GED is electrically coupled to the p-type semiconductor region PR3a (anode region) through the plug PG5, the anode wiring M1A, the plug PG3, the p+-type semiconductor region PR4, the p-type semiconductor region PR3b, and the p-type well PW2.

Thereby, the dummy gate electrode GED buried in the trench TR2 which surrounds the circumference (the circumference in a planar view) of the n+-type semiconductor region NR2 does not have floating potential, but has the same potential as that of one of the anode and the cathode of the diode DD. In other words, when the plug PG5 is coupled to the anode wiring M1A (that is, when the dummy gate electrode GED is coupled to the anode wiring M1A through the plug PG5), the dummy gate electrode GED has the same potential as that of the anode of the diode DD. When the plug PG5 is coupled to the cathode wiring M1C (that is, when the dummy gate electrode GED is coupled to the cathode wiring M1C through the plug PG5), the dummy gate electrode GED has the same potential as that of the cathode of the diode DD.

Here, a case in which an n-channel type trench gate MISFET is formed has been described. As another form, the conductive type of n-type and p-type can be reversed. In this case, a p-channel type trench gate MISFET is formed and the anode and the cathode of the diode are also reversed.

<Manufacturing Process of Semiconductor Device>

Figure 8:
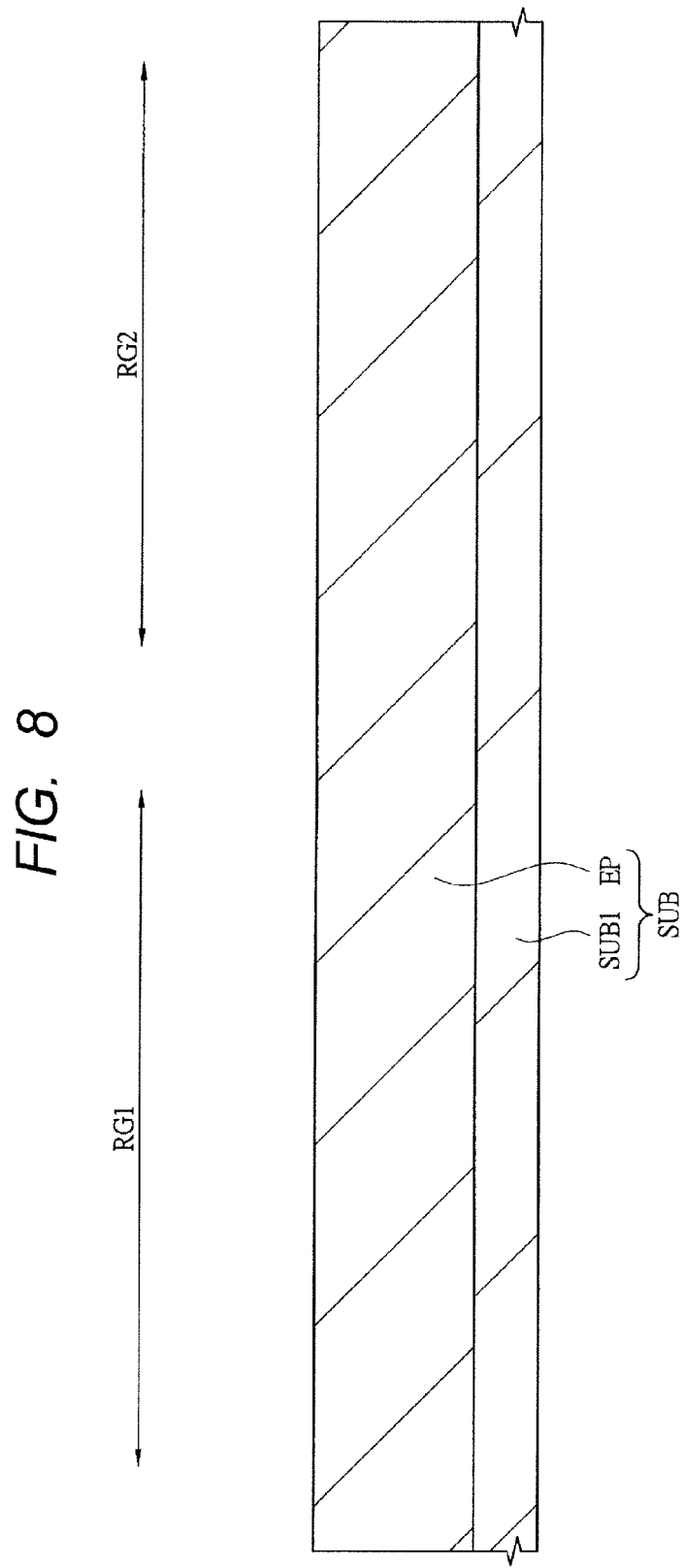
FIG. 8 is a main part cross-sectional view of the semiconductor device in a manufacturing process according to the embodiment.
Figure 9:
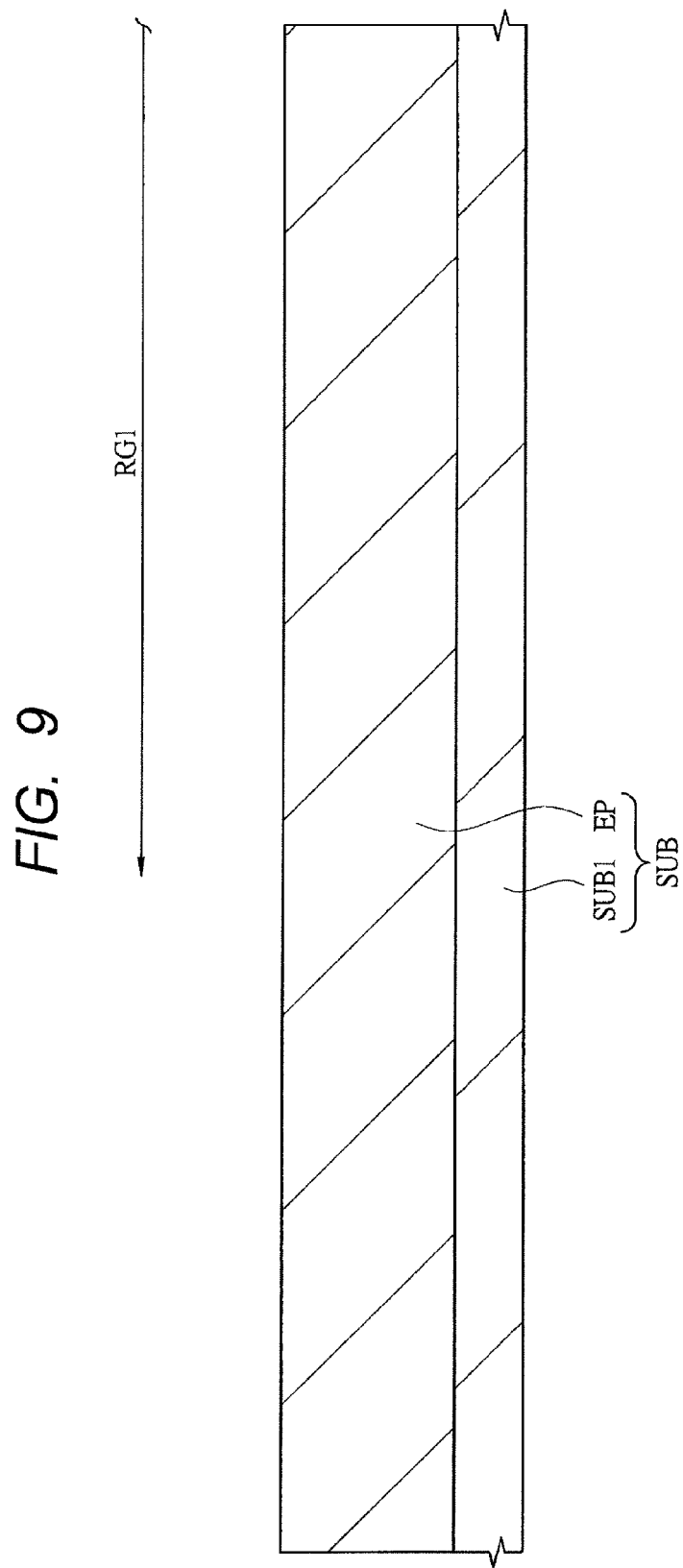
FIG. 9 is a main part cross-sectional view of the semiconductor device in the same manufacturing process as that in FIG. 8.
Figure 10:
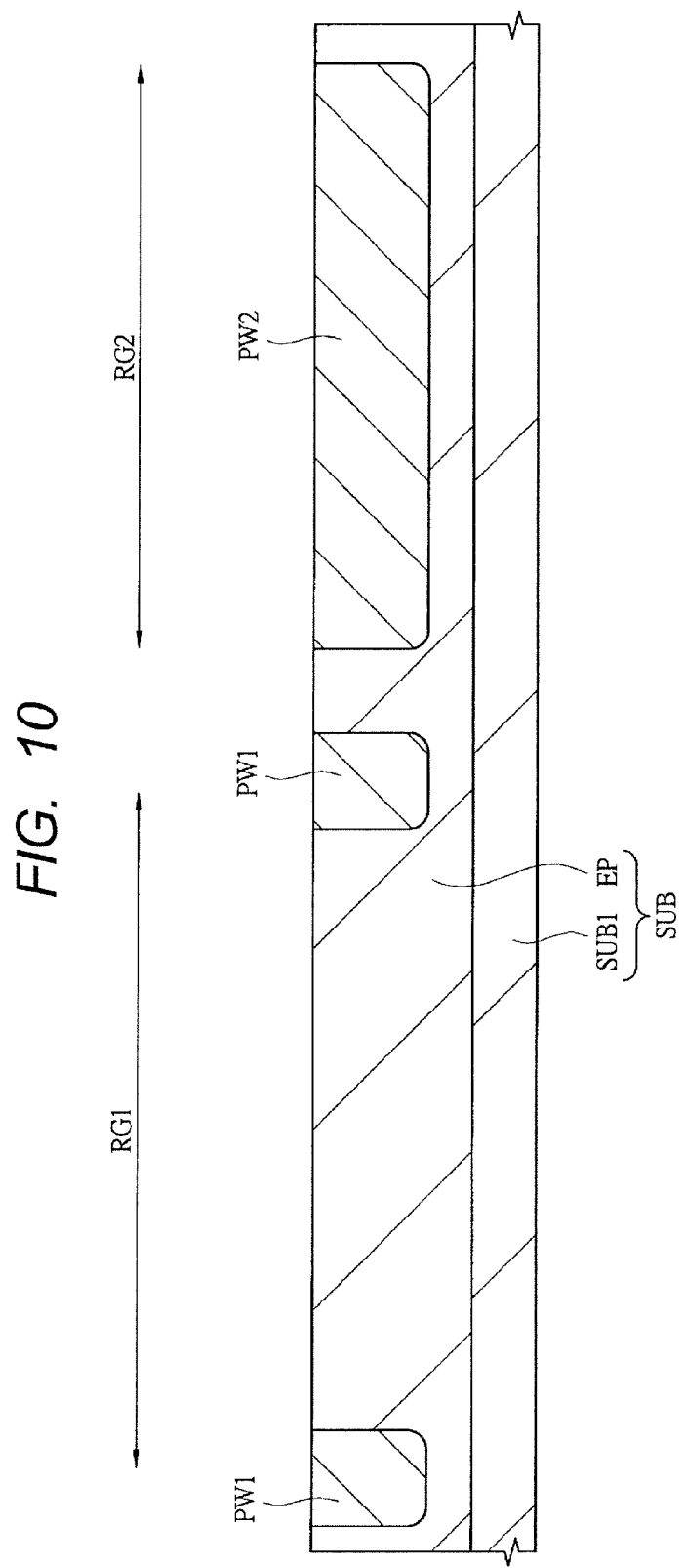
FIG. 10 is a main part cross-sectional view of the semiconductor device in a manufacturing process following FIG. 8.
Figure 11:
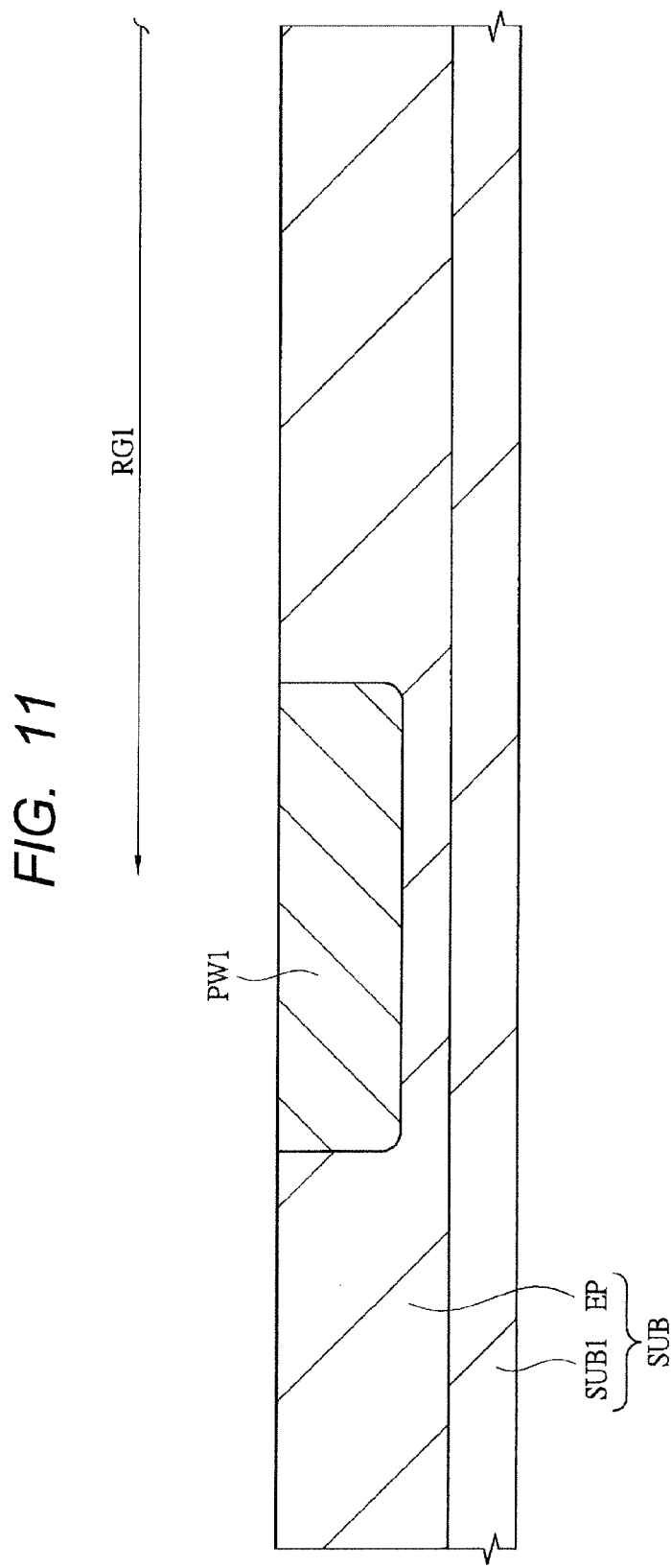
FIG. 11 is a main part cross-sectional view of the semiconductor device in the same manufacturing process as that in FIG. 10.
Figure 12:
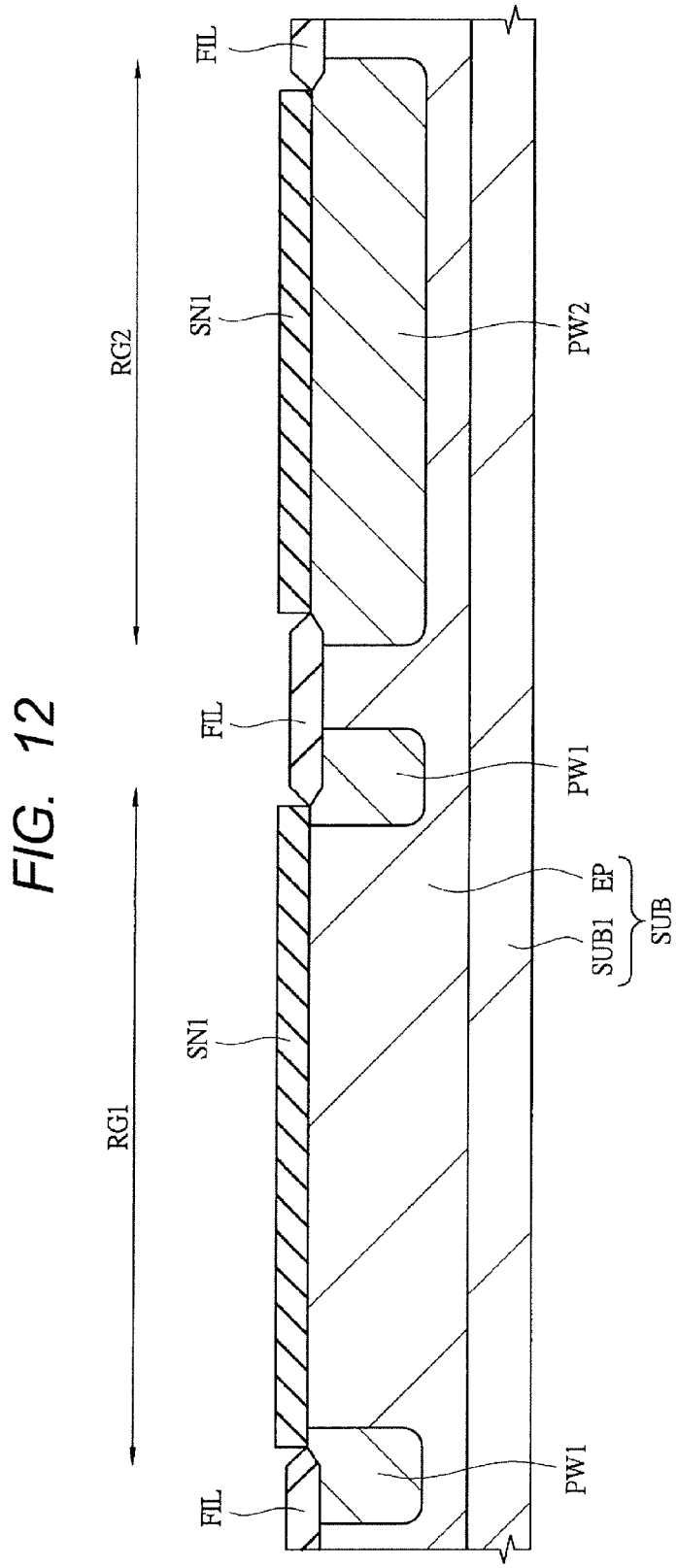
FIG. 12 is a main part cross-sectional view of the semiconductor device in a manufacturing process following FIG. 10.
Figure 13:
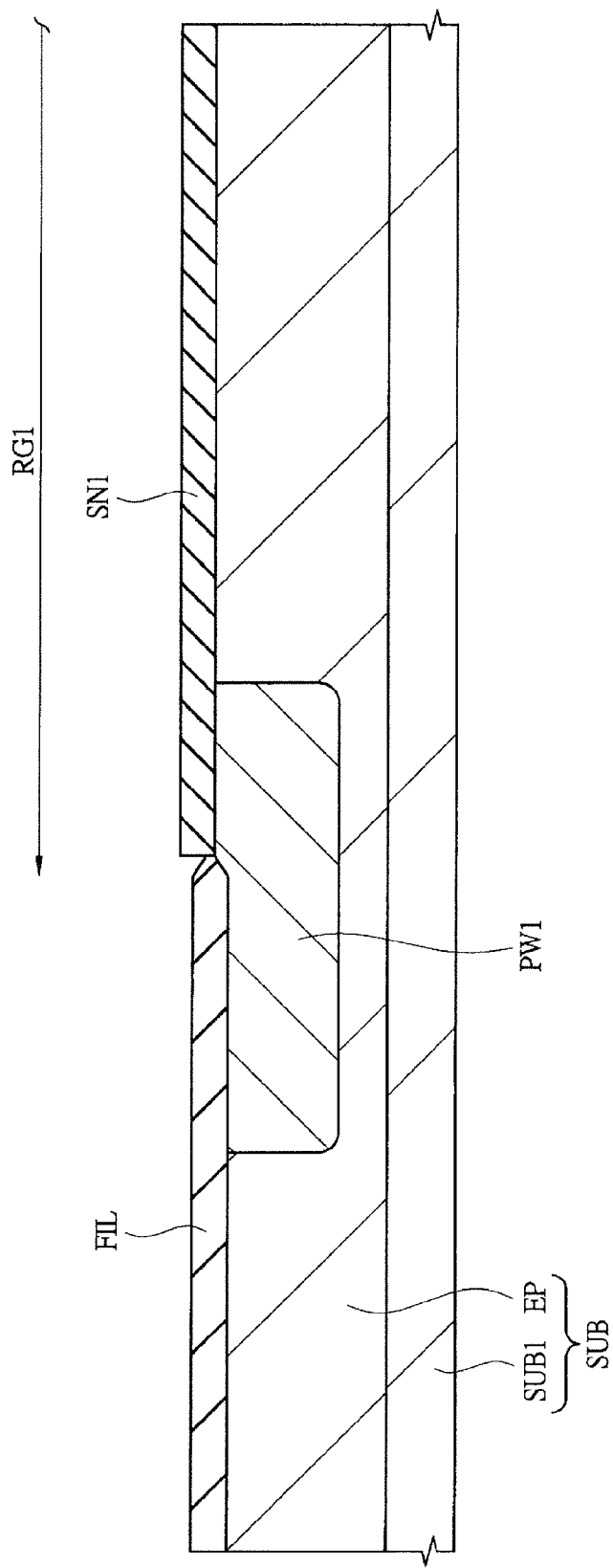
FIG. 13 is a main part cross-sectional view of the semiconductor device in the same manufacturing process as that in FIG. 12.
Figure 14:
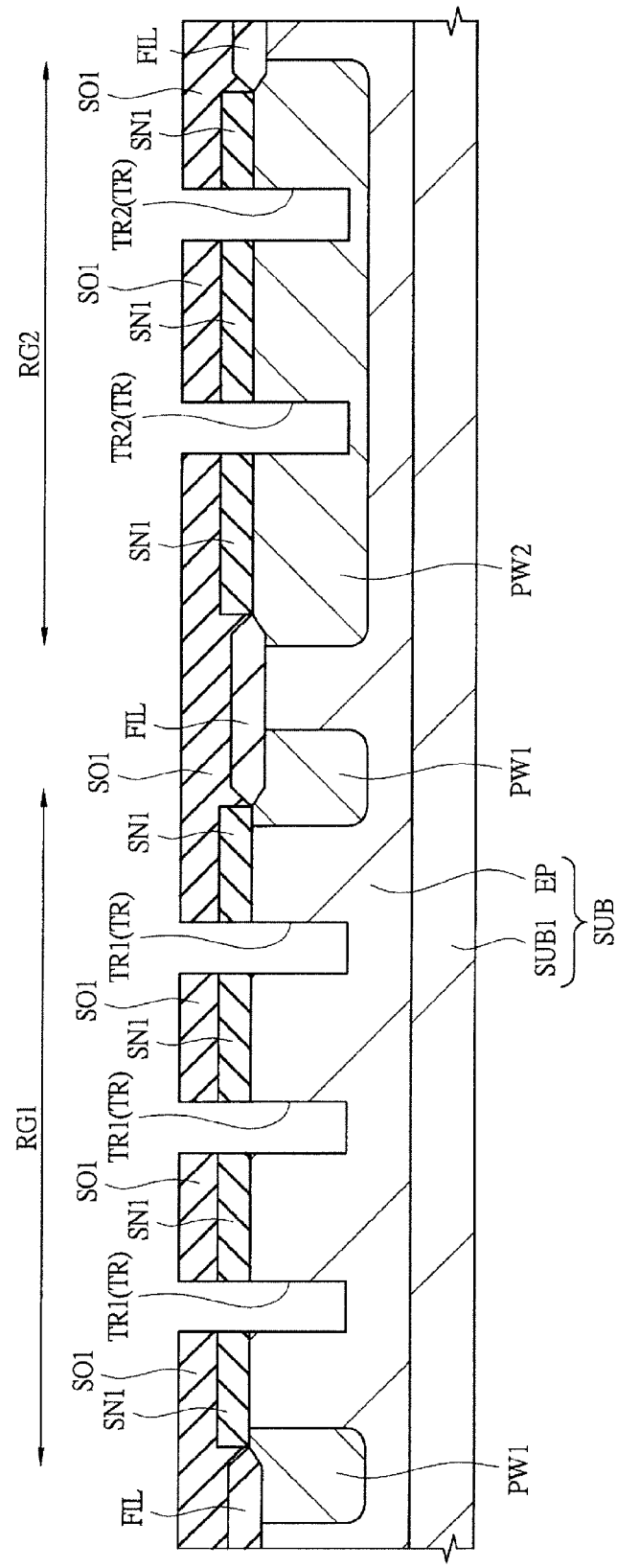
FIG. 14 is a main part cross-sectional view of the semiconductor device in a manufacturing process following FIG. 12.
Figure 15:
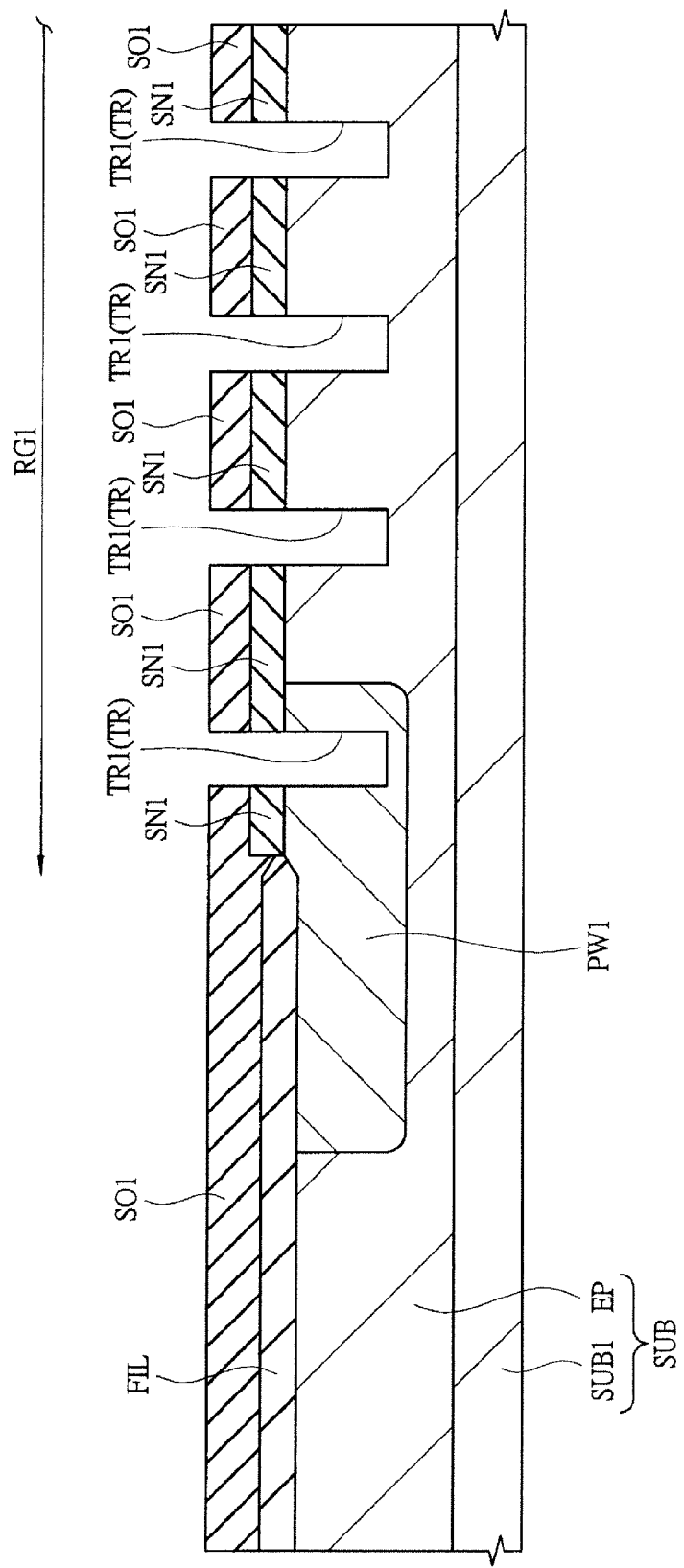
FIG. 15 is a main part cross-sectional view of the semiconductor device in the same manufacturing process as that in FIG. 14.
Figure 16:
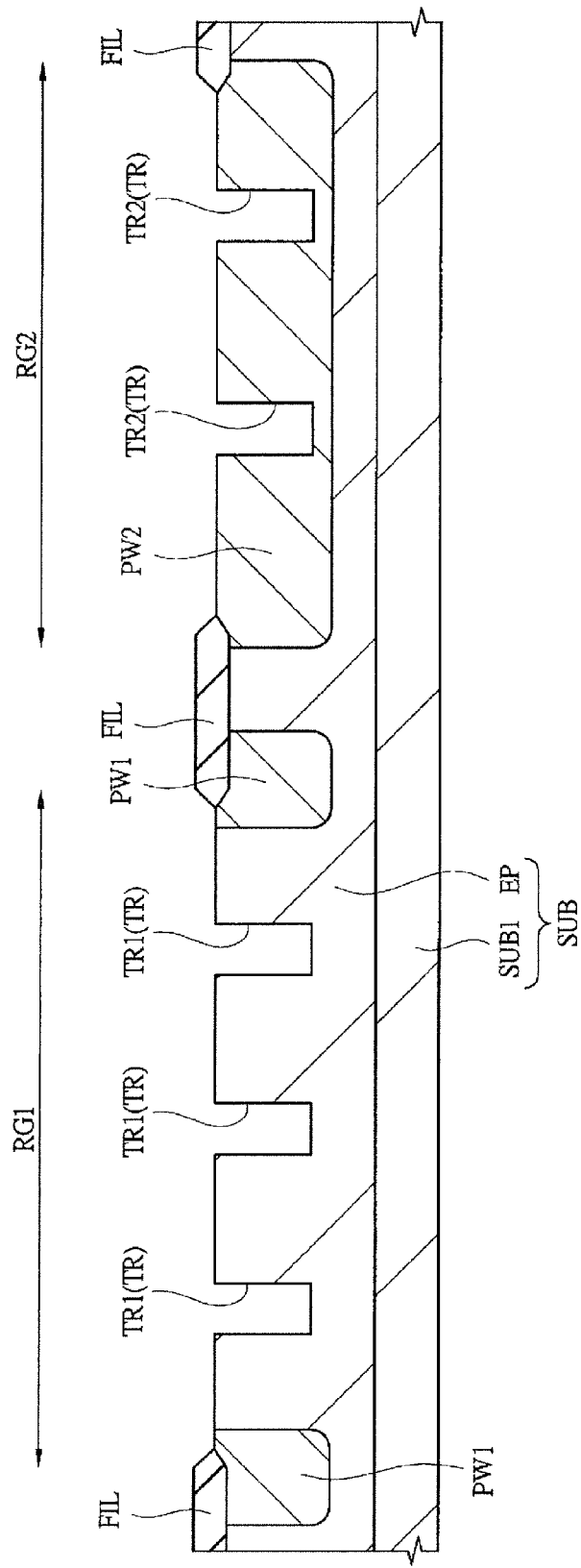
FIG. 16 is a main part cross-sectional view of the semiconductor device in a manufacturing process following FIG. 14.
Figure 17:
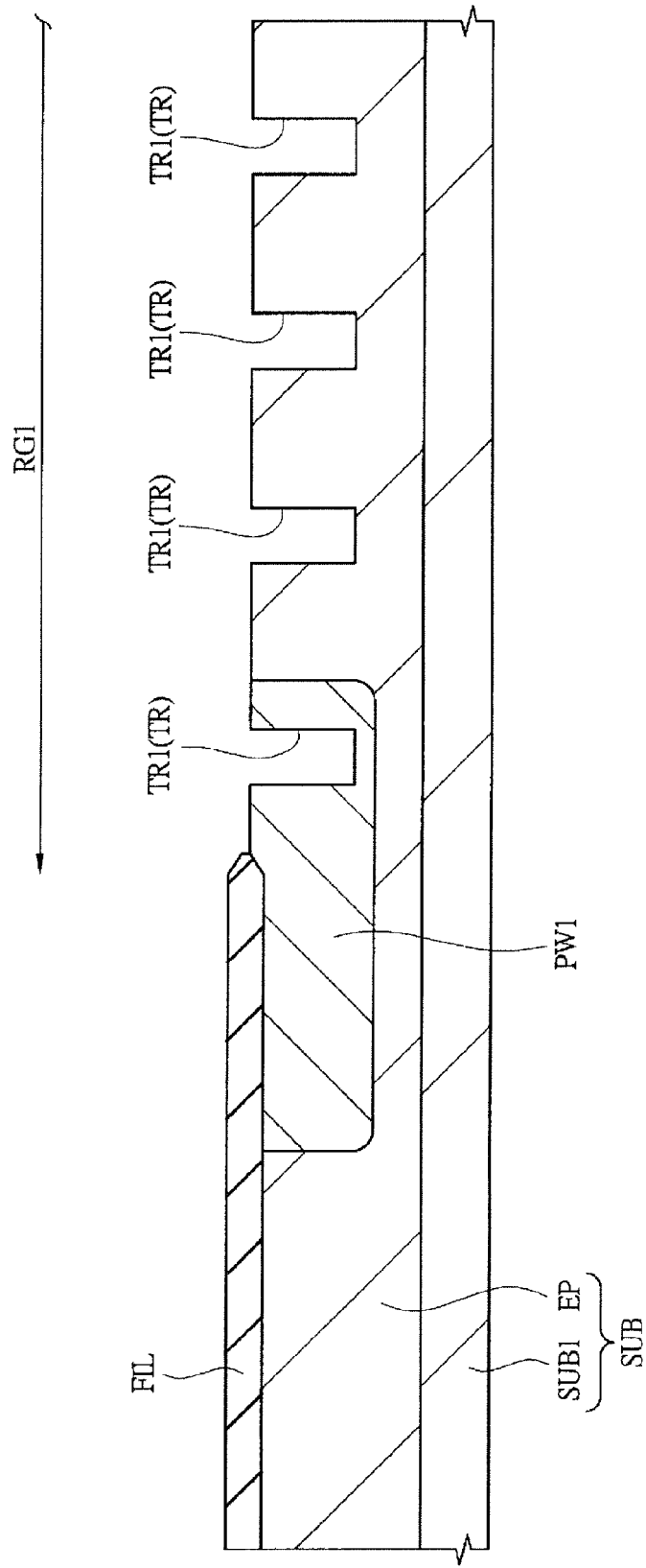
FIG. 17 is a main part cross-sectional view of the semiconductor device in the same manufacturing process as that in FIG. 16.
Figure 18:
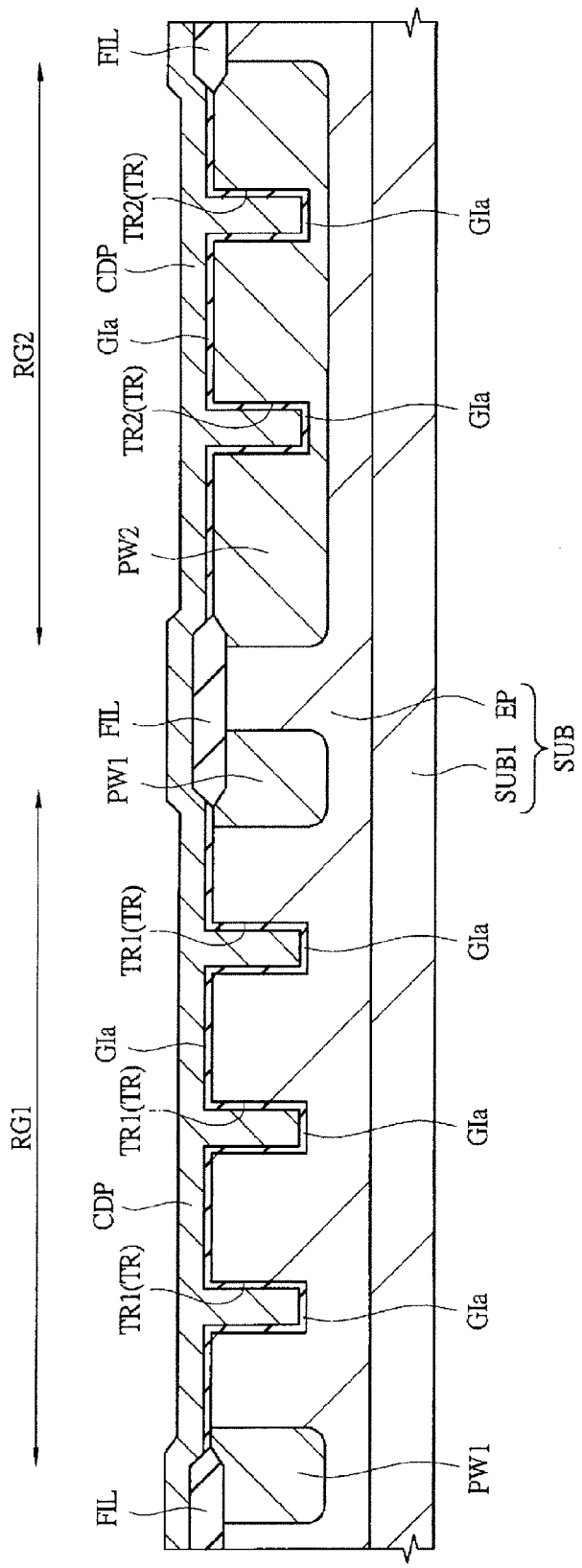
FIG. 18 is a main part cross-sectional view of the semiconductor device in a manufacturing process following FIG. 16.
Figure 19:
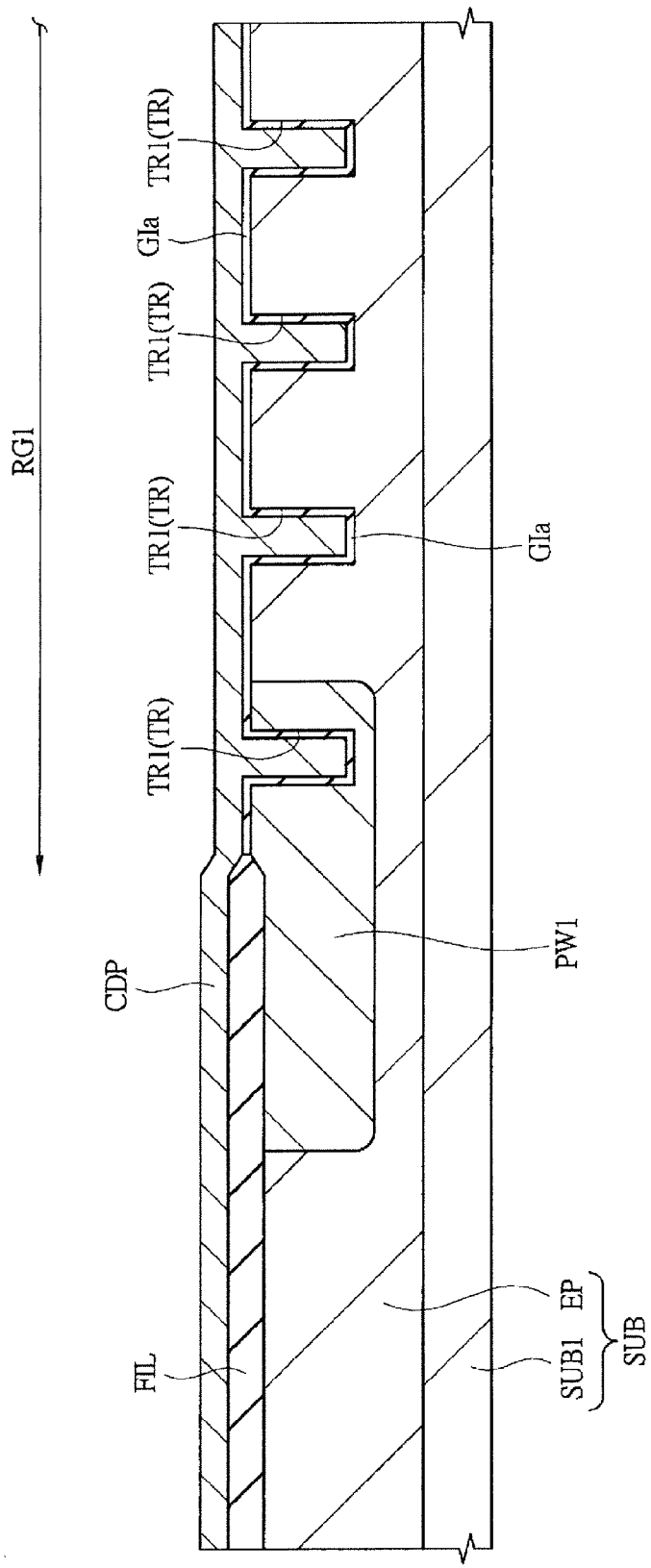
FIG. 19 is a main part cross-sectional view of the semiconductor device in the same manufacturing process as that in FIG. 18.
Figure 20:
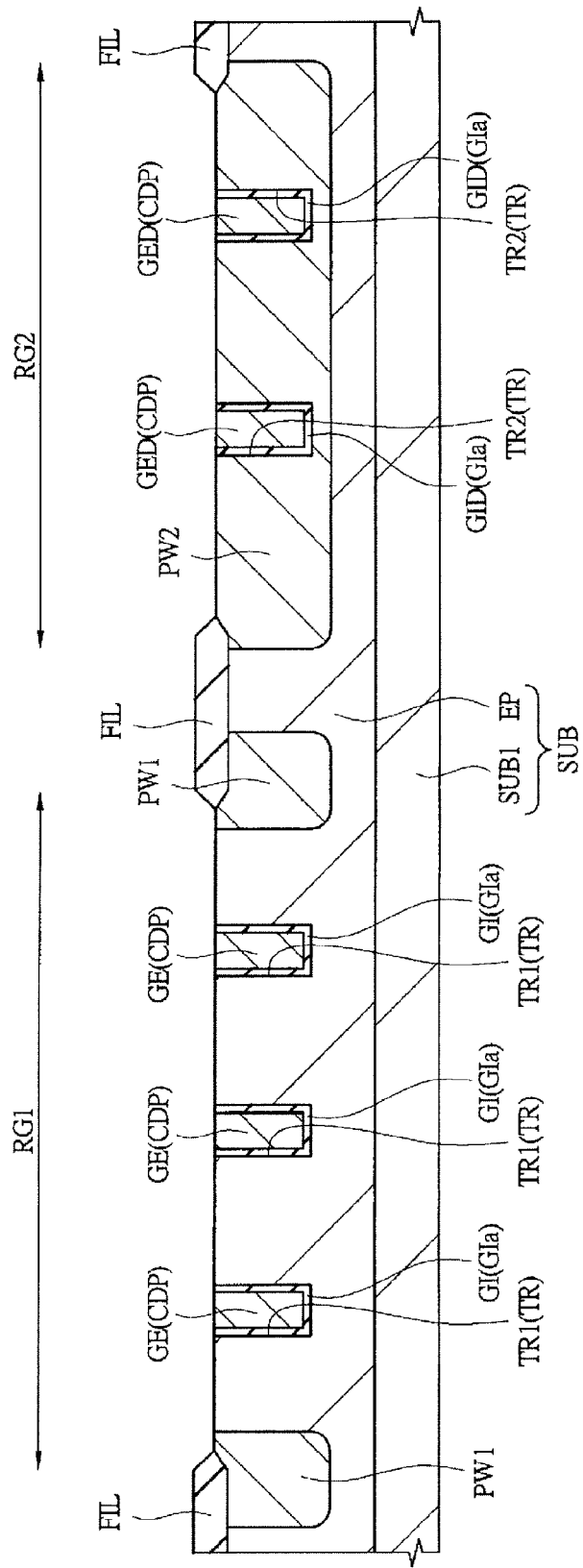
FIG. 20 is a main part cross-sectional view of the semiconductor device in a manufacturing process following FIG. 18.
Figure 21:
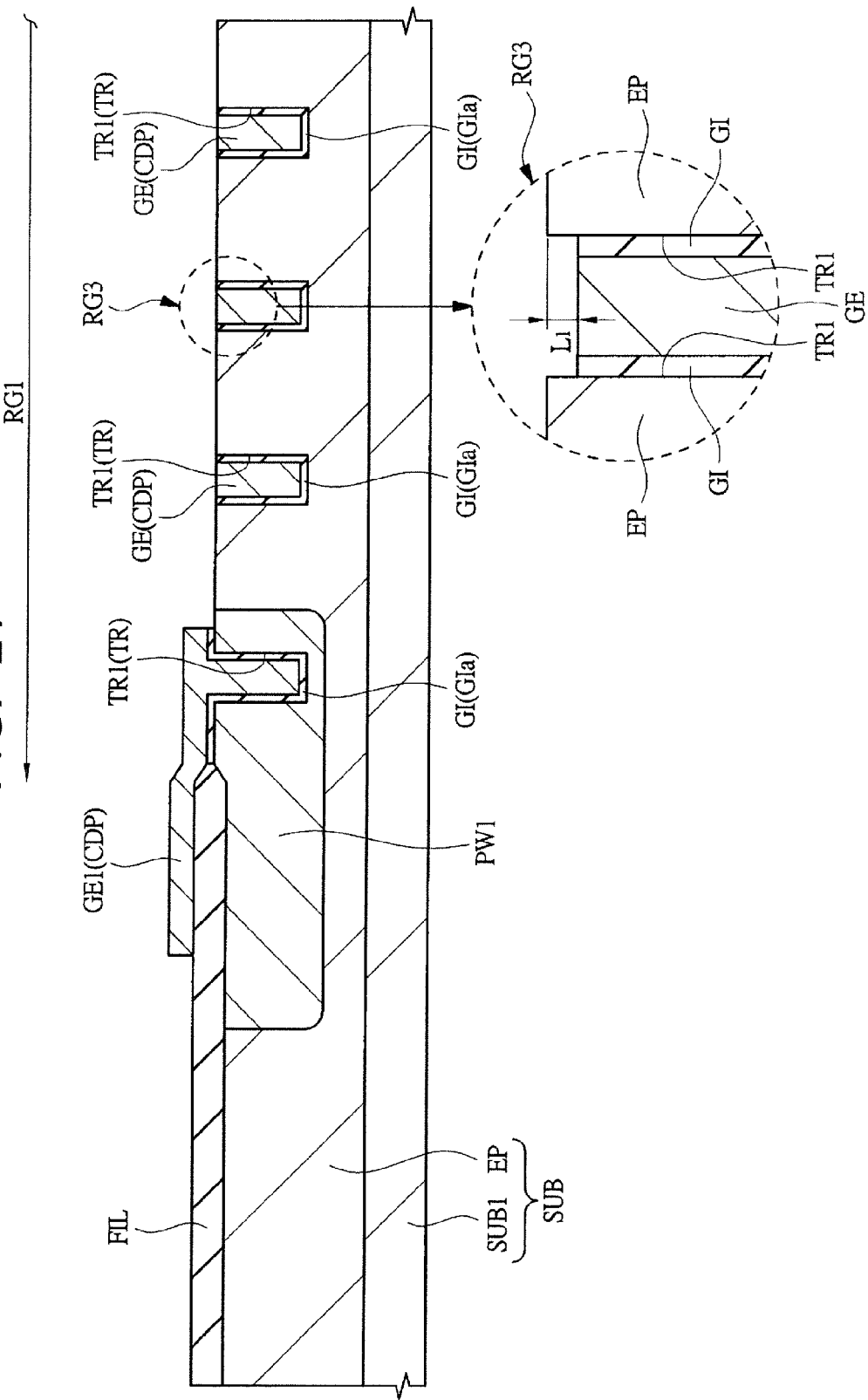
FIG. 21 is a main part cross-sectional view of the semiconductor device in the same manufacturing process as that in FIG. 20.
Figure 22:
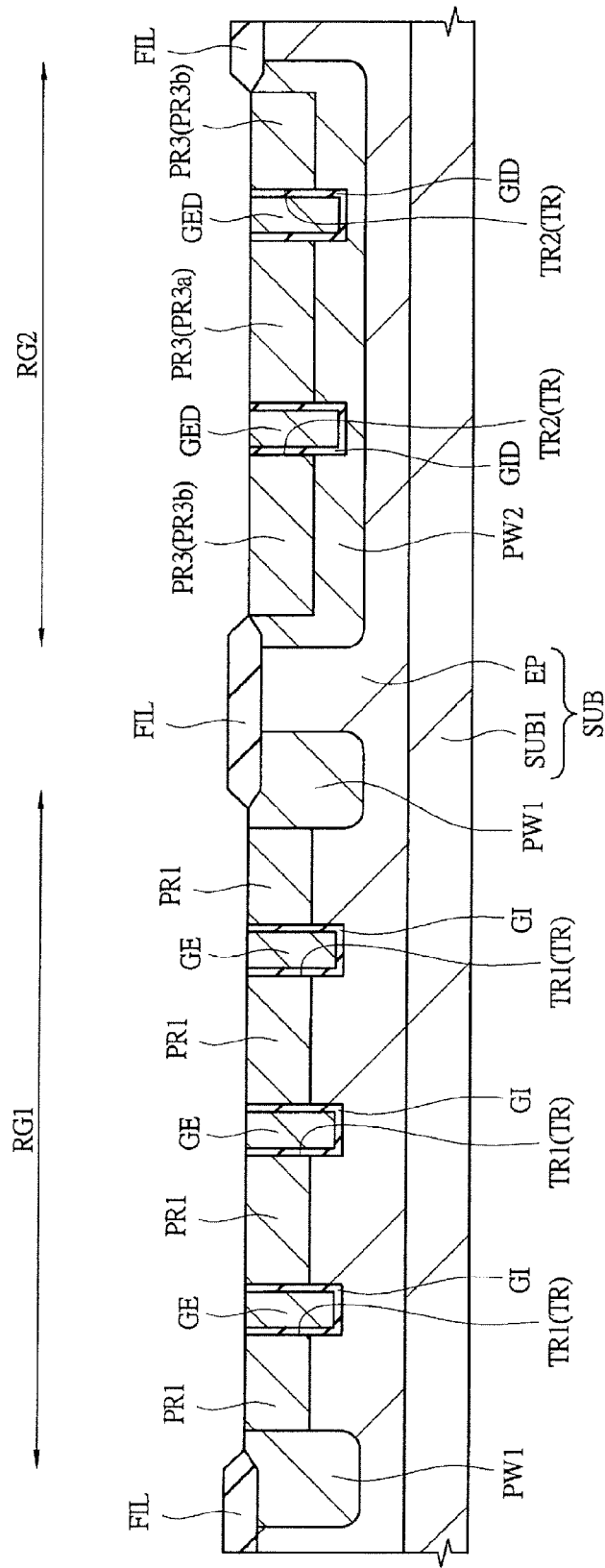
FIG. 22 is a main part cross-sectional view of the semiconductor device in a manufacturing process following FIG. 20.
Figure 23:
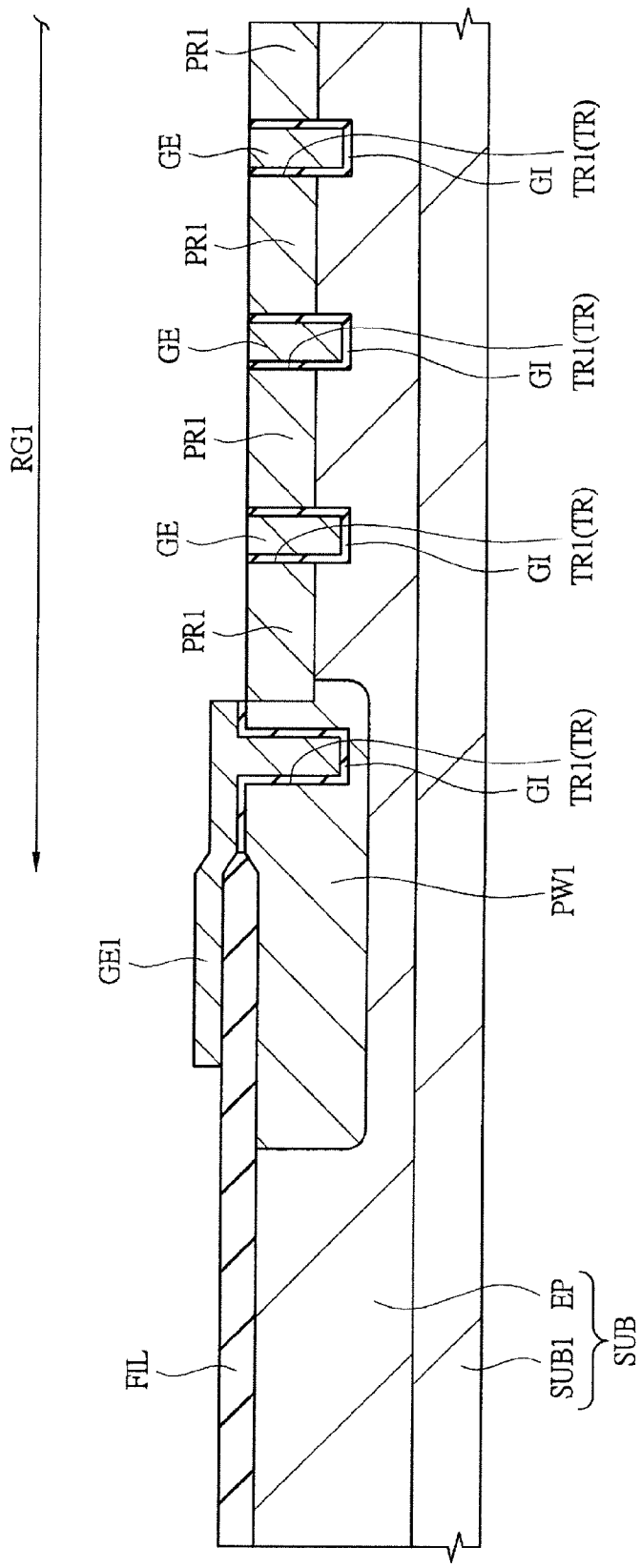
FIG. 23 is a main part cross-sectional view of the semiconductor device in the same manufacturing process as that in FIG. 22.
Figure 24:
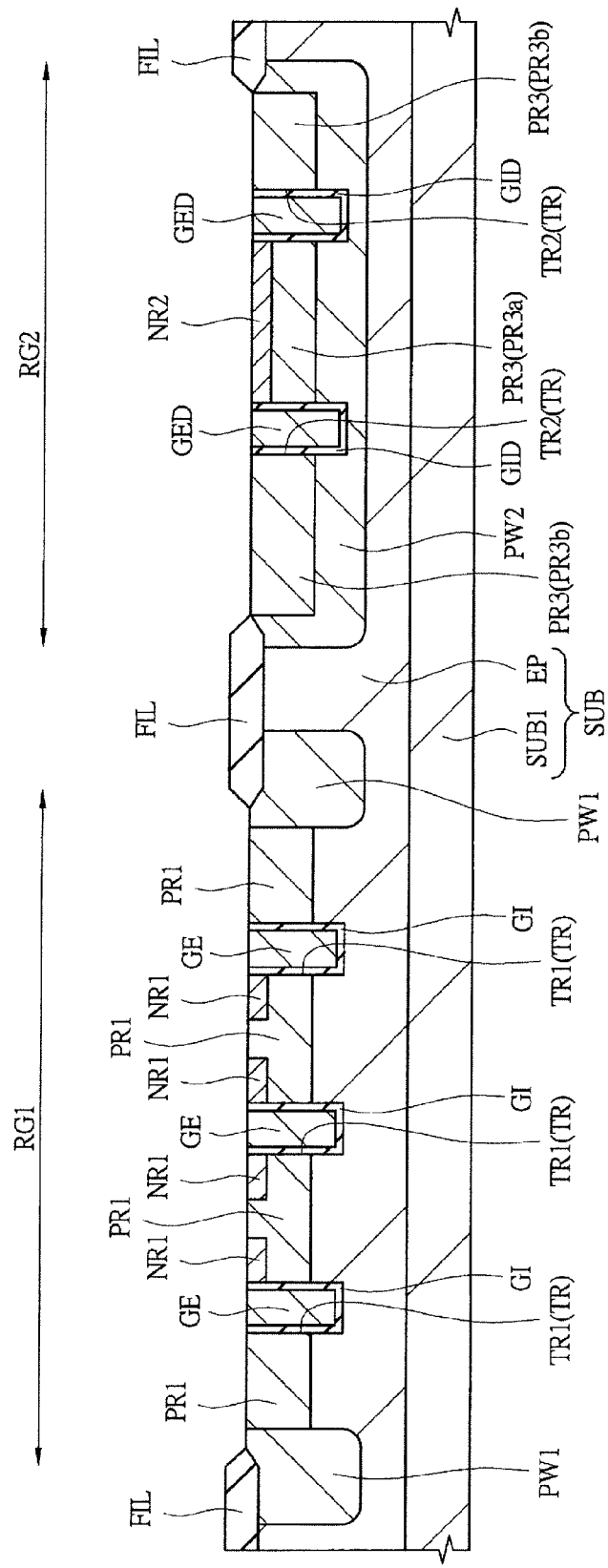
FIG. 24 is a main part cross-sectional view of the semiconductor device in a manufacturing process following FIG. 22.
Figure 25:
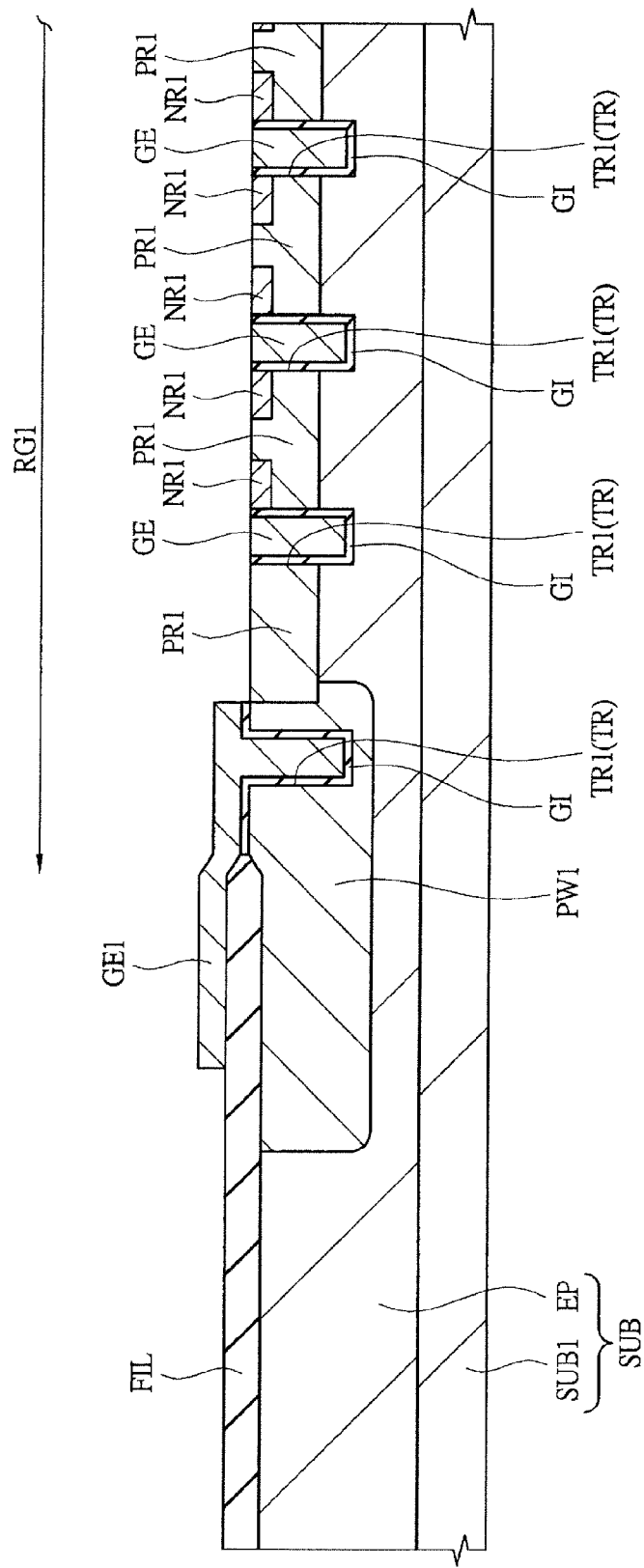
FIG. 25 is a main part cross-sectional view of the semiconductor device in the same manufacturing process as that in FIG. 24.
Figure 26:
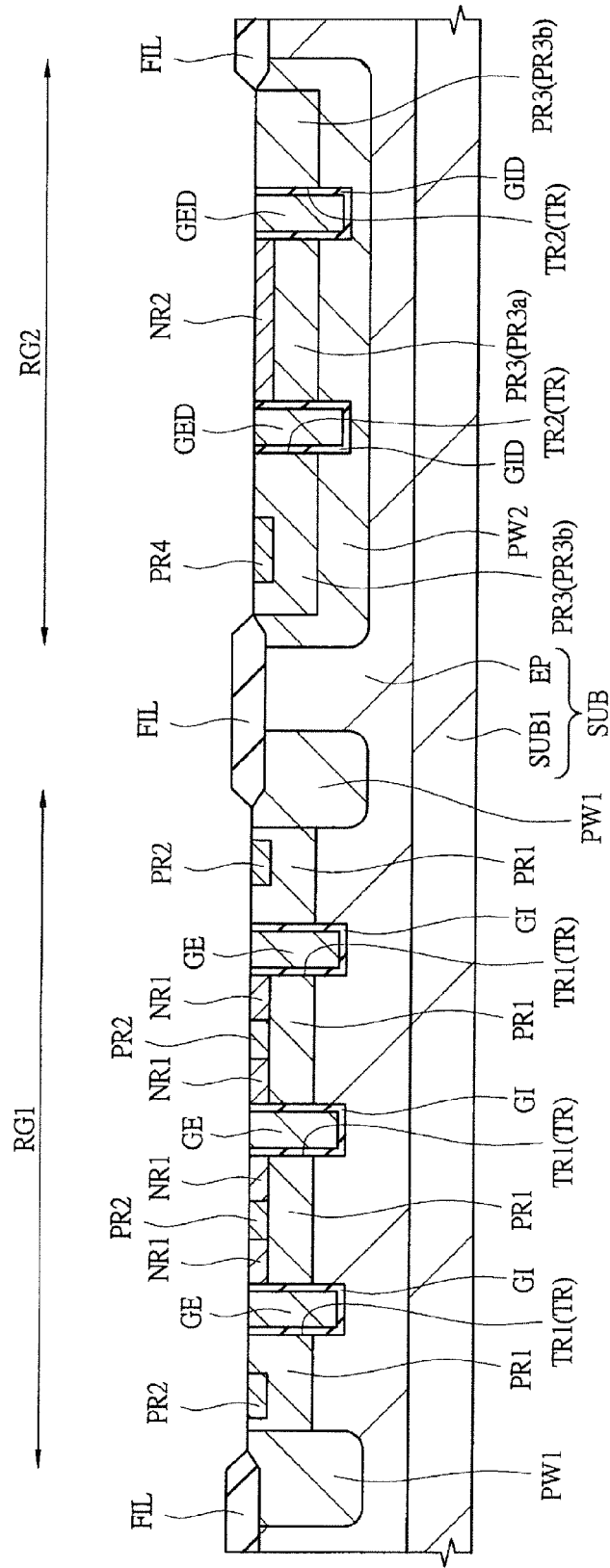
FIG. 26 is a main part cross-sectional view of the semiconductor device in a manufacturing process following FIG. 24.
Figure 27:
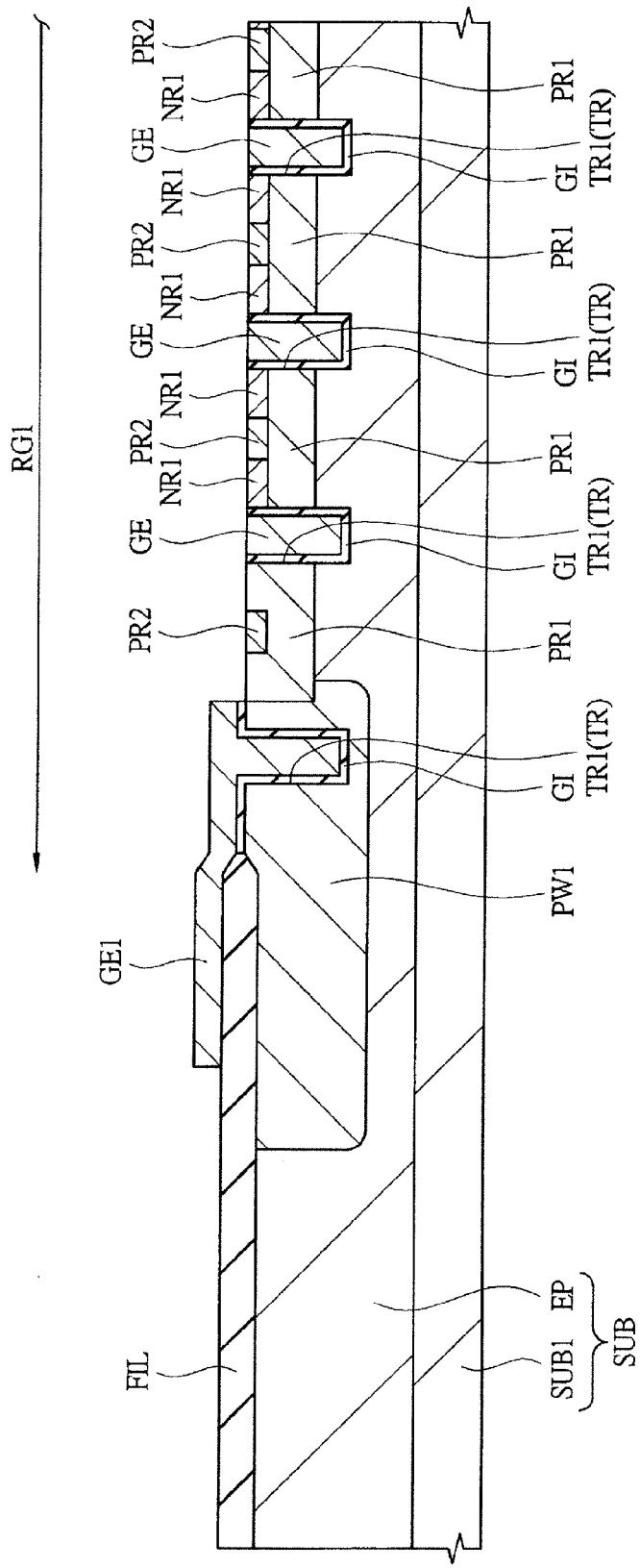
FIG. 27 is a main part cross-sectional view of the semiconductor device in the same manufacturing process as that in FIG. 26.
Figure 28:
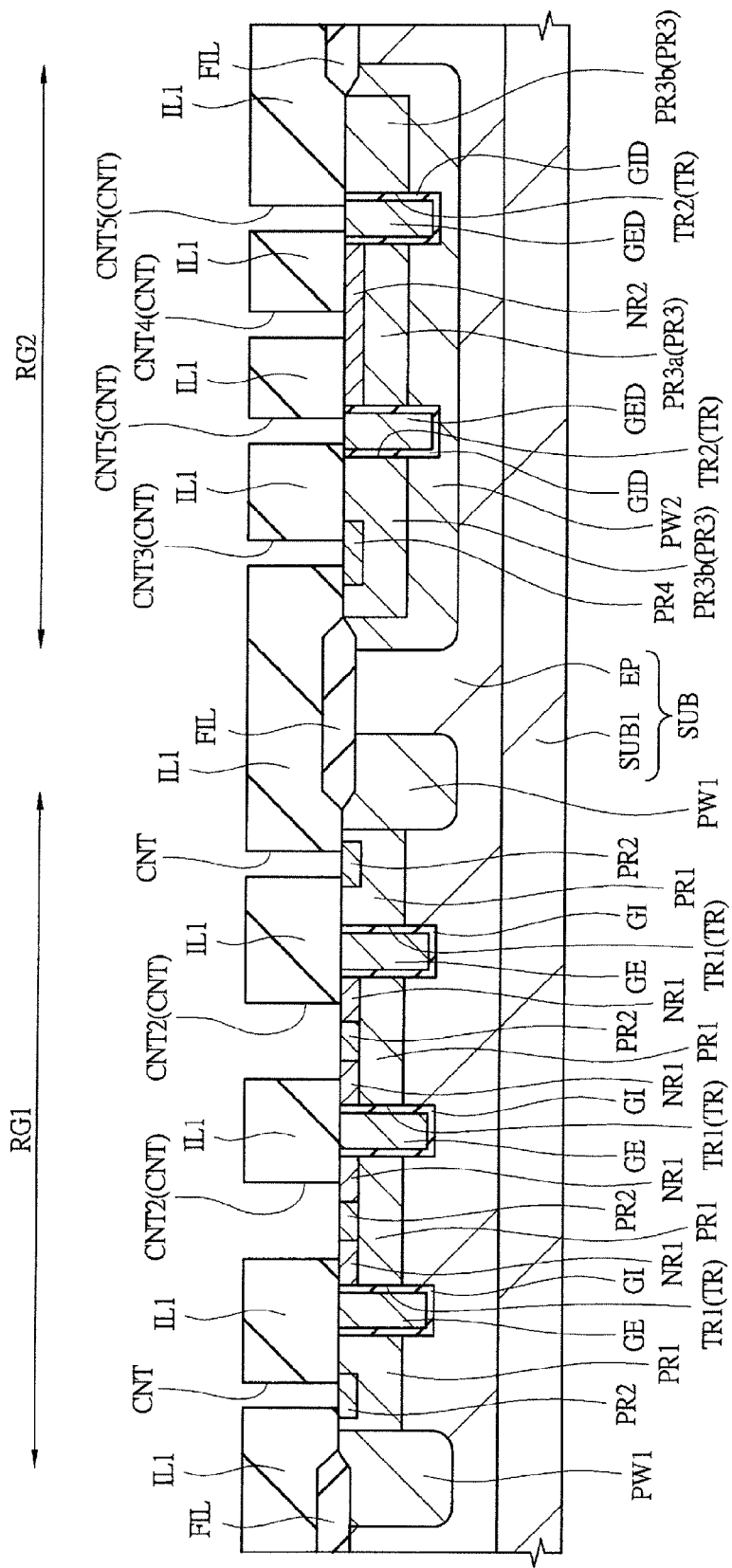
FIG. 28 is a main part cross-sectional view of the semiconductor device in a manufacturing process following FIG. 26.
Figure 29:
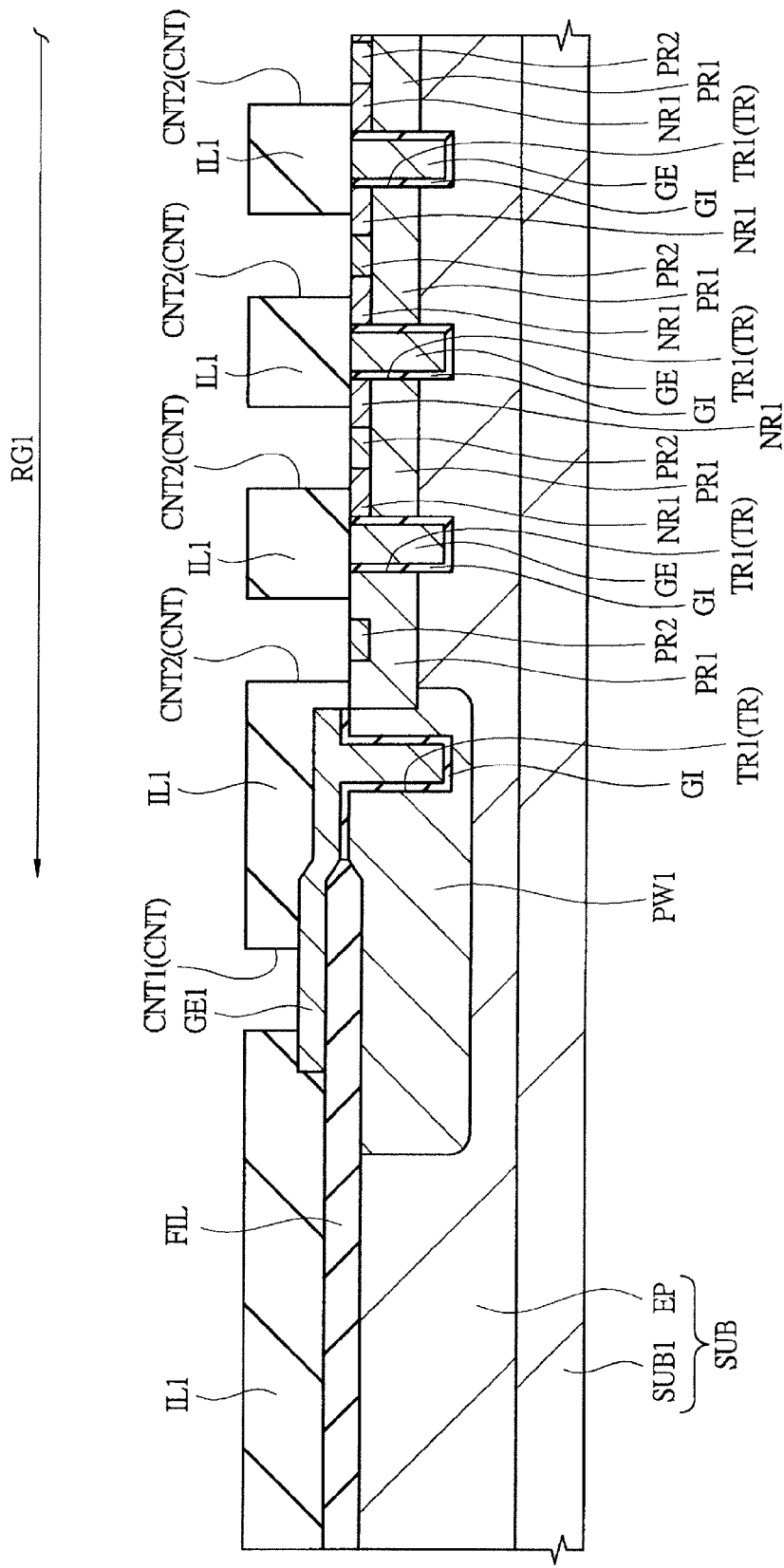
FIG. 29 is a main part cross-sectional view of the semiconductor device in the same manufacturing process as that in FIG. 28.
Figure 30:
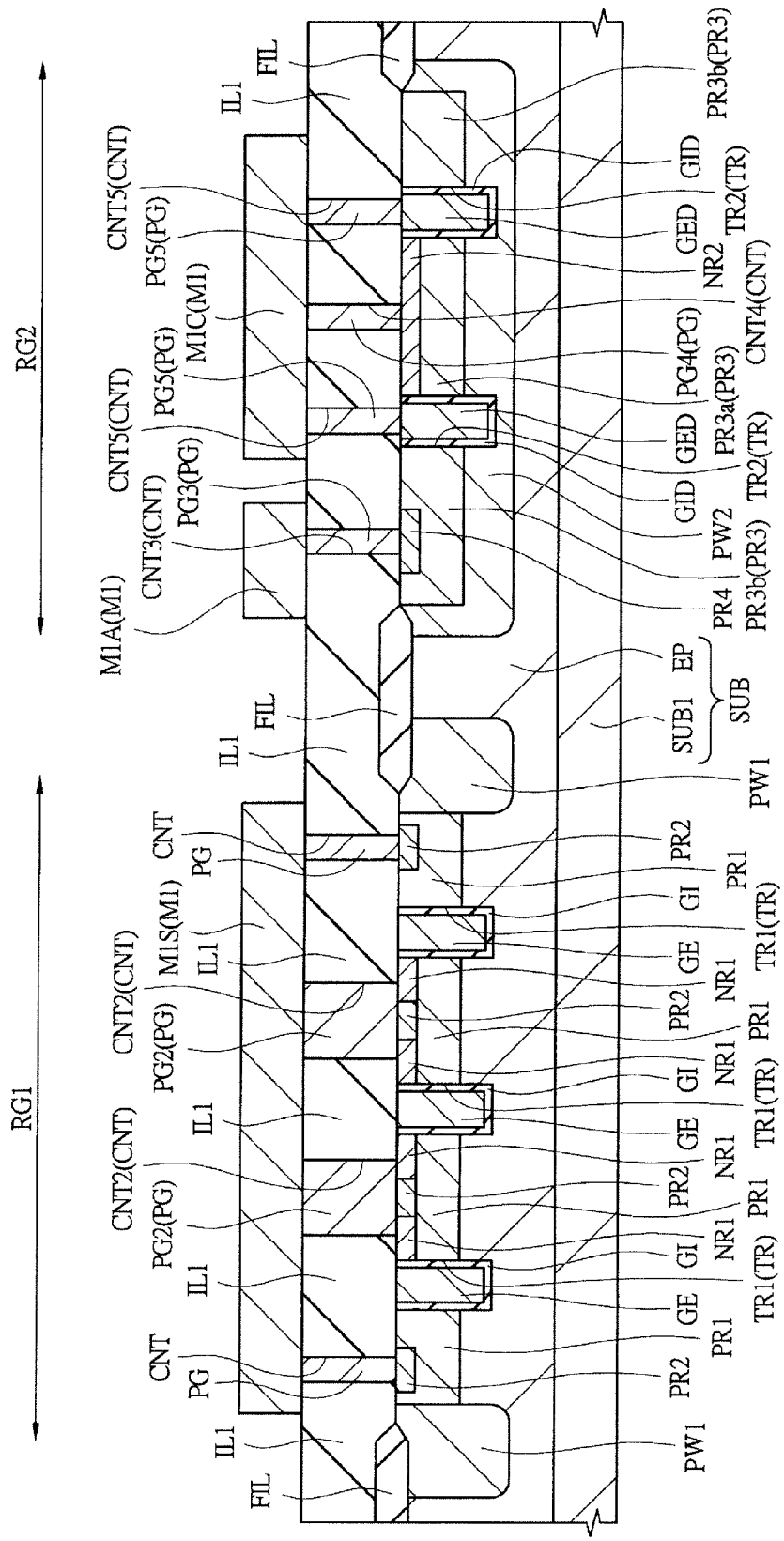
FIG. 30 is a main part cross-sectional view of the semiconductor device in a manufacturing process following FIG. 28.
Figure 31:
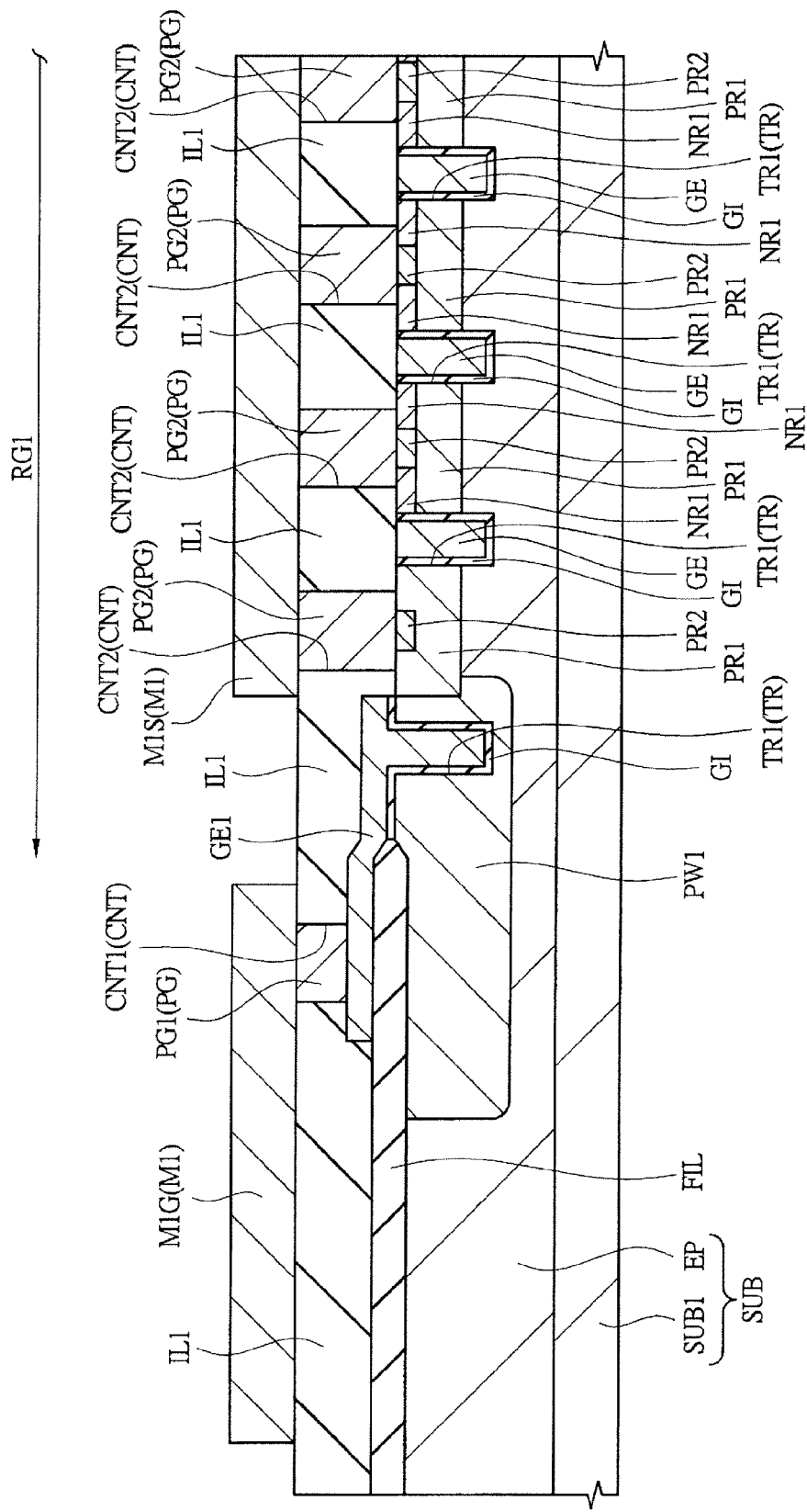
FIG. 31 is a main part cross-sectional view of the semiconductor device in the same manufacturing process as that in FIG. 30.
Figure 32:
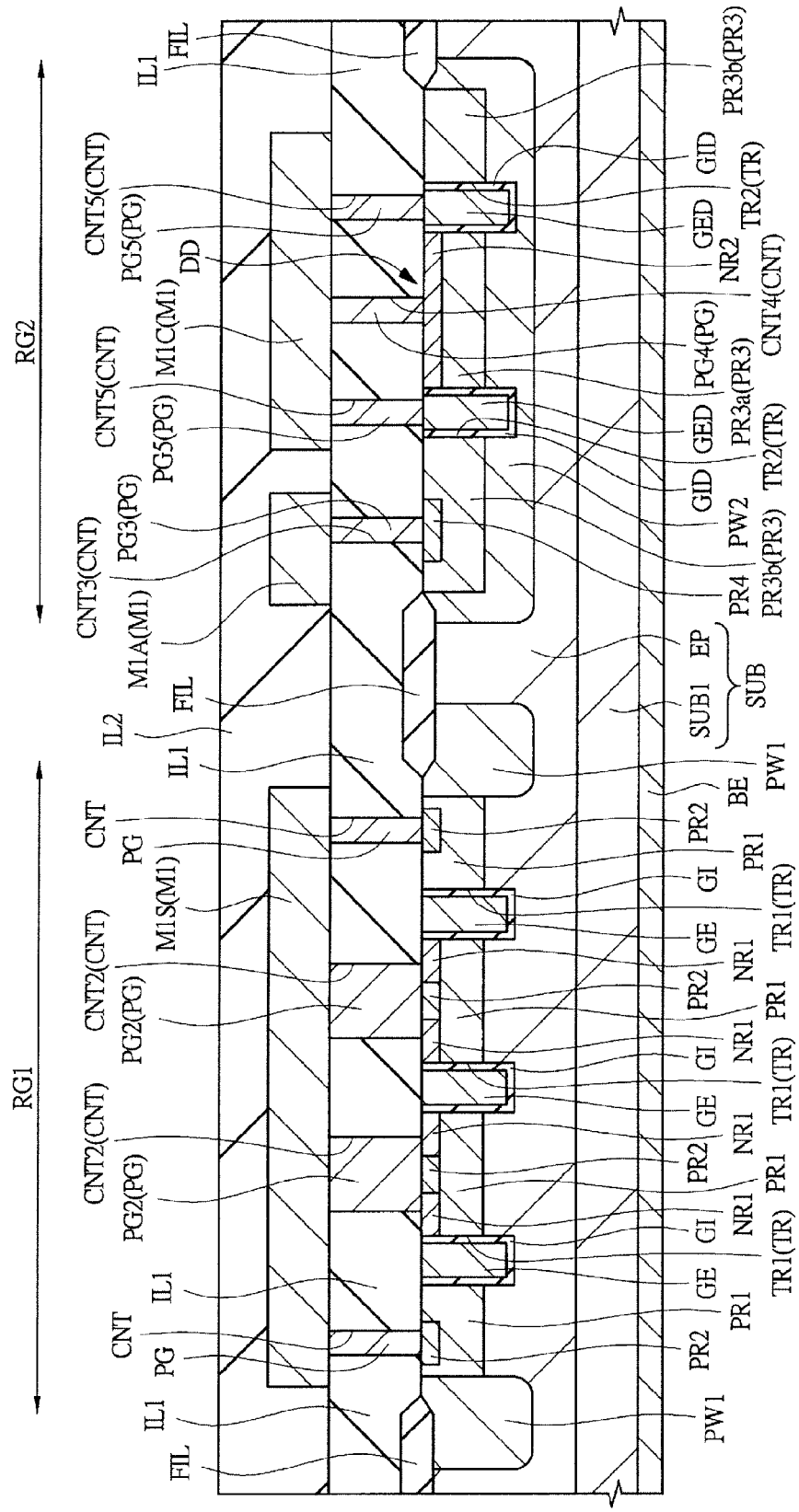
FIG. 32 is a main part cross-sectional view of the semiconductor device in a manufacturing process following FIG. 30.
Figure 33:
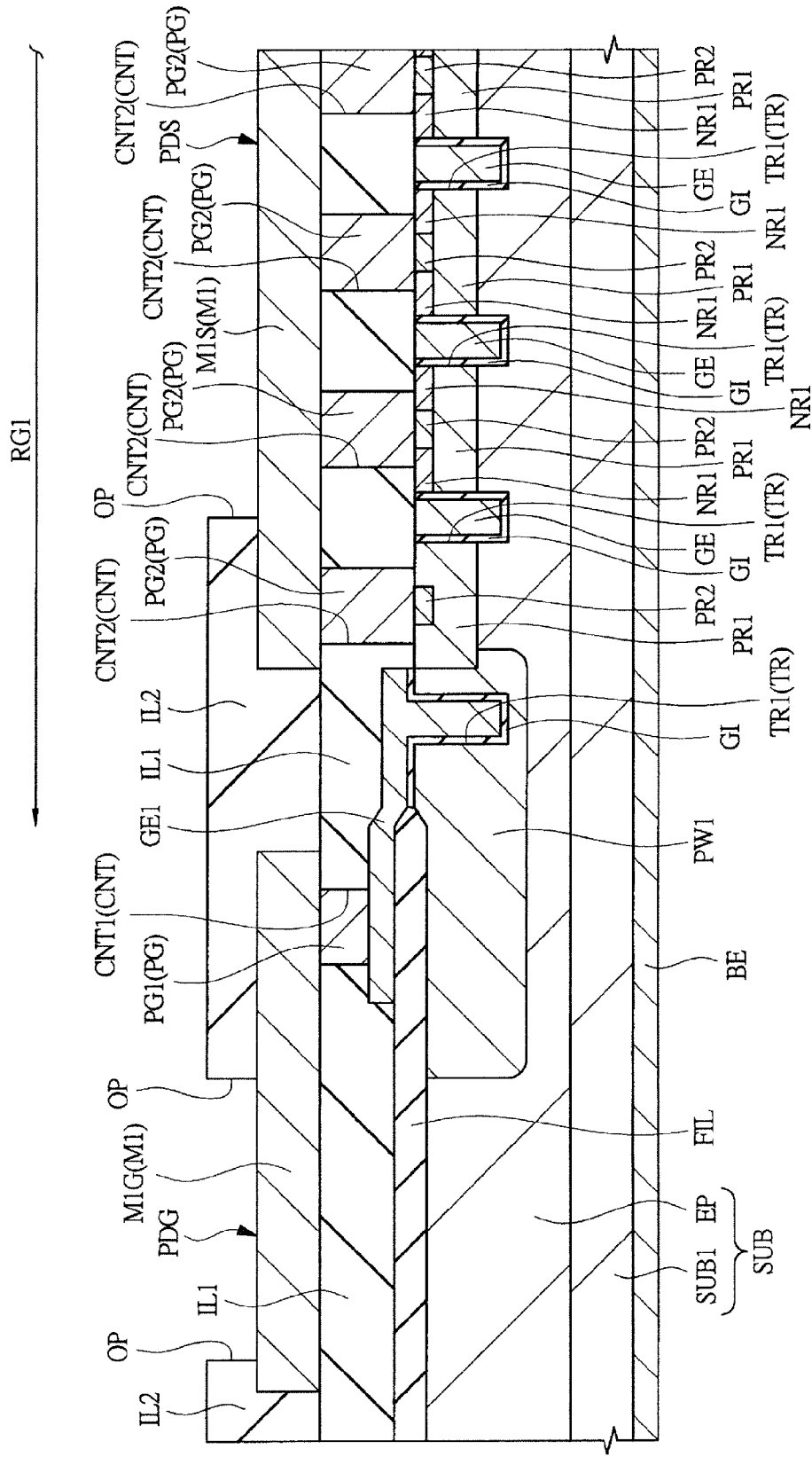
FIG. 33 is a main part cross-sectional view of the semiconductor device in the same manufacturing process as that in FIG. 32.

Next, a manufacturing process of the semiconductor device according to the present embodiment will be described with reference to FIGS. 8 to 33. FIGS. 8 to 33 are main part cross-sectional views of the semiconductor device during the manufacturing process. Among FIGS. 8 to 33, FIGS. 8, 10, 12, 14, 16, 18, 20, 22, 24, 26, 28, 30, and 32 show a cross-sectional view of a region corresponding to that of FIG. 1. Among FIGS. 8 to 33, FIGS. 9, 11, 13, 15, 17, 19, 21, 23, 25, 27, 29, 31, and 33 show a cross-sectional view of a region corresponding to that of FIG. 2. FIGS. 8 and 9 show the same process stage. FIGS. 10 and 11 show the same process stage. FIGS. 12 and 13 show the same process stage. FIGS. 14 and 15 show the same process stage. FIGS. 16 and 17 show the same process stage. FIGS. 18 and 19 show the same process stage. FIGS. 20 and 21 show the same process stage. FIGS. 22 and 23 show the same process stage. FIGS. 24 and 25 show the same process stage. FIGS. 26 and 27 show the same process stage. FIGS. 28 and 29 show the same process stage. FIGS. 30 and 31 show the same process stage. FIGS. 32 and 33 show the same process stage.

To manufacture the semiconductor device according to the present embodiment, first, as shown in FIGS. 8 and 9, the semiconductor substrate (hereinafter simply referred to as a substrate) SUB is prepared.

The substrate (semiconductor substrate, semiconductor wafer) SUB can be formed by epitaxially growing the epitaxial layer EP formed of n−-type single crystal silicon doped with n-type impurities such as, for example, phosphorus (P) over the main surface of the substrate main body SUB1 which is a semiconductor substrate (semiconductor wafer) formed of n+-type single crystal silicon doped with n-type impurities such as, for example, arsenic (As). The substrate SUB is a so-called epitaxial wafer. The impurity concentration (n-type impurity concentration) of the substrate main body SUB1 is higher than that of the epitaxial layer EP and the resistivity (specific resistance) of the substrate main body SUB1 is lower than that of the epitaxial layer EP. The thickness of the epitaxial layer EP can be, for example, about 2.5 μm to 10 μm.

Next, as shown in FIGS. 10 and 11, the p-type wells (p-type semiconductor regions) PW1 and PW2 are formed in a surface layer portion of the substrate SUB (epitaxial layer EP). Although the p-type well PW1 is formed in the epitaxial layer EP in the MISFET forming region RG1 and the p-type well PW2 is formed in the epitaxial layer EP in the diode forming region RG2, the p-type well PW1 and the p-type well PW2 are formed by the same process (the same ion implantation process). Specifically, the p-type wells PW1 and PW2 can be formed as follows:

First, a photoresist pattern (not shown in the drawings) which exposes regions in which the p-type wells PW1 and PW2 will be formed and covers the other regions is formed over the main surface of the substrate SUB. Then, p-type impurities (for example, boron (B)) are ion-implanted into the main surface (regions in which the p-type well PW1 will be formed and regions in which the p-type well PW2 will be formed) of the substrate SUB (epitaxial layer EP) by using the photoresist pattern as a mask (ion implantation blocking mask). Then, the photoresist pattern is removed, and thereafter heat treatment (activation heat treatment of the ion-implanted impurities) is performed. The heat treatment temperature can be, for example, about 1000° C. to 1200° C. Thereby, the p-type well PW1 doped with the p-type impurities is formed in the epitaxial layer EP in the MISFET forming region RG1 and the p-type well PW2 doped with the p-type impurities is formed in the epitaxial layer EP in the diode forming region RG2.

Next, the field insulating film (element separation region) FIL formed of an insulating film of silicon oxide or the like is formed over the main surface of the substrate SUB (that is, the main surface of the epitaxial layer EP). Specifically, the field insulating film FIL can be formed as described below by using, for example, a LOCOS (Local Oxidation of Silicon) method.

First, as shown in FIGS. 12 and 13, a silicon nitride film SN1 is formed over the main surface of the substrate SUB, and then the silicon nitride film SN1 in a region in which the field insulating film FIL will be formed is removed by using a photolithography technique and an etching technique. Thereby, the regions where the field insulating film FIL will be formed in the main surface of the substrate SUB (epitaxial layer EP) are exposed and the other regions are covered by the silicon nitride film SN1. Then, by performing thermal oxidation, the surface of the substrate SUB (that is, the surface of the epitaxial layer EP) in regions which are not covered by the silicon nitride film SN1 (that is, the regions where the field insulating film FIL will be formed) is oxidized and the field insulating film FIL formed of silicon oxide is formed. A thermal oxide film is not formed in regions covered by the silicon nitride film SN1 in the surface of the substrate SUB (that is, the surface of the epitaxial layer EP), so that the field insulating film FIL is not formed in the regions.

The field insulating film FIL can function as an element separation region to define (demarcate) an active region, so that the MISFET forming region RG1 and the diode forming region RG2 are electrically separate from other regions respectively by the field insulating film FIL. In other words, the MISFET forming region RG1 is an active region planarly surrounded by the field insulating film FIL and the diode forming region RG2 is an active region planarly surrounded by the field insulating film FIL.

Next, the trenches TR are formed in the main surface of the substrate SUB. The trenches TR include the trenches TR1 formed in the epitaxial layer EP in the MISFET forming region RG1 and the trenches TR2 formed in the epitaxial layer EP in the diode forming region RG2. The trench TR1 is a trench (trench, gate trench, gate electrode trench) for forming a trench gate (gate electrode GE) and the trench TR2 is a trench for forming a dummy electrode. Specifically, the trenches TR (TR1, TR2) can be formed, for example, as described below.

First, as shown in FIGS. 14 and 15, an insulating film SO1 is formed over the substrate SUB so as to cover the field insulating film FIL and the silicon nitride film SN1. The insulating film SO1 is formed of a silicon oxide film or the like and can be formed by, for example, a CVD (Chemical Vapor Deposition) method. Then, the photoresist pattern (not shown in the drawings) is formed over the insulating film SO1 by using a photolithography technique. The photoresist pattern has opening portions in regions in which the trench TR will be formed. Then, the insulating film SO1 in the regions in which the trench TR will be formed is selectively removed by etching (for example, dry-etching) the insulating film SO1 by using the photoresist pattern as an etching mask. Then, the photoresist pattern is removed. The insulating film SO1 has opening portions in regions in which the trench TR will be formed, so that, as shown in FIGS. 14 and 15, the trenches TR (TR1, TR2) are formed in the epitaxial layer EP by etching (for example, dry-etching) the silicon nitride film SN1 and the epitaxial layer EP by using the insulating film SO1 as an etching mask (hard mask). Thereafter, as shown in FIGS. 16 and 17, the insulating film SO1 and the silicon nitride film SN1 are removed by etching (for example, wet etching) or the like. In this way, the trenches TR (TR1, TR2) can be formed. The depth of the trenches TR (TR1, TR2) can be, for example, about 0.5 μm to 3.0 μm.

As another form, the trenches TR can be formed by dry-etching the epitaxial layer EP by using a photoresist pattern, which is formed over the substrate SUB by using a photolithography technique, as an etching mask.

The trench TR1 in the MISFET forming region RG1 and the trench TR2 in the diode forming region RG2 are formed in the same process (the same etching process), so that the trench TR1 and the trench TR2 have the same depth. The depth of the trench TR1 in the MISFET forming region RG1 is deeper than the bottom (the bonding surface) of the p-type semiconductor region PR1 which will be formed later and shallower than the bottom of the epitaxial layer EP (the interface between the epitaxial layer EP and the substrate main body SUB1). The depth of the trench TR2 in the diode forming region RG2 is deeper than the bottom of the p-type semiconductor region PR3 which will be formed later and shallower than the bottom of the p-type well PW2.

Next, as shown in FIGS. 18 and 19, by using, for example, a thermal oxidation method, an insulating film GIa formed of a relatively thin silicon oxide film or the like is formed over the inner wall surfaces (side surface and bottom surface) of the trenches TR (TR1, TR2). The insulating film GIa is an insulating film which will be the gate insulating film GI and the dummy gate insulating film GID. The insulating film GIa is formed over the inner wall surfaces (side surface and bottom surface) of the trenches TR (TR1, TR2) and the upper exposed surface of the epitaxial layer EP.

Next, a conductive film (conductor film) CDP such as a polycrystalline silicon film (doped polysilicon film), which is doped with impurities (for example, n-type impurities) to reduce resistivity, is formed over the main surface of the substrate SUB so as to fill the trenches TR (TR1, TR2).

Next, a photoresist pattern (not shown in the drawings) which covers a region in which the gate leader wiring part GE1 will be formed and exposes the other regions is formed over the conductive film CDP and the conductive film CDP is etched back (etched, anisotropically etched) by using the photoresist pattern as an etching mask. By the etching back, as shown in FIGS. 20 and 21, the conductive film CDP is removed except for the conductive film CDP in the trenches TR (TR1, TR2) and the conductive film CDP under the photoresist pattern. Thereafter, the photoresist pattern is removed. The insulating film GIa remaining in the trench TR1 becomes the gate insulating film GI. The conductive film CDP remaining in the trench TR1 becomes the gate electrode GE. The insulating film GIa remaining in the trench TR2 becomes the dummy gate insulating film GID. The conductive film CDP remaining in the trench TR2 becomes the dummy gate electrode GED. The conductive film CDP remaining under the photoresist pattern becomes the gate leader wiring part GE1. In the etching back process of the conductive film CDP, the insulating film GIa over the upper surface of the epitaxial layer EP (the insulating film GIa other than the insulating film GIa over the inner walls of the trenches TR) may be removed.

In this way, the gate electrode GE formed of the conductive film CDP buried in the trench TR1, the gate leader wiring part GE1 integrally formed with the gate electrode GE, and the dummy gate electrode GED formed of the conductive film CDP buried in the trench TR2 are formed. The gate electrode GE is buried in the trench TR1 through the insulating film GIa (that is, the gate insulating film GI) and the dummy gate electrode GED is buried in the trench TR2 through the insulating film GIa (that is, the dummy gate insulating film GID).

FIG. 21 also shows an enlarged view of the region RG3 enclosed by a dashed line. As shown in the enlarged view of the region RG3, the upper surface of the gate electrode GE buried in the trench TR1 may retreat from (may be lower than) the upper surface of the epitaxial layer EP by over-etching in the etching back process of the conductive film CDP. The enlarged view of the region RG3 shows a case in which the upper surface of the gate electrode GE buried in the trench TR1 is lower than the upper surface of the epitaxial layer EP by a distance $L_1$. Here, it is defined that the nearer to the back surface of the substrate SUB a position is, the lower the position is, and the farther from the back surface of the substrate SUB a position is, the higher the position is. Even in this case, the distance $L_1$ is set to be smaller than the depth (thickness) of the $n^+$-type semiconductor region NR1 which will be formed later. In other words, the upper surface of the gate electrode GE is set to be higher than the bottom surface (lower surface) of the $n^+$-type semiconductor region NR1 which will be formed later. Thereby, when the channel is inverted by applying a predetermined voltage to the gate electrode GE, it is possible to correctly flow a current along the side surface of the gate electrode GE (that is, the side surface of the trench TR1) between the source $n^+$-type semiconductor region NR1 and the drain epitaxial layer EP.

Next, as shown in FIGS. 22 and 23, the p-type semiconductor regions PR1 and PR3 are formed by ion-implanting p-type impurities (for example, boron (B)) into the main surface of the substrate SUB. Although the p-type semiconductor region PR1 is formed in the epitaxial layer EP in the MISFET forming region RG1 and the p-type semiconductor region PR3 is formed in the epitaxial layer EP in the diode forming region RG2, the p-type semiconductor region PR1 and the p-type semiconductor region PR3 are formed by the same process (the same ion implantation process). The p-type semiconductor region PR1 is a p-type semiconductor region for a channel region and the p-type semiconductor region PR3 is a p-type semiconductor region for an anode.

The p-type semiconductor region PR1 in the MISFET forming region RG1 and the p-type semiconductor region PR3 in the diode forming region RG2 are formed by the same process (the same ion implantation process), so that the p-type semiconductor region PR1 and the p-type semiconductor region PR3 have the same depth. The depth (the depth position of the bottom) of the p-type semiconductor region PR1 in the MISFET forming region RG1 is shallower than the depth (the depth position of the bottom) of the trench TR1 and the depth (the depth position of the bottom) of the p-type semiconductor region PR3 in the diode forming region RG2 is shallower than the depth (the depth position of the bottom) of the trench TR2.

Next, as shown in FIGS. 24 and 25, the $n^+$-type semiconductor regions NR1 and NR3 are formed by ion-implanting n-type impurities (for example, arsenic (As)) into the main surface of the substrate SUB. The $n^+$-type semiconductor region NR1 is an n-type semiconductor region for a source region and is formed in the epitaxial layer EP in the MISFET forming region RG1 and the $n^+$-type semiconductor region NR2 is an n-type semiconductor region for a cathode region and is formed in the epitaxial layer EP in the diode forming region RG2.

When performing ion implantation for forming the $n^+$-type semiconductor regions NR1 and NR2, first, a photoresist pattern which exposes regions in which the $n^+$-type semiconductor regions NR1 and NR2 will be formed and covers the other regions is formed over the main surface of the substrate SUB (epitaxial layer EP). Then, n-type impurities are ion-implanted into the main surface (regions in which the $n^+$-type semiconductor regions NR1 and NR2 will be formed) of the substrate SUB (epitaxial layer EP) by using the photoresist pattern as a mask (ion implantation blocking mask). After the ion implantation, the photoresist pattern is removed.

The $n^+$-type semiconductor region NR1 and the $n^+$-type semiconductor region NR2 are formed by the same process (the same ion implantation process). Therefore, the $n^+$-type semiconductor region NR1 in the MISFET forming region RG1 and the $n^+$-type semiconductor region NR2 in the diode forming region RG2 have the same depth. The depth (the depth position of the bottom) of the $n^+$-type semiconductor region NR1 in the MISFET forming region RG1 is shallower than the depth (the depth position of the bottom) of the p-type semiconductor region PR1 and the depth (the depth position of the bottom) of the $n^+$-type semiconductor region NR2 in the diode forming region RG2 is shallower than the depth (the depth position of the bottom) of the p-type semiconductor region PR3.

Next, as shown in FIGS. 26 and 27, the $p^+$-type semiconductor regions PR2 and PR4 are formed by ion-implanting p-type impurities (for example, boron (B)) into the main surface of the substrate SUB. The $p^+$-type semiconductor region PR2 is formed in the epitaxial layer EP in the MISFET forming region RG1 and the $p^+$-type semiconductor region PR4 is formed in the epitaxial layer EP in the diode forming region RG2.

When performing ion implantation for forming the $p^+$-type semiconductor regions PR2 and PR4, first, a photoresist pattern which exposes regions in which the $p^+$-type semiconductor regions PR2 and PR4 will be formed and covers the other regions is formed over the main surface of the substrate SUB. Then, p-type impurities are ion-implanted into the main surface (regions in which the $p^+$-type semiconductor regions PR2 and PR4 will be formed) of the substrate SUB (epitaxial layer EP) by using the photoresist pattern as a mask (ion implantation blocking mask). After the ion implantation, the photoresist pattern is removed.

The $p^+$-type semiconductor region PR2 and the $p^+$-type semiconductor region PR4 are formed by the same process (the same ion implantation process). Therefore, the $p^+$-type semiconductor region PR2 in the MISFET forming region RG1 and the $p^+$-type semiconductor region PR4 in the diode forming region RG2 have the same depth. The depth (the depth position of the bottom) of the $p^+$-type semiconductor region PR2 in the MISFET forming region RG1 is shallower than the depth (the depth position of the bottom) of the p-type semiconductor region PR1 and the depth (the depth position of the bottom) of the $p^+$-type semiconductor region PR4 in the diode forming region RG2 is shallower than the depth (the depth position of the bottom) of the p-type semiconductor region PR3. The impurity concentration (p-type impurity concentration) of the $p^+$-type semiconductor region PR2 is higher than that of the p-type semiconductor region PR1 and the impurity concentration (p-type impurity concentration) of the $p^+$-type semiconductor region PR4 is higher than that of the p-type semiconductor region PR3.

The $p^+$-type semiconductor region PR2 and the $n^+$-type semiconductor region NR1 are formed in a surface layer portion of the epitaxial layer EP in the MISFET forming region RG1 and they are formed over the p-type semiconductor region PR1. The $n^+$-type semiconductor region NR1 has a function as the source region of the trench gate type MISFET and can be assumed to be a source semiconductor region. The p-type semiconductor region PR1 has a function as a channel forming region of the trench gate type MISFET. In the MISFET forming region RG1, the $n^+$-type semiconductor region NR1 and the p-type semiconductor region PR1 are formed to be shallower than the trench TR1, so that the trench TR1 penetrates the $n^+$-type semiconductor region NR1 and the p-type semiconductor region PR1 and terminates in the epitaxial layer EP ($n^-$-type epitaxial layer EP) below the p-type semiconductor region PR1. In the diode forming region RG2, the p-type semiconductor region PR3 is formed to be shallower than the trench TR2, so that the trench TR2 penetrates the p-type semiconductor region PR3 and terminates in the p-type well PW2.

Here, a case has been described in which the $n^+$-type semiconductor regions NR1 and NR2 are formed first, and then the $p^+$-type semiconductor regions PR2 and PR4 are formed. However, as another form, the $p^+$-type semiconductor regions PR2 and PR4 may be formed first, and then the $n^+$-type semiconductor regions NR1 and NR2 may be formed.

Next, activation anneal which is heat treatment for activating the doped impurities is performed. For example, the activation anneal can be performed at about 800° C. to 1000° C. Thereby, it is possible to activate the impurities doped into each semiconductor region (p-type semiconductor regions PR1 and PR3, $p^+$-type semiconductor regions PR2 and PR4, $n^+$-type semiconductor regions NR1 and NR2, and the like) formed in the substrate SUB (epitaxial layer EP).

Next, as shown in FIGS. 28 and 29, the insulating film (for example, silicon oxide film) IL1 is formed as an interlayer insulating film over the main surface of the substrate SUB so as to cover the gate electrode GE, the gate leader wiring part GE1, and the dummy gate electrode GED.

Next, the contact holes (opening portion, hole, through hole) CNT are formed in the insulating film IL1 by etching (for example, dry-etching) the insulating film IL1 by using a photoresist pattern (not shown in the drawings) formed over the insulating film IL1 by a photolithography method as an etching mask. The gate leader wiring part GE1 is exposed from the contact hole CNT1 of the contract holes CNT, and the $n^+$-type semiconductor region NR1 and the $p^+$-type semiconductor region PR2 are exposed from the contact hole CNT2. The $p^+$-type semiconductor region PR4 is exposed from the contact hole CNT3 of the contract holes CNT, the n+-type semiconductor region NR2 is exposed from the contact hole CNT4, and the dummy gate GED is exposed from the contact hole CNT5.

Next, as shown in FIGS. 30 and 31, the conductive plugs PG formed of tungsten (W) or the like are formed in the contact holes CNT as conductive materials (coupling conductors).

To form the plug PG, for example, a barrier conductor film (for example, a titanium film, a titanium nitride film, or a laminated film of these) are formed over the insulating film IL1 including inside (the bottom and the side wall) of the contact hole CNT. Then, a main conductor film formed of a tungsten film or the like is formed over the barrier conductor film so as to fill the contact hole CNT and unnecessary main conductor film and barrier conductor film over the insulating film IL1 are removed by a CMP (Chemical Mechanical Polishing) method or an etch-back method, so that the plug PG can be formed. For simplicity of the drawings, in FIGS. 30 and 31, the barrier conductor film and the main conductor film (tungsten film), which form the plug PG, are integrated and displayed.

The plug PG buried in the contact hole CNT1 is the plug PG1, and the plug PG buried in the contact hole CNT2 is the plug PG2. The plug PG buried in the contact hole CNT3 is the plug PG3, the plug PG buried in the contact hole CNT4 is the plug PG4, and the plug PG buried in the contact hole CNT5 is the plug PG5. The plug PG1 is in contact with and electrically coupled to the gate leader wiring part GE1 at the bottom of the contact hole CNT1. The plug PG2 is in contact with and electrically coupled to the n+-type semiconductor region NR1 and the p+-type semiconductor region PR2 at the bottom of the contact hole CNT2. The plug PG3 is in contact with and electrically coupled to the p+-type semiconductor region PR4 at the bottom of the contact hole CNT3. The plug PG4 is in contact with and electrically coupled to the n+-type semiconductor region NR2 at the bottom of the contact hole CNT4. The plug PG5 is in contact with and electrically coupled to the dummy gate electrode GED at the bottom of the contact hole CNT5.

Next, the wiring M1 is formed by forming a conductive material film (for example, a metal film mainly formed of an aluminum film or an aluminum alloy film) over the main surface of the substrate SUB, that is, over the insulating film IL1 in which the plugs PG are buried, by a sputtering method or the like and patterning the conductive material film by using a photolithography technique and an etching technique.

The gate wiring M1G of the wiring M1 is electrically coupled to the gate leader wiring part GE1 through the plug PG1. The source wiring M1S of the wiring M1 is electrically coupled to the n+-type semiconductor region NR1 and the p+-type semiconductor region PR2 through the plug PG2. The anode wiring M1A of the wiring M1 is electrically coupled to the p+-type semiconductor region PR4 through the plug PG3. The cathode wiring M1C of the wiring M1 is electrically coupled to the n+-type semiconductor region NR2 through the plug PG4. The cathode wiring M1C or the anode wiring M1A of the wiring M1 is electrically coupled to the dummy gate electrode GED through the plug PG5.

Here, a case has been described in which the plug PG and the wiring M1 are formed separately. As another form, the plugs PG and the wiring M1 are formed integrally. In this case, the wiring M1 is formed by forming a conductive material film (for example, a metal film mainly formed of an aluminum film or an aluminum alloy film) over the main surface of the substrate SUB (that is, over the insulating film IL1) so as to fill the contact holes CNT without forming the plugs PG and patterning the conductive material film by using a photolithography technique and an etching technique. In this case, the plug PG is formed by a part of the wiring M1 (in other words, the plug PG is formed integrally with the wiring M1).

Next, as shown in FIGS. 32 and 33, the insulating film IL2 is formed over the main surface of the substrate SUB, that is, over the insulating film IL1, so as to cover the wiring M1. The insulating film IL2 is formed of, for example, a polyimide resin and is formed to protect the surface.

Next, bonding pads (pad electrodes) are formed by patterning the insulating film IL2 by using a photolithography technique and an etching technique and forming the opening portions OP from which a part of the wiring M1 is exposed in the insulating film IL2.

The source wiring M1S exposed from the opening portion OP of the insulating film IL2 becomes the source bonding pad PDS and the gate wiring M1G exposed from the opening portion OP of the insulating film IL2 becomes the gate bonding pad PDG. The anode wiring M1A exposed from the opening portion OP of the insulating film IL2 becomes the anode bonding pad (not shown in the drawings) and the cathode wiring M1C exposed from the opening portion OP of the insulating film IL2 becomes the cathode bonding pad (not shown in the drawings).

A metal layer (not shown in the drawings) may be further formed over the surface of the wiring M1 (that is, the surface of the bonding pad) exposed from the opening portion OP by a plating method or the like. The metal layer is formed of, for example, a laminated film including a copper (Cu) film, a nickel (Ni) film, and a gold (Au) film, which are sequentially formed in order from the bottom or a laminated film including a titanium (Ti) film, a nickel (Ni) film, and a gold (Au) film which are laminated in order from the bottom. Since the metal layer is formed, it is possible to control or prevent the surface of aluminum (wiring M1) under the metal layer from being oxidized.

Next, the thickness of the substrate SUB is reduced by grinding or polishing the back surface of the substrate SUB (a main surface of the substrate SUB opposite to the surface over which the epitaxial layer EP is formed, that is, the back surface of the substrate main body SUB1, which is opposite to the surface over which the epitaxial layer EP is formed). Thereafter, the back surface electrode (drain electrode) BE is formed by depositing a metal layer over the entire back surface of the substrate SUB (the entire back surface of the substrate main body SUB1) by an evaporation method or the like. The back surface electrode BE is electrically coupled to the drain of the trench gate type MISFET, so that the back surface electrode BE can function as a drain electrode (drain back surface electrode). The substrate main body SUB1 and the epitaxial layer EP have a function as a drain region of the vertical MISFET having a trench type gate structure. The back surface electrode BE can be formed by, for example, a laminated film including a titanium (Ti) layer, a nickel (Ni) layer, and a gold (Au) layer in order from the back surface of the substrate SUB.

In this way, the semiconductor device according to the present embodiment is manufactured. Thereafter, the substrate SUB is divided (separated, cut) by dicing or the like, so that individual semiconductor chips (semiconductor devices) are obtained from the substrate SUB.

Circuit Configuration Example of Semiconductor Device

Figure 34:
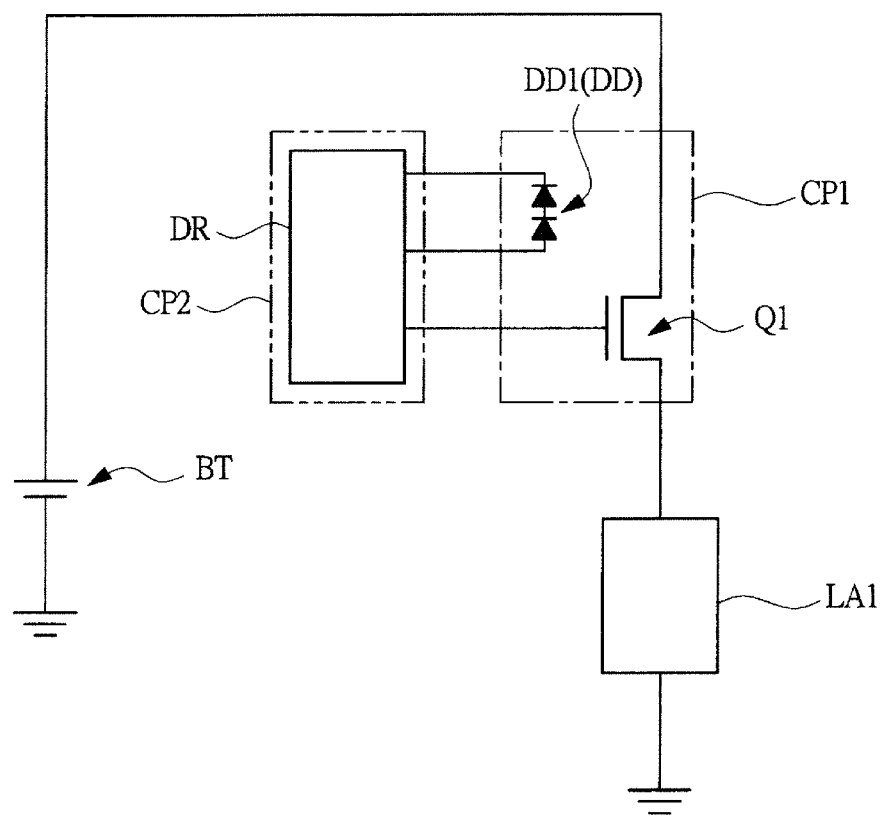
FIG. 34 is a circuit block diagram showing an example of use of the semiconductor device according to the embodiment.

Next, a circuit configuration example of the semiconductor device according to the present embodiment will be described. FIG. 34 is a circuit block diagram showing an example of use of the semiconductor device according to the present embodiment. In FIG. 34, a portion enclosed by the chain line is a portion including a semiconductor device (semiconductor chip) CP1 according to the present embodiment and a portion enclosed by the two-dot chain line is a portion including another semiconductor device (semiconductor chip) CP2.

As shown in FIG. 34, the semiconductor device CP1 includes a power MISFET (Metal Insulator Semiconductor Field Effect Transistor) Q1 used as a switch and the semiconductor device CP2 includes a control circuit DR. The power MISFET Q1 is controlled by the control circuit DR. The control circuit DR includes also a function of a driver circuit (drive circuit) to drive the power MISFET.

The power MISFET Q1 is formed by coupling a plurality of unit transistor cells (trench gate type MISFETs) formed in the MISFET forming region RG1 in parallel. Therefore, the back surface electrode BE is a back surface electrode for the drain of the power MISFET Q1 and the drain of the power MISFET Q1 is coupled to a power supply (battery or the like) BT disposed outside the semiconductor device CP1. The source of the power MISFET Q1 is coupled to a load LA1 disposed outside the semiconductor device CP1. The gate of the power MISFET Q1 is coupled to the control circuit DR. In summary, the back surface electrode BE is coupled to the power supply BT, the source bonding pad PDS is coupled to the load LA1, and the gate bonding pad PDG is coupled to the control circuit DR.

The power MISFET Q1 can be turned on by supplying an ON signal (a gate voltage to turn on the power MISFET Q1) from the control circuit DR to the gate of the power MISFET Q1. When the power MISFET Q1 is turned on, a voltage of the power supply BT is outputted from the power MISFET Q1 and supplied to the load LA1. When the power MISFET Q1 is turned off by supplying an OFF signal (or stopping the supply of the ON signal) from the control circuit DR to the gate of the power MISFET Q1, the supply of the voltage from the power supply BT to the load LA1 is stopped. The ON/OFF control of the power MISFET Q1 of the semiconductor device CP1 is performed by the control circuit DR of the semiconductor device CP2.

In this way, the semiconductor devices CP1 and CP2 (or a semiconductor device including the semiconductor devices CP1 and CP2) can function as a semiconductor device used as a switch that performs ON/OFF switching of voltage application from the power supply BT to the load LA1. The power MISFET Q1 of the semiconductor device CP1 can function as a switch element (switching element). The output of the power MISFET Q1 is supplied to the load LA1, so that the power MISFET Q1 can be assumed to be an output circuit.

A diode DD1 for detecting temperature is provided in the semiconductor device CP1. The diode DD1 is a diode (circuit) for detecting a temperature of the power MISFET Q1. The diode DD1 can also be assumed to be a diode (circuit) for detecting heat generation of the power MISFET Q1. The diode DD1 is disposed inside the semiconductor device CP1 (preferably near the power MISFET Q1 in the semiconductor device CP1) to be able to detect the temperature (heat generation) of the power MISFET Q1. The diode DD1 can also be assumed to be a temperature detection circuit.

The diode DD1 is the aforementioned diode DD formed in the diode forming region RG2. The diode DD1 is formed by forming a PN junction between the n⁺-type semiconductor region NR2 and the p-type semiconductor region PR3a. The diode DD1 is a VF diode used by applying a forward bias to the PN junction of the diode.

One or both of the anode (the anode wiring MLA) and the cathode (the cathode wiring W1C) of the diode DD1 are coupled to the control circuit DR. Since the voltage-current characteristics of the diode DD1 change depending on the temperature, it is possible to detect the temperature of the diode DD1 in the semiconductor device CP1 (the temperature of a region where the diode DD1 is disposed in the semiconductor device CP1) by detecting (monitoring) the voltage-current characteristics of the diode DD1. Therefore, when the diode DD1 is disposed in the semiconductor device CP1 (preferably near the power MISFET Q1), it is possible to detect the temperature (heat generation) of the power MISFET Q1 by the diode DD1.

Therefore, when the power MISFET Q1 generates excessive heat and the temperature of the diode DD1 exceeds a predetermined temperature, the control circuit DR supplies the OFF signal to the gate of the power MISFET Q1 (or stops supplying the ON signal), so that the power MISFET Q1 is turned off. Thereby, when the power MISFET Q1 generates excessive heat, it is possible to detect the excessive heat by the diode DD1 and quickly turn off the power MISFET Q1.

For example, if the load LA1 short-circuits while the power MISFET Q1 is turned on and a voltage is applied from the power supply BT to the load LA1, a large current (current larger than that of a normal operation) flows in the power MISFET Q1 and the power MISFET Q1 generates excessive heat. The diode DD1 detects the temperature rise due to the excessive heat generation of the power MISFET Q1, so that it is possible to quickly turn off the power MISFET Q1 when the load LA1 short-circuits. As the load LA1, any electronic device (or electronic component) desired to be coupled to the power supply BT through the semiconductor device (CP1) used as a switch can be applied.

Although a circuit configuration to which the present embodiment is preferably applied has been described with reference to FIG. 34, the present embodiment can be applied to other circuit configurations.

COMPARATIVE EXAMPLE

Figure 35:
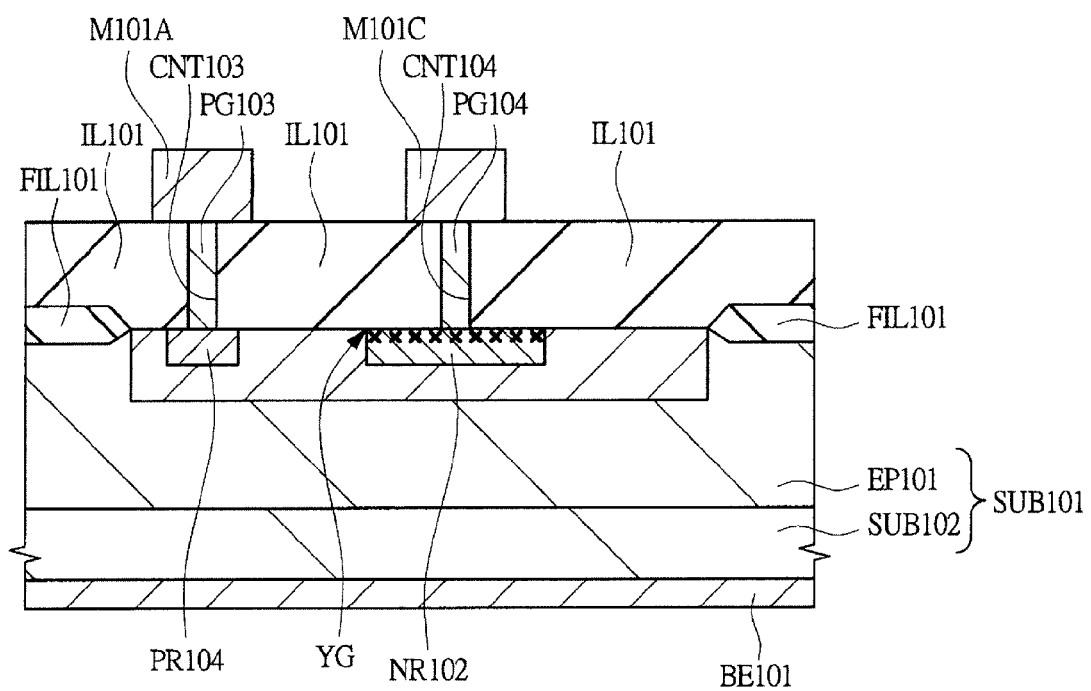
FIG. 35 is a main part cross-sectional view of a semiconductor device according to a comparative example.

FIG. 35 is a main part cross-sectional view of a semiconductor device according to a comparative example. FIG. 35 shows a diode forming area of the semiconductor device according to the comparative example.

In the semiconductor device of the comparative example in FIG. 35, a diode is formed in a substrate (semiconductor substrate) SUB101 corresponding to the substrate SUB. Specifically, the substrate SUB101 includes, a substrate body (semiconductor substrate) SUB102 formed of n⁺-type single crystal silicon and an epitaxial layer EP101 formed of n⁻-type single crystal silicon formed over the main surface of the substrate main body SUB102. An n⁺-type semiconductor region NR102, a p-type semiconductor region PR103, and a p⁺-type semiconductor region PR104, which are used as a diode, are formed in an active region of the epitaxial layer EP101 defined by the field insulating film FIL101. An interlayer insulating film IL101 is formed over the main surface of the substrate SUB101. Contact holes CNT103 and CNT104 are formed in the interlayer insulating film IL101. Plugs PG103 and PG104 are formed in the contact holes CNT103 and CNT104 respectively. An anode wiring M101A and a cathode wiring M101C are formed over the interlayer insulating film IL101 in which the plugs PG103 and PG104 are buried. Although a protective film (corresponding to the aforementioned insulating film IL2) is formed over the interlayer insulating film IL101 so as to cover the wiring M101A and the wiring M101C, the protective film is not shown in FIG. 35. A back surface electrode BE101 corresponding to the aforementioned back surface electrode BE is formed over the back surface of the substrate SUB101.

The n$^+$-type semiconductor region NR102 is an n-type semiconductor region used as the cathode of the diode. The n$^+$-type semiconductor region NR102 is formed in a surface layer portion of the epitaxial layer EP101. The cathode wiring M101C is electrically coupled to the n$^+$-type semiconductor region NR102 exposed from the contact hole CNT104 through the plug PG104. The p-type semiconductor region PR103 is a p-type semiconductor region used as the anode of the diode and is formed so as to enclose the n$^+$-type semiconductor region NR102. As a result, the side surface and the bottom surface of the n$^+$-type semiconductor region NR102 is in contact with the p-type semiconductor region PR103 and a PN junction is formed between the n$^+$-type semiconductor region NR102 and the p-type semiconductor region PR103, so that a diode is formed. The p$^+$-type semiconductor region PR104 having an impurity concentration higher than that of the p-type semiconductor region PR103 is formed in a surface layer portion of the epitaxial layer EP101. The p$^+$-type semiconductor region PR104 is formed so as to be separated from the n$^+$-type semiconductor region NR102 and enclosed by the p-type semiconductor region PR103 (therefore, p$^+$-type semiconductor region PR104 is in contact with the p-type semiconductor region PR103). The anode wiring M101A is electrically coupled to the p$^+$-type semiconductor region PR104 exposed from the contact hole CNT103 through the plug PG103.

The semiconductor device according to the comparative example having the above configuration (FIG. 35) has problems described below.

Each semiconductor region (the n$^+$-type semiconductor region NR102, the p-type semiconductor region PR103, and the p$^+$-type semiconductor region PR104 in FIG. 35) is formed by implanting ions into the substrate SUB101 (epitaxial layer EP101). When the ions are implanted into the semiconductor regions, crystal defects are generated in the surface of the substrate SUB101 (epitaxial layer EP101) by the ion implantation. In particular, the crystal defects tend to be generated by ion implantation with a large amount of dose and the crystal defects tend to be generated in a surface layer portion (region near the surface) of the n$^+$-type semiconductor region NR102 in an ion implantation process to form the n$^+$-type semiconductor region NR102. In FIG. 35, the crystal defects generated in the surface layer portion of the n$^+$-type semiconductor region NR102 are schematically shown by X marks.

It may be considered that heat treatment sufficient to repair the crystal defects is performed after the ion implantation. However, in this case, a high heat treatment temperature is required and this causes thermal diffusion of the impurities implanted by the ion implantation, so that there is an upper limit of the heat treatment temperature. When the trench gate type MISFET and the diode are formed in the same semiconductor substrate, to reduce the on-resistance of the trench gate type MISFET, the depths of the source semiconductor region the trench gate type MISFET (corresponding to the n$^+$-type semiconductor region NR1), the channel semiconductor region (corresponding to the p-type semiconductor region PR1), and the trench gate electrode (corresponding to the gate electrode GE) are required to be shallow. To satisfy the requirement, it is preferable to suppress the thermal diffusion of the impurities implanted by the ion implantation, and there is an upper limit of the heat treatment temperature after the ion implantation.

Therefore, there is a risk that the crystal defects caused by the ion implantation remain in the surface of the substrate SUB101 (epitaxial layer EP101). In this case, there is no important problem in the characteristics of the trench gate type MISFET, however there is a risk that the leakage current of the diode increases. The leakage current of the diode increases is because, in the semiconductor device according to the comparative example in FIG. 35, the cathode n$^+$-type semiconductor region NR102 of the diode and the anode p-type semiconductor region PR103 of the diode are adjacent to each other over the surface of the substrate SUB101 (epitaxial layer EP101) and the PN junction interface reaches the surface of the substrate SUB101 (epitaxial layer EP101). Leakage occurs more easily from the PN junction where crystal defects are generated than from a PN junction including no crystal defect. Therefore, the crystal defects caused by the ion implantation may remain in the surface of the substrate SUB101 (epitaxial layer EP101) and a region near the surface, and the PN junction of the diode is located there, so that leakage tends to occur from the PN junction between the n$^+$-type semiconductor region NR102 and the anode p-type semiconductor region PR103 of the diode (in FIG. 35, leakage tends to occur from the position indicated by an arrow YG). This causes degradation of the characteristics of the diode and degrades the performance of the semiconductor device.

<Main Characteristics of Diode of the Present Embodiment>

As known from FIGS. 4 to 7, one of the main characteristics of the semiconductor device according to the present embodiment is that the circumference of the n$^+$-type semiconductor region NR2 that functions as the cathode of the diode (DD) is surrounded by the trench TR2 in a planar view. In other words, the trench TR2 is formed so as to surround the n$^+$-type semiconductor region NR2 in a planar view in the diode forming region RG2. The circumference of the n$^+$-type semiconductor region NR2 that functions as the cathode of the diode (DD) is surrounded in a planar view by the trench TR2 in which the dummy gate electrode GED is buried.

The circumference of the n$^+$-type semiconductor region NR2 is surrounded by the trench TR2 in a planar view, so that the n$^+$-type semiconductor region NR2 that functions as the cathode of the diode (DD) is not in contact with the p-type semiconductor region that functions as the anode of the diode (DD) planarly (in a planar view) and the n$^+$-type semiconductor region NR2 is in contact with the p-type semiconductor region in the thickness direction of the substrate SUB. Specifically, a part of the anode p-type semiconductor region (here, the p-type semiconductor region PR3a) is formed directly below the n$^+$-type semiconductor region NR2 that functions as the cathode and a PN junction is formed between the n$^+$-type semiconductor region NR2 and the p-type semiconductor region (here, the p-type semiconductor region PR3a) located directly below the n$^+$-type semiconductor region NR2, so that the diode (DD) is formed. In other words, the bottom surface (lower surface) of the n$^+$-type semiconductor region NR2 is in contact with the p-type semiconductor region (here, the p-type semiconductor region PR3a), so that a PN junction is formed in the bottom surface (lower surface) of the n$^+$-type semiconductor region NR2, and thereby the diode (DD) is formed.

The bottom surface (lower surface) of the n$^+$-type semiconductor region NR2 is in contact with the anode p-type semiconductor region (here, the p-type semiconductor region PR3a), so that the n$^+$-type semiconductor region NR2 that functions as the cathode is in contact with the anode p-type semiconductor region (here, the p-type semiconductor region PR3a) of the diode (DD) in the thickness direction of the substrate SUB. On the other hand, the side surface of the n$^+$-type semiconductor region NR2 is in contact with the trench TR2, so that the side surface of the n$^+$-type semiconductor region NR2 is not in contact with the anode p-type semiconductor region of the diode (DD). Therefore, the bottom surface of the n$^+$-type semiconductor region NR2 is in contact with the anode p-type semiconductor region and the side surface of the n$^+$-type semiconductor region NR2 is not in contact with the anode p-type semiconductor region. As a result, the side surface of the n$^+$-type semiconductor region NR2 is not in contact with any p-type semiconductor region and the n$^+$-type semiconductor region NR2 is not in contact with any p-type semiconductor region planarly (in a planar view). Therefore, the PN junction between the cathode n-type semiconductor region (here, the n$^+$-type semiconductor region NR2) and the anode p-type semiconductor region is not formed in the side surface of the n$^+$-type semiconductor region NR2, but is formed in the bottom surface (lower surface) of the n$^+$-type semiconductor region NR2.

The p-type semiconductor region which forms a PN junction (which forms the diode DD) with the n$^+$-type semiconductor region NR2 is the p-type semiconductor region PR3$a$ of the p-type semiconductor region PR3, which is located directly below the n$^+$-type semiconductor region NR2. Therefore, the p-type semiconductor region PR3$a$ mainly functions as the anode of the diode (DD). However, the p-type semiconductor region PR3$a$ is electrically coupled to the plug PG3 and the wiring (anode wiring) M1A through the p-type well PW2 having the same conductivity type as that of the p-type semiconductor region PR3$a$, the p-type semiconductor region PR3$b$, and the p$^+$-type semiconductor region PR4. Therefore, a region including the p-type semiconductor region PR3$a$, the p-type semiconductor region PR3$b$, the p-type well PW2, and the p$^+$-type semiconductor region PR4 can be assumed to be the anode p-type semiconductor region of the diode (DD). However, the PN junction, which forms the diode (DD), is formed between the n$^+$-type semiconductor region NR2 and the p-type semiconductor region in contact with the n$^+$-type semiconductor region NR2, so that the PN junction is formed between the n$^+$-type semiconductor region NR2 and the p-type semiconductor region PR3$a$ (that is, the PN junction is formed in the bottom surface of the n$^+$-type semiconductor region NR2). The cathode n-type semiconductor region of the diode (DD) is the n$^+$-type semiconductor region NR2.

As described above, in the present embodiment, the circumference of the cathode n$^+$-type semiconductor region NR2 of the diode (DD) is surrounded by the trench TR2 in a planar view, so that the PN junction that forms the diode (DD) is formed between the n$^+$-type semiconductor region NR2 and the p-type semiconductor region PR3$a$ directly below the n$^+$-type semiconductor region NR2. Thereby, the PN junction between the cathode n$^+$-type semiconductor region NR2 and the anode p-type semiconductor region does not reach the surface of the substrate SUB, so that even if the crystal defects caused by the ion implantation (corresponding to the crystal defects described in relation to the comparative example in FIG. 35) are formed near the surface of the substrate SUB, it is possible to prevent the crystal defects from affecting the PN junction of the diode (DD).

In the present embodiment, the PN junction that forms the diode (DD) is not formed near the surface of the substrate SUB (epitaxial layer EP) where the crystal defects caused by the ion implantation tend to remain, but is formed in a position (here, the bottom surface of the n$^+$-type semiconductor region NR2) deeper than the surface of the substrate SUB (epitaxial layer EP). The depth of the bottom surface of the n$^+$-type semiconductor region NR2 is deeper than the surface of the substrate SUB (epitaxial layer EP), so that the crystal defects caused by the ion implantation are difficult to be generated in the depth position of the bottom surface of the n$^+$-type semiconductor region NR2 as compared with the surface of the substrate SUB (epitaxial layer EP). Therefore, the PN junction formed in the bottom surface of the n$^+$-type semiconductor region NR2 is hardly affected by the crystal defects caused by the ion implantation, so that leakage due to the crystal defects is difficult to be generated. Therefore, the characteristics of the diode can be improved, so that it is possible to improve performance of the semiconductor device including the trench gate type MISFET and the diode.

Another one of the main characteristics of the semiconductor device according to the present embodiment is that the dummy gate electrode GED is electrically coupled to one of the anode and the cathode of the diode (DD). Specifically, the dummy gate electrode GED is electrically coupled to one of the anode p-type semiconductor region and the cathode n$^+$-type semiconductor region NR2.

Unlike the present embodiment, if the dummy gate electrode GED is not coupled to any potential and has a floating potential, the potential of the dummy gate electrode GED, which is in a floating state, becomes unstable and the characteristics of the diode DD vary (fluctuate).

On the other hand, in the present embodiment, the dummy gate electrode GED does not have floating potential, but is electrically coupled to one of the anode and the cathode of the diode DD. Specifically, the dummy gate electrode GED is electrically coupled to one of the anode p-type semiconductor region and the cathode n$^+$-type semiconductor region NR2 of the diode DD. Thereby, the potential of the dummy gate electrode GED is stabilized, so that it is possible to control or prevent the characteristics of the diode DD from varying (fluctuating).

In FIGS. 4 to 7, the dummy gate electrode GED is electrically coupled to the cathode of the diode DD. Specifically, the dummy gate electrode GED is electrically coupled to the cathode n$^+$-type semiconductor region NR2. A specific coupling relationship is as described below.

In FIGS. 4 to 7, the wiring (cathode wiring) M1C is electrically coupled to the cathode n$^+$-type semiconductor region NR2 through the plug PG4. Specifically, the plug PG4 is formed over the n$^+$-type semiconductor region NR2, the lower portion (the bottom surface) of the plug PG4 is in contact with the n$^+$-type semiconductor region NR2, and the upper portion (the top surface) of the plug PG4 is in contact with the wiring M1C, so that the wiring M1C is electrically coupled to the n$^+$-type semiconductor region NR2 through the plug PG4. The wiring M1C is also electrically coupled to the dummy gate electrode GED through the plug PG5. Specifically, the plug PG5 is formed over the dummy gate electrode GED, the lower portion (the bottom surface) of the plug PG5 is in contact with the dummy gate electrode GED, and the upper portion (the top surface) of the plug PG5 is in contact with the wiring M1C, so that the wiring M1C is electrically coupled to the dummy gate electrode GED through the plug PG5. As a result, the cathode wiring M1C is not only electrically coupled to the cathode n$^+$-type semiconductor region NR2 through the plug PG4, but also electrically coupled to the dummy gate electrode GED through the plug PG5. Thereby, the dummy gate electrode GED is electrically coupled to the cathode n$^+$-type semiconductor region NR2 through the plug PG5, the wiring M1C, and the plug PG4.

In FIGS. 4 to 7, the anode wiring M1A is electrically coupled to the anode p-type semiconductor region (here, p$^+$-type semiconductor region PR4 which is a part of the anode p-type semiconductor region) through the plug PG3. Specifically, the plug PG3 is formed over the p$^+$-type semiconductor region PR4, the lower portion (the bottom surface) of the plug PG3 is in contact with the p$^+$-type semiconductor region PR4, and the upper portion (the top surface) of the plug PG3 is in contact with the wiring M1A, so that the wiring M1A is electrically coupled to the p$^+$-type semiconductor region PR4 (therefore, to the anode p-type semiconductor region) through the plug PG3. However, in FIGS. 4 to 7, the dummy gate electrode GED is not electrically coupled to the anode wiring M1A. Therefore, the dummy gate electrode GED is not electrically coupled to the anode p-type semiconductor region.

As another form, the dummy gate electrode GED can be electrically coupled to the anode of the diode DD instead of the cathode of the diode DD. This case will be described with reference to FIGS. 36 to 39.

Figure 36:
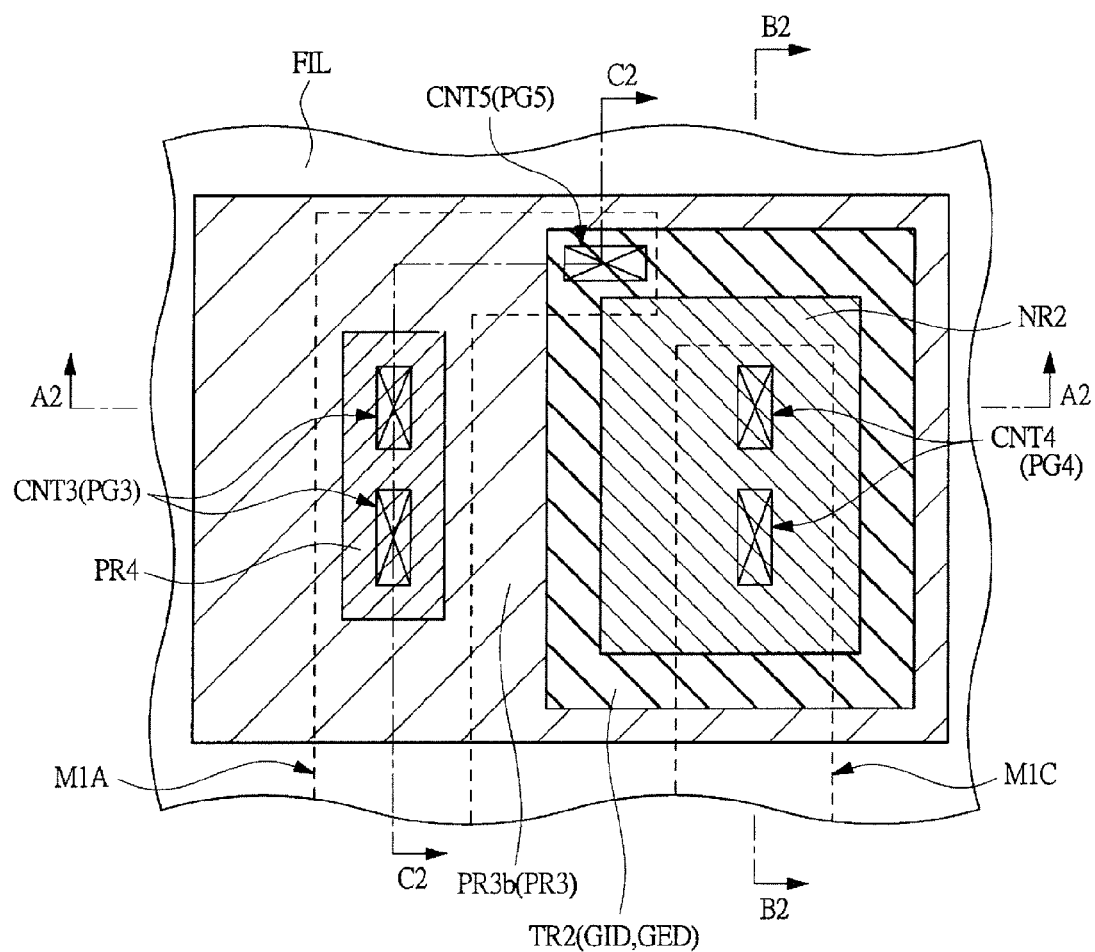
FIG. 36 is a main part plan view of the semiconductor device according to the embodiment.
Figure 37:
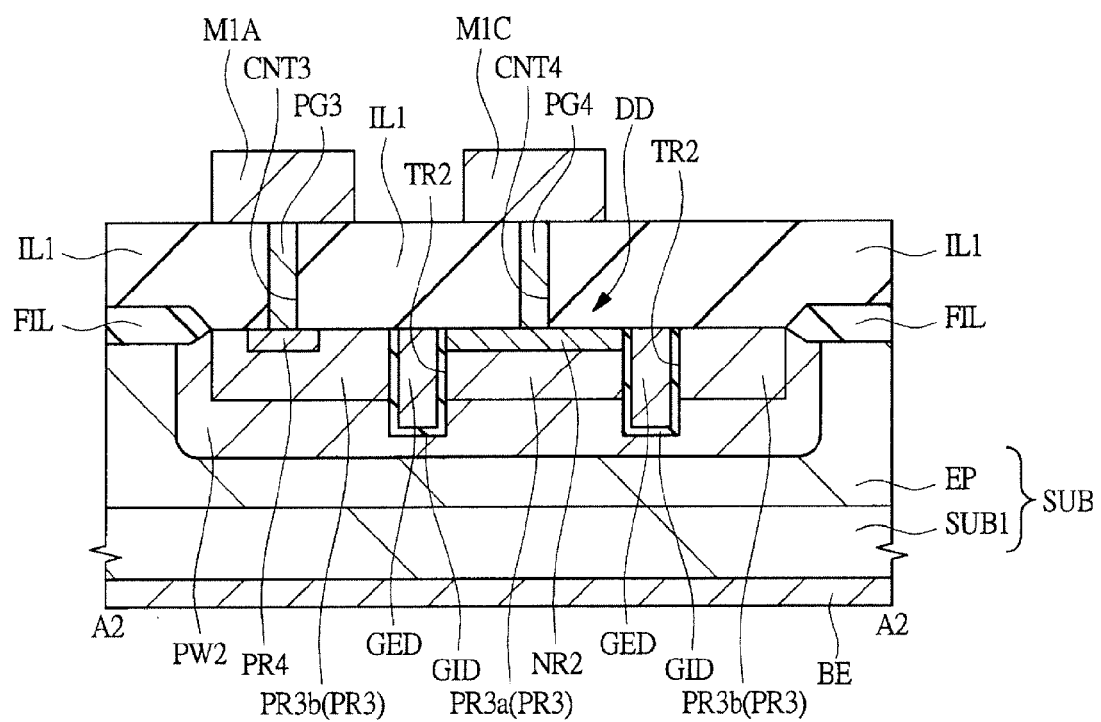
FIG. 37 is a cross-sectional view taken along a line A2-A2 in FIG. 36.
Figure 38:
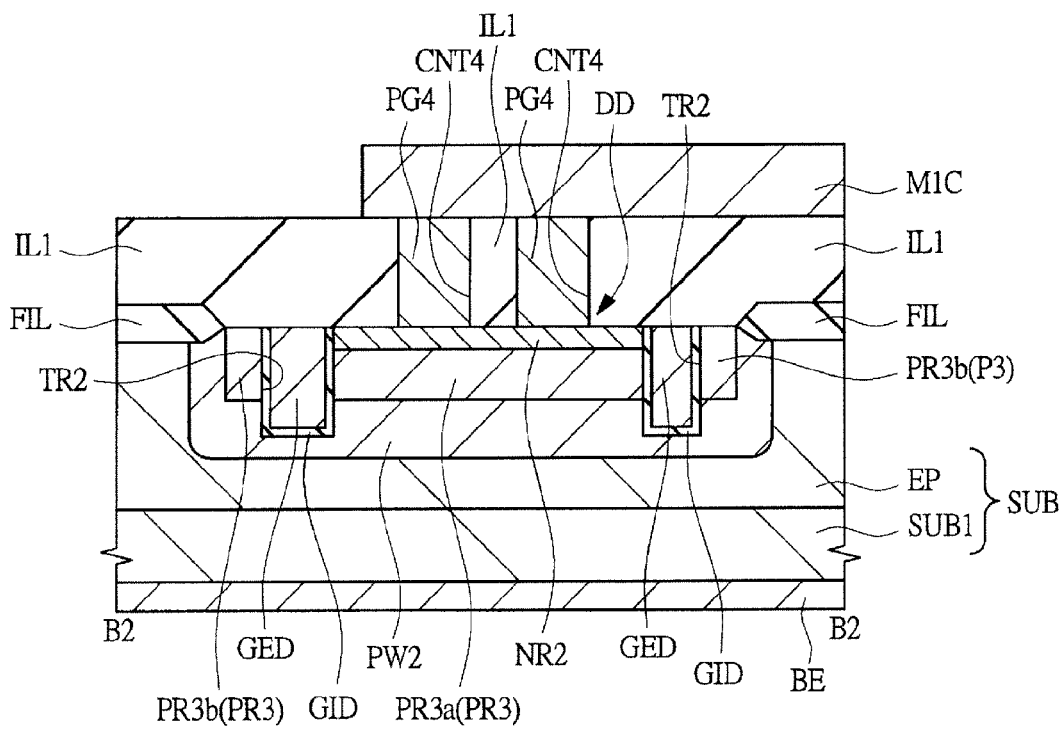
FIG. 38 is a cross-sectional view taken along a line B2-B2 in FIG. 36.
Figure 39:
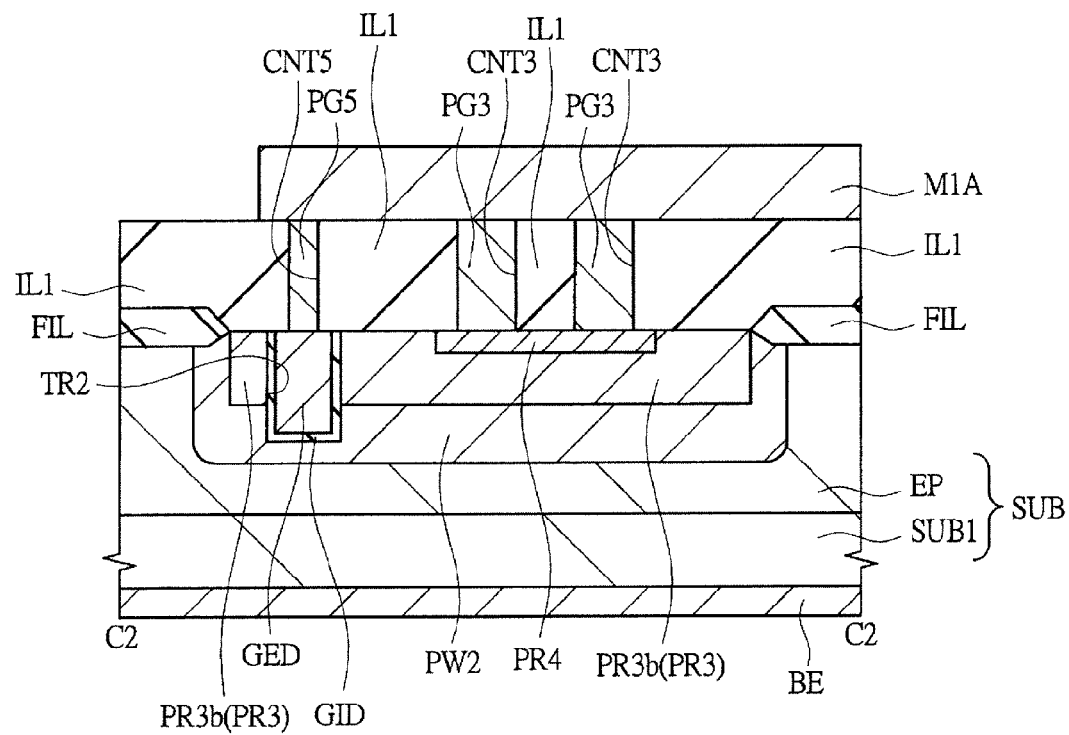
FIG. 39 is a cross-sectional view taken along a line C2-C2 in FIG. 36.

FIGS. 36 to 39 are a main part plan view (FIG. 36) and main part cross-sectional views (FIGS. 37 to 39) of the semiconductor device according to the present embodiment when the dummy gate electrode GED is electrically coupled to the anode of the diode DD (that is, when the dummy gate electrode GED is electrically coupled to the anode p-type semiconductor region). FIGS. 36 to 39 correspond to FIGS. 4 to 7 respectively. The cross-sectional view taken along a line A2-A2 in FIG. 36 corresponds to FIG. 37. The cross-sectional view taken along a line B2-B2 in FIG. 36 corresponds to FIG. 38. The cross-sectional view taken along a line C2-C2 in FIG. 36 corresponds to FIG. 39. In FIGS. 37 to 39, the insulating film IL2 is not shown so as to make the drawings easy to see. FIG. 36 is a plan view showing the main surface of the substrate SUB. In FIG. 36, hatching is applied to make the drawing easy to see in the same manner as in FIG. 4.

The differences between the structures in FIGS. 36 to 39 and the structures in FIGS. 4 to 7 are the positions of the contact hole CNT5 and the plug PG5 buried in the contact hole CNT5 and the layouts (planar shapes) of the wiring M1A and the wiring M1C. Components other than the above can be basically the same.

In FIGS. 36 to 39, the dummy gate electrode GED is electrically coupled to the anode of the diode DD. Specifically, the dummy gate electrode GED is electrically coupled to the anode p-type semiconductor region. A specific coupling relationship is as described below.

In FIGS. 36 to 39, the wiring (anode wiring) M1A is electrically coupled to the anode p-type semiconductor region through the plug PG3 in the same manner as in FIGS. 4 to 7. Specifically, the plug PG3 is formed over the p$^+$-type semiconductor region PR4, which is a part of the anode p-type semiconductor region, the lower portion (the bottom surface) of the plug PG3 is in contact with the p$^+$-type semiconductor region PR4, and the upper portion (the top surface) of the plug PG3 is in contact with the wiring M1A, so that the wiring M1A is electrically coupled to the p$^+$-type semiconductor region PR4 (therefore, to the anode p-type semiconductor region) through the plug PG3. In FIGS. 36 to 39, the anode wiring M1A is also electrically coupled to the dummy gate electrode GED through the plug PG5. Specifically, the plug PG5 is formed over the dummy gate electrode GED, the lower portion (the bottom surface) of the plug PG5 is in contact with the dummy gate electrode GED, and the upper portion (the top surface) of the plug PG5 is in contact with the wiring M1A, so that the wiring M1A is electrically coupled to the dummy gate electrode GED through the plug PG5. As a result, in FIGS. 36 to 39, the anode wiring M1A is not only electrically coupled to the anode p-type semiconductor region through the plug PG3, but also electrically coupled to the dummy gate electrode GED through the plug PG5. Thereby, the dummy gate electrode GED is electrically coupled to the anode p-type semiconductor region through the plug PG5, the wiring M1A, and the plug PG3. The p$^+$-type semiconductor region PR4 is electrically coupled to the p-type semiconductor region PR3a through the p-type semiconductor region PR3b and the p-type well PW2, so that the dummy gate electrode GED is electrically coupled to the p-type semiconductor region PR3a through the plug PG5, the wiring M1A, the plug PG3, the p$^+$-type semiconductor region PR4, the p-type semiconductor region PR3b, and the p-type well PW2.

In FIGS. 36 to 39, the wiring (cathode wiring) M1C is electrically coupled to the cathode n$^+$-type semiconductor region NR2 through the plug PG4 in the same manner as in FIGS. 4 to 7. However, in FIGS. 36 to 39, the dummy gate electrode GED is not electrically coupled to the cathode wiring M1C. Therefore, the dummy gate electrode GED is not electrically coupled to the cathode n$^+$-type semiconductor region NR2.

In this way, in the present embodiment, the dummy gate electrode GED is electrically coupled to the anode (that is, the anode p-type semiconductor region) of the diode DD (in the case of FIGS. 36 to 39) or electrically coupled to the cathode (that is, the cathode n$^+$-type semiconductor region NR2) of the diode DD (in the case of FIGS. 4 to 7). Thereby, the dummy gate electrode GED does not have floating potential, so that the potential of the dummy gate electrode GED is stabilized. Therefore, it is possible to control or prevent the characteristics of the diode from varying (fluctuating) and to improve the performance of the semiconductor device.

The semiconductor device according to the present embodiment is a semiconductor device in which the trench gate type MISFET and the diode (DD) are formed in the same substrate SUB. Therefore, the trench TR2 that planarly surrounds the n$^+$-type semiconductor region NR2 can be formed in the same process as that of the trench TR1 for forming the trench gate (gate electrode GE), and the conductive material that is buried in the trench TR2 through the insulating film can be the dummy gate electrode GED formed in the same process as that of the trench gate (gate electrode GE). Thereby, it is possible to surround the n$^+$-type semiconductor region NR2 by the trench TR2 (the trench TR2 in which the dummy gate electrode GED is buried through the dummy gate insulating film GID) without increasing the number of manufacturing processes. Therefore, it is possible to control the number of manufacturing processes and reduces the manufacturing cost of the semiconductor device.

The trench TR2 can be formed to have a width smaller than that of the field insulating film FIL. Therefore, even when the trench TR2 is formed so as to surround the n$^+$-type semiconductor region NR2, it is possible to control the planar size of the diode forming region RG2 from increasing, so that it is also possible to control or prevent the plane area of the semiconductor device from increasing.

When the trench structure that surrounds the anode n$^+$-type semiconductor region NR2 is formed by the same process as that of the trench gate structure, the conductive material (dummy gate electrode GED) is buried in the trench TR2 that surrounds the n$^+$-type semiconductor region NR2 through the insulating film (dummy gate insulating film GID). It is important for the conductive material (dummy gate electrode GED) buried in the trench TR2 to be electrically coupled to the anode or the cathode instead of being floating. By doing so, the characteristics of the diode can be stabilized.

Although the crystal defects caused by the ion implantation (corresponding to the crystal defects described in relation to the comparative example in FIG. 35) are formed near the surface of the substrate SUB (epitaxial layer EP), in a region deeper than 100 nm from the surface of the substrate SUB, the crystal defects caused by the ion implantation are hardly formed or the crystal defects can be easily repaired even if the crystal defects are formed. Therefore, it is preferable that the depth (the depth position of the bottom) of the cathode n$^+$-type semiconductor region NR2 is 100 nm or more from the surface of the substrate SUB (for example, the depth can be about 300 nm). By doing so, the depth of the PN junction plane formed in the bottom surface of the n$^+$-type semiconductor region NR2 is 100 nm or more from the surface of the substrate SUB, so that it is possible to more reliably prevent the crystal defects from being formed in the PN junction plane and it is also possible to more reliably prevent the leakage due to the crystal defects from occurring. Therefore, the characteristics of the diode can be more reliably improved, so that it is possible to more reliably improve the performance of the semiconductor device including the trench gate type MISFET and the diode.

In the present embodiment, the diode DD is formed by forming the PN junction between the n$^+$-type semiconductor region NR2 and the p-type semiconductor region PR3$a$ directly below the n$^+$-type semiconductor region NR2. The anode wiring M1A can be electrically coupled to the p-type semiconductor region PR3$a$ by electrically coupling the anode p-type semiconductor region PR3$a$ to the surface of the substrate SUB (that is, the surface of the epitaxial layer EP). Therefore, although the p-type semiconductor region PR3$a$, which is a part of the anode p-type semiconductor region, is in direct contact with the n$^+$-type semiconductor region NR2 to form the PN junction, it is preferable that the anode p-type semiconductor region is formed from a region directly below the n$^+$-type semiconductor region NR2 to a region adjacent to the n$^+$-type semiconductor region NR2 with the trench TR2 in between in a planar view. In FIGS. 4 to 7 (or in FIGS. 36 to 39), the anode p-type semiconductor region including the p-type semiconductor regions PR3$a$ and PR3$b$, the p-type well PW2, and the p$^+$-type semiconductor region PR4 is formed from a region directly below the n$^+$-type semiconductor region NR2 to a region adjacent to the n$^+$-type semiconductor region NR2 with the trench TR2 in between in a planar view.

Specifically, a part of the anode p-type semiconductor region (corresponding to the p-type semiconductor region PR3$a$ and a part of the p-type well PW2 directly below the n$^+$-type semiconductor region NR2) is formed in a region overlapping the n$^+$-type semiconductor region NR2 in a planar view (that is, a region directly below the n$^+$-type semiconductor region NR2). Another part of the anode p-type semiconductor region (corresponding to the p$^+$-type semiconductor region PR4, the p-type semiconductor region PR3$b$, and a part of the p-type well PW2 directly below the p-type semiconductor region PR3$b$) is formed in a region adjacent to the n$^+$-type semiconductor region NR2 with the trench TR2 in between in a planar view. Further, another part of the anode p-type semiconductor region (corresponding to a part of the p-type well PW2 directly below the trench TR2) is formed in a region overlapping the trench TR2 in a planar view (that is, a region directly below the trench TR2). In summary, the anode p-type semiconductor region is continuously formed over the region overlapping the n$^+$-type semiconductor region NR2, the region overlapping the trench TR2, and the region adjacent to the n$^+$-type semiconductor region NR2 with the trench TR2 in between in a planar view.

In this way, the anode p-type semiconductor region is formed from the region directly below the n$^+$-type semiconductor region NR2 (the region overlapping the n$^+$-type semiconductor region NR2 in a planar view) to the region adjacent to the n$^+$-type semiconductor region NR2 with the trench TR2 in between in a planar view. By doing so, in the region adjacent to the n$^+$-type semiconductor region NR2 with the trench TR2 in between in a planar view, the anode p-type semiconductor region (here, p-type semiconductor region PR3$b$ and the p$^+$-type semiconductor region PR4) can be exposed in the surface of the substrate SUB and the anode wiring M1A can be coupled to the exposed p-type semiconductor region through the plug PG3. Thereby, the anode wiring M1A can be easily electrically coupled to the anode p-type semiconductor region. Therefore, the anode wiring M1A can be easily electrically coupled to the p-type semiconductor region PR3$a$.

Although the bottom (bottom surface) of the cathode n$^+$-type semiconductor region NR2 is shallower than the bottom (bottom surface) of the trench TR2, the bottom (bottom surface) of the anode p-type semiconductor region is deeper than the bottom (bottom surface) of the trench TR2. In other words, the depth position of the bottom (bottom surface) of the cathode n$^+$-type semiconductor region NR2 is shallower than the depth position of the bottom (bottom surface) of the trench TR2, and the depth position of the bottom (bottom surface) of the anode p-type semiconductor region is deeper than the depth position of the bottom (bottom surface) of the trench TR2. In FIGS. 4 to 7 (or in FIGS. 36 to 39), the bottom (bottom surface) of the anode p-type semiconductor region corresponds to the bottom (bottom surface) of the p-type well PW2.

The bottom (bottom surface) of the anode p-type semiconductor region is formed deeper than the bottom (bottom surface) of the trench TR2, so that a part of the anode p-type semiconductor region extends directly below the trench TR2. Thereby, it is possible to electrically couple the p-type semiconductor region (PR3$a$), which is located directly below the n$^+$-type semiconductor region NR2 and forms a PN junction with the n$^+$-type semiconductor region NR2, to the p-type semiconductor region (PR3$b$, PR4) in a region adjacent to the n$^+$-type semiconductor region NR2 with the trench TR2 in between through the p-type semiconductor region (p-type well PW2) located directly below the trench TR2. Thereby, it is possible to easily electrically couple the anode wiring M1A (plug PG3) to the p-type semiconductor region (PR3$a$) directly below the cathode n$^+$-type semiconductor region NR2 through the p-type semiconductor region.

Figure 40:
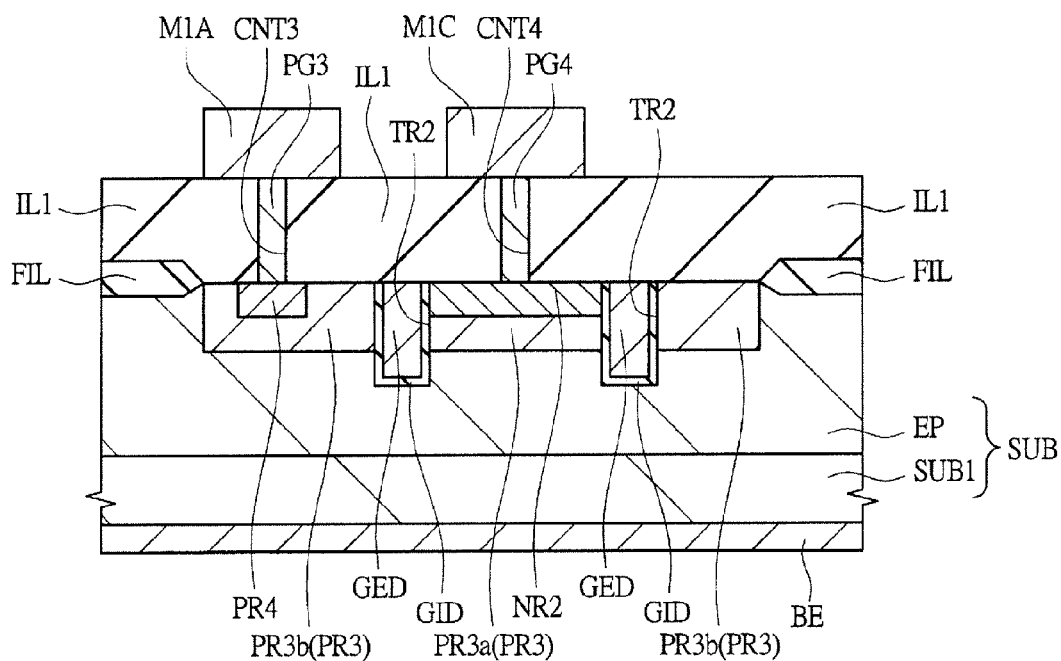
FIG. 40 is a main part cross-sectional view of a semiconductor device according to a first study example.

FIG. 40 is a main part cross-sectional view of a semiconductor device according to a first study example. FIG. 40 is a main part cross-sectional view of the semiconductor device in which the p-type well PW2 is removed from the structure shown in FIGS. 4 to 7 (or FIGS. 36 to 39). FIG. 40 shows a cross-sectional view corresponding to that of FIG. 5.

In FIG. 40, since the p-type well PW2 is not formed, the anode p-type semiconductor region is formed by the p-type semiconductor regions PR3$a$ and PR3$b$ and the p$^+$-type semiconductor region PR4. In this case, the bottom of the anode p-type semiconductor region is shallower than the bottom of the trench TR2. When the bottom of the anode p-type semiconductor region is shallower than the bottom of the trench TR2, it is difficult to electrically couple the p-type semiconductor region (PR3$a$), which is located directly below the n$^+$-type semiconductor region NR2 and forms a PN junction with the n$^+$-type semiconductor region NR2, to the surface of the substrate SUB (that is, the surface of epitaxial layer EP). In other words, in the case of FIG. 40, since the p-type semiconductor region PR3$a$ and the p-type semiconductor region PR3$b$ are not coupled by a p-type semiconductor region, it is difficult to electrically couple the anode wiring M1A to the p-type semiconductor region (PR3$a$) directly below the cathode n$^+$-type semiconductor region NR2.

On the other hand, in the present embodiment, the bottom of the anode p-type semiconductor region (corresponding to the bottom of the p-type well PW2) is deeper than the bottom of the trench TR2. Therefore, it is possible to electrically couple the p-type semiconductor region (PR3a), which is located directly below the n⁺-type semiconductor region NR2 and forms a PN junction with the n⁺-type semiconductor region NR2, to the surface of the substrate SUB (that is, the surface of epitaxial layer EP) across the trench TR2. Specifically, in the case of FIGS. 4 to 7 (or FIGS. 36 to 39), the bottom of the anode p-type semiconductor region (corresponding to the bottom of the p-type well PW2) is deeper than the bottom of the trench TR2, so that the p-type semiconductor region PR3a and the p-type semiconductor region PR3b are coupled by the p-type well PW2. Therefore, it is possible to easily electrically couple the anode wiring M1A to the p-type semiconductor region (PR3a) directly below the cathode n⁺-type semiconductor region NR2.

Figure 41:
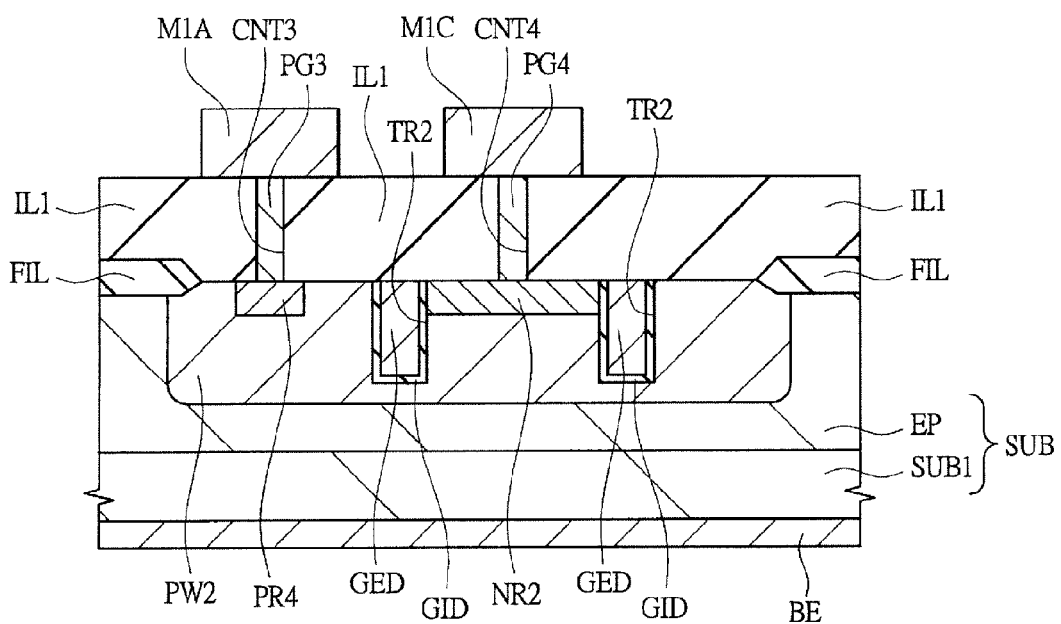
FIG. 41 is a main part cross-sectional view of a semiconductor device according to a second study example.

FIG. 41 is a main part cross-sectional view of a semiconductor device according to a second study example. FIG. 41 is a main part cross-sectional view of the semiconductor device in which the p-type semiconductor regions PR3 (PR3a, PR3b) are removed from the structure shown in FIGS. 4 to 7 (or FIGS. 36 to 39). FIG. 41 shows a cross-sectional view corresponding to that of FIG. 5.

In the case of FIG. 41, the p-type semiconductor regions PR3 (PR3a, PR3b) are not formed. Therefore, the region of the p-type semiconductor regions PR3 (PR3a, PR3b) in FIGS. 4 to 7 (or FIGS. 36 to 39) is a part of the p-type well PW2 in FIG. 41. Hence, in FIG. 41, the anode p-type semiconductor region is formed by the p-type well PW2 and the p⁺-type semiconductor region PR4. In this case, the PN junction is formed between the n⁺-type semiconductor region NR2 and a part of the p-type well PW2 which is located directly below the n⁺-type semiconductor region NR2, so that the diode (DD) is formed.

In the case of FIG. 41, the bottom of the anode p-type semiconductor region (corresponding to the bottom of the p-type well PW2) is deeper than the bottom of the trench TR2, so that a part of the anode p-type semiconductor region (corresponding to the p-type well PW2 directly below the trench TR2) also extends directly below the trench TR2. Thereby, it is possible to electrically couple a part of the p-type well PW2, which is located directly below the n⁺-type semiconductor region NR2 and forms a PN junction with the n⁺-type semiconductor region NR2, to the p-type well PW2 in a region adjacent to the n⁺-type semiconductor region NR2 with the trench TR2 in between and the p⁺-type semiconductor region PR4 through a part of the p-type well PW2 located directly below the trench TR2. Thereby, it is possible to easily electrically couple the anode wiring M1A (plug PG3) to the p-type semiconductor region (p-type well PW2) directly below the cathode n⁺-type semiconductor region NR2 through the p-type semiconductor region.

Therefore, even in the structure shown in FIG. 41, in the same manner as in the structure shown in FIGS. 4 to 7 (or FIGS. 36 to 39), the cathode n⁺-type semiconductor region NR2 is surrounded by the trench TR2, so that it is possible to form a diode where leakage due to the crystal defects caused by the ion implantation is hard to occur. Further, the dummy gate electrode GED is electrically coupled to one of the anode and the cathode, so that it is possible to control or prevent the characteristics of the diode from varying (fluctuating). In the structure shown in FIG. 41, the bottom of the n⁺-type semiconductor region NR2 is shallower than the depth of the trench TR2 in the same manner as in the structure shown in FIGS. 4 to 7 (or FIGS. 36 to 39). Therefore, the second study example in FIG. 41 can be assumed to be a modified example of the present embodiment.

However, the structure shown in FIGS. 4 to 7 (or FIGS. 36 to 39) is more advantageous than the structure shown in FIG. 41 in the points described below.

The trench TR2 is formed in the same process as that of the trench TR1 used for the trench gate and a certain depth is required for the trench TR2, considering that the gate electrode GE is buried. When forming an impurity diffusion region whose depth (position of the bottom surface) is deeper than the trenches TR1 and TR2 by ion implantation, it is not easy to increase the impurity concentration. Therefore, when forming the p-type semiconductor region (corresponding to the p-type well PW2 in FIG. 41) which forms a PN junction with the cathode n⁺-type semiconductor region NR2 so that the depth (the position of the bottom surface) is deeper than the depth of the trench TR2 as in the case of FIG. 41, there is a limit to increasing the impurity concentration in the p-type semiconductor region (corresponding to the p-type well PW2 in FIG. 41).

However, the diode characteristics of the p-type semiconductor region (anode region), which is located directly below the n⁺-type semiconductor region NR2 and forms a PN junction with the n⁺-type semiconductor region NR2 (cathode region), is hard to be stable (easy to vary) when the impurity concentration is low. This is because, when the impurity concentration in the p-type semiconductor region is low, the impurity state of the p-type semiconductor region is easy to vary and is easily affected by movable ions. Therefore, it is desired that the impurity concentration in the p-type semiconductor region (anode region), which is located directly below the n⁺-type semiconductor region NR2 and forms a PN junction with the n⁺-type semiconductor region NR2 (cathode region), is high to a certain extent. However, it is difficult to form the p-type semiconductor region whose depth (position of the bottom surface) is deeper than the depth of the trench TR2 so that the p-type semiconductor region has a high impurity concentration.

On the other hand, in the case of FIGS. 4 to 7 (or FIGS. 36 to 39), the anode p-type semiconductor region includes a p-type first region (corresponding to the p-type semiconductor region PR3a) which is formed directly below the n⁺-type semiconductor region NR2 to be in contact with the n⁺-type semiconductor region NR2 and which is shallower than the bottom of the trench TR2 and a p-type second region (corresponding to the p-type well PW2) which is in contact with the first region (p-type semiconductor region PR3a) and which is deeper than the bottom of the trench TR2. In summary, the bottom of the p-type first region (p-type semiconductor region PR3a) is shallower than the bottom of the trench TR2 and the bottom of the p-type second region (p-type well PW2) is deeper than the bottom of the trench TR2. The first region (p-type semiconductor region PR3a) has an impurity concentration higher than that of the second region (p-type well PW2). The second region (p-type well PW2) also extends directly below the trench TR2.

Therefore, in the structure shown in FIGS. 4 to 7 (or FIGS. 36 to 39), the p-type first region (corresponding to the p-type semiconductor region PR3a) which is formed directly below the n⁺-type semiconductor region NR2 to be in contact with the n⁺-type semiconductor region NR2 is formed shallower than the bottom of the trench TR2, so that it is easy to form the p-type first region having a high impurity concentration. The p-type first region (p-type semiconductor region PR3a) having a high impurity concentration is provided directly below the n⁺-type semiconductor region NR2 to form a PN junction with the n⁺-type semiconductor region NR2 (cathode region), so that the diode characteristics can be stabilized. In other words, it is possible to control the diode characteristics from varying (fluctuating). The p-type second region (p-type well PW2) which is in contact with the p-type first region (p-type semiconductor region PR3a) and which is deeper than the bottom of the trench TR2 is provided and the impurity concentration of the p-type second region (p-type well PW2) is lower than that of the p-type first region (p-type semiconductor region PR3a). Therefore, it is easy to form the p-type second region (p-type well PW2) deeper than the depth of the trench TR2 and the p-type second region (p-type well PW2) can be extended directly below the trench TR2.

Thereby, it is possible to electrically couple the p-type first region (p-type semiconductor region PR3a), which is located directly below the $n^+$-type semiconductor region NR2 and forms a PN junction with the $n^+$-type semiconductor region NR2, to the p-type semiconductor region (PW2, PR3b, PR4) in a region adjacent to the $n^+$-type semiconductor region NR2 with the trench TR2 in between through a part of the p-type well PW2 which is located directly below the trench TR2. Therefore, it is possible to easily electrically couple the anode wiring M1A (plug PG3) to the p-type semiconductor region (p-type semiconductor region PR3a) directly below the cathode $n^+$-type semiconductor region NR2 through the p-type semiconductor region.

When the p-type first region (p-type semiconductor region PR3a) is formed in the same process (the same ion implantation process) as that of the p-type semiconductor region PR1 in the MISFET forming region RG1, it is possible to reduce the number of manufacturing processes. When the p-type second region (p-type well PW2) is formed in the same process (the same ion implantation process) as that of the p-type well PW1 in the MISFET forming region RG1, it is possible to reduce the number of manufacturing processes.

Modified Example

Figure 42:
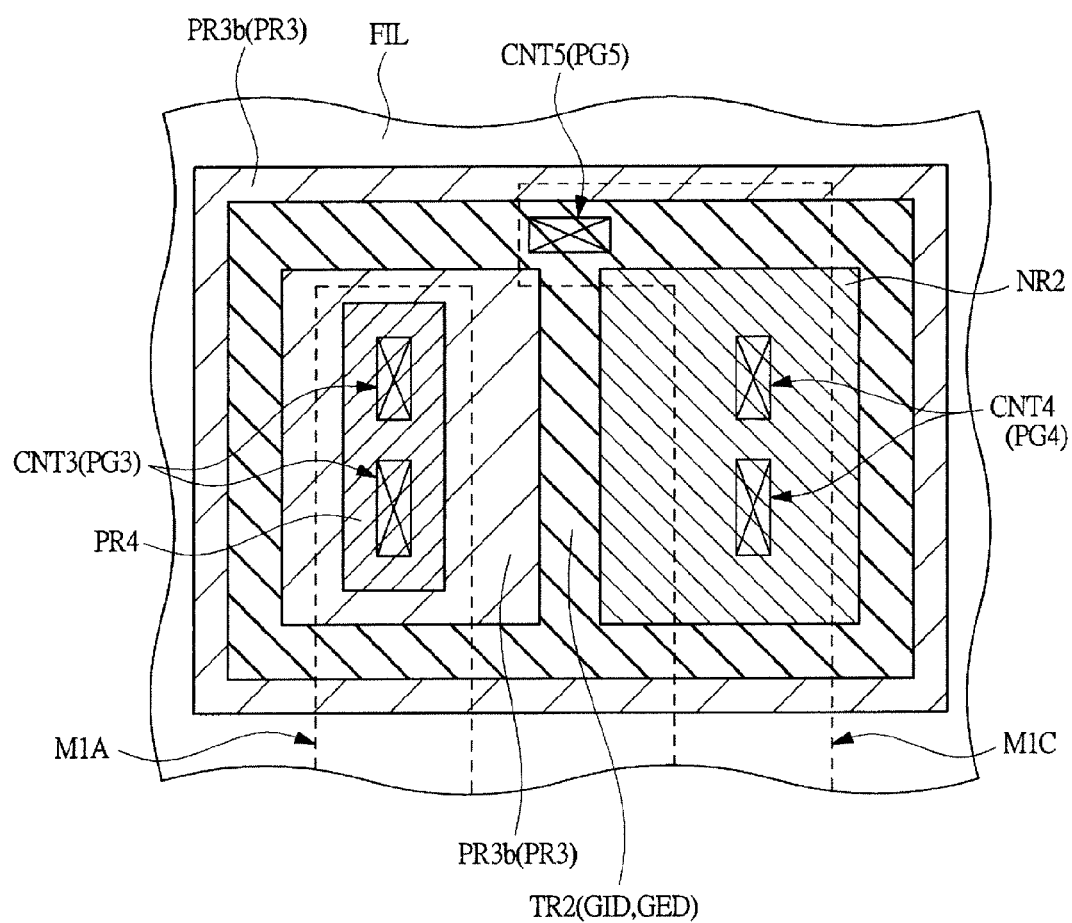
FIG. 42 is a main part plan view of a semiconductor device according to a first modified example.
Figure 43:
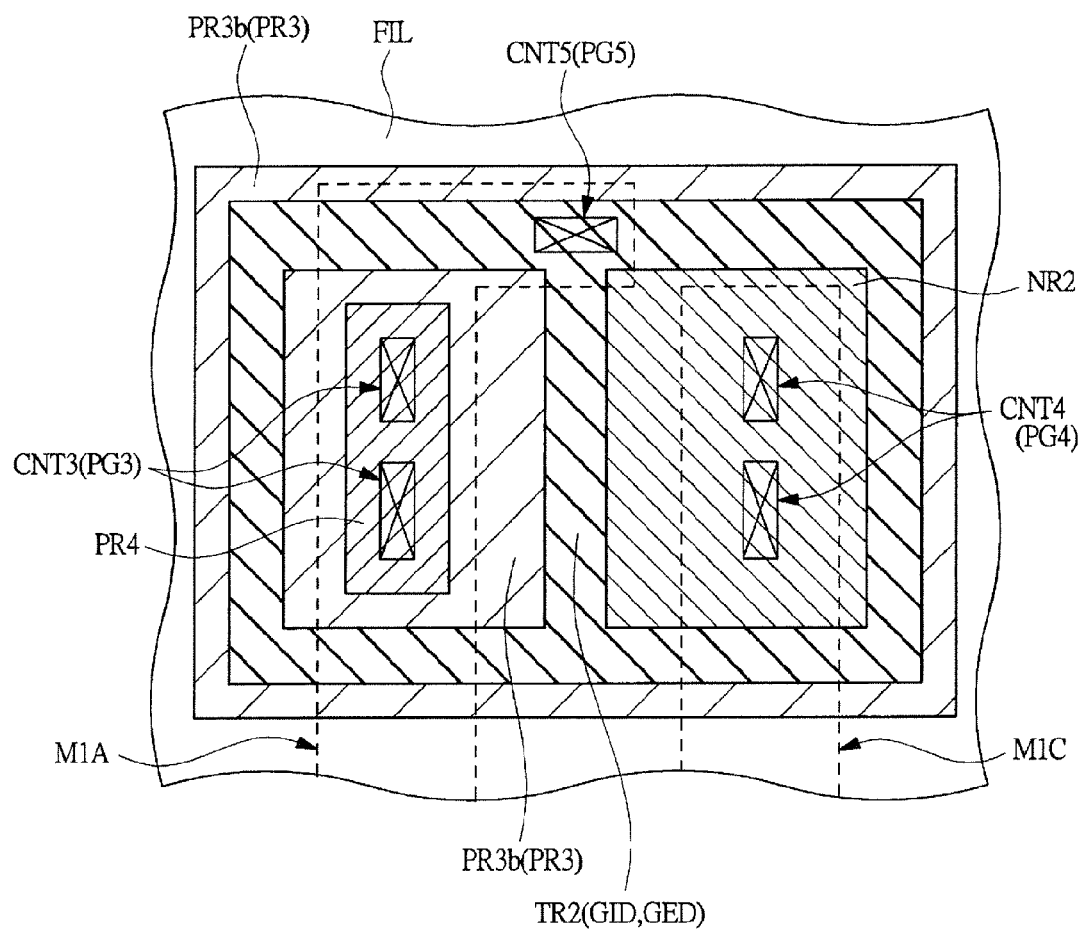
FIG. 43 is a main part plan view of a semiconductor device according to a second modified example.

Next, a modified example of the semiconductor device according to the present embodiment will be described. FIG. 42 is a main part plan view of the semiconductor device according to a first modified example of the present embodiment. FIG. 42 shows the diode forming region RG2. FIG. 43 is a main part plan view of the semiconductor device according to a second modified example of the present embodiment. FIG. 42 shows the diode forming region RG2. The first modified example in FIG. 42 corresponds to a modified example of the semiconductor device in FIGS. 4 to 7. FIG. 42 corresponds to FIG. 4. The second modified example in FIG. 43 corresponds to a modified example of the semiconductor device in FIGS. 36 to 39. FIG. 43 corresponds to FIG. 36.

In the same manner as in the semiconductor device shown in FIGS. 4 to 7, the trench TR2 surrounds the $n^+$-type semiconductor region NR2 in a planar view in the semiconductor device of the first modified example shown in FIG. 42. In the first modified example shown in FIG. 42, the trench TR2 further surrounds a portion (the p-type semiconductor region PR3a and the $p^+$-type semiconductor region PR4) where the anode p-type semiconductor region is exposed in the surface of the substrate SUB (epitaxial layer EP) in a planar view. The other components of the semiconductor device of the first modified example shown in FIG. 42 are the same as those of the semiconductor device shown in FIGS. 4 to 7.

In the same manner as in the semiconductor device shown in FIGS. 36 to 39, the trench TR2 surrounds the $n^+$-type semiconductor region NR2 in a planar view in the semiconductor device of the second modified example shown in FIG. 43. In the same manner as in the first modified example shown in FIG. 42, in the second modified example shown in FIG. 42, the trench TR2 further surrounds a portion (the p-type semiconductor region PR3a and the $p^+$-type semiconductor region PR4) where the anode p-type semiconductor region is exposed in the surface of the substrate SUB (epitaxial layer EP) in a planar view. The other components of the semiconductor device of the second modified example shown in FIG. 43 are the same as those of the semiconductor device shown in FIGS. 36 to 39.

In other words, in the first modified example shown in FIG. 42 and the second modified example shown in FIG. 43, two planar regions are provided which are planarly surrounded by the trench TR2 and which are adjacent to each other with the trench TR2 in between. The cathode $n^+$-type semiconductor region NR2 is disposed in one of the planar regions. The anode region is exposed in the other planar region and the plug PG4 (wiring M1A) is coupled to the anode region.

The first modified example shown in FIG. 42 and the second modified example shown in FIG. 43 can also obtain the same effects as those of the present embodiment described above.

Figure 44:
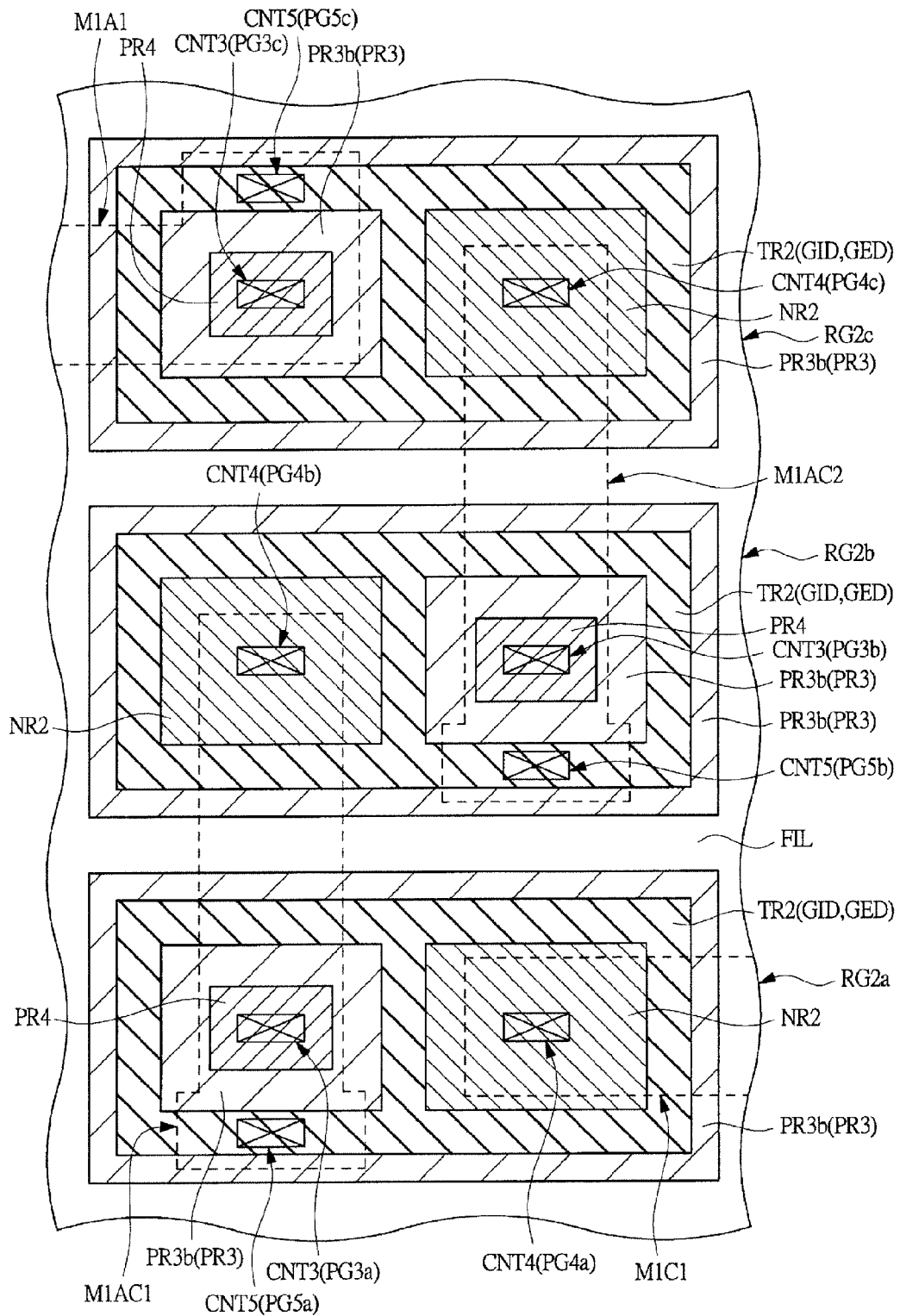
FIG. 44 is a main part plan view of a semiconductor device according to a third modified example of the embodiment.
Figure 45:
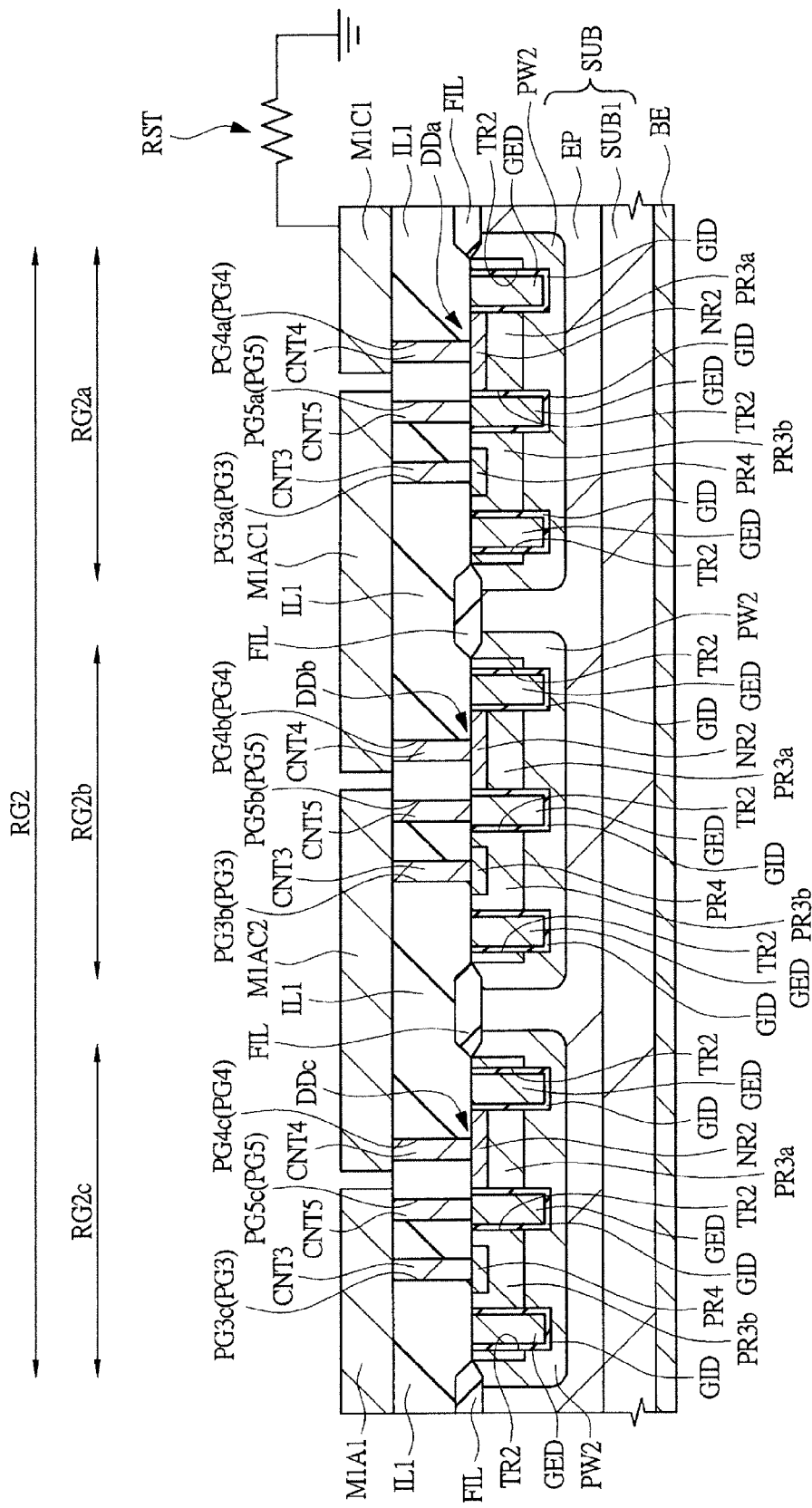
FIG. 45 is a main part cross-sectional view of the semiconductor device according to the third modified example of the embodiment.

FIGS. 44 and 45 are a main part plan view (FIG. 44) and a main part cross-sectional view (FIG. 45) of a semiconductor device according to a third modified example of the present embodiment. FIG. 44 shows a plan view of the diode forming region RG2. FIG. 45 shows a cross-sectional view of the diode forming region RG2. Since FIG. 45 is a schematic cross-sectional view of the diode forming region RG2, FIG. 45 does not completely correspond to a cross-sectional view of FIG. 44. In FIG. 45, the insulating film IL2 is not shown so as to make the drawing easy to see. FIG. 44 is a plan view and the same hatching as that applied in FIG. 4 is applied in FIG. 44.

In the semiconductor device according to the third modified example shown in FIGS. 44 and 45, a plurality of diodes are formed in the diode forming region RG2 and the diodes are coupled in series. Here, as an example, a case will be described in which three diodes are formed and coupled in series in the diode forming region RG2.

In the semiconductor device according to the third modified example shown in FIGS. 44 and 45, the diode forming region RG2 includes three diode forming regions RG2a, RG2b, and RG2c and the diode forming regions RG2a, RG2b, and RG2c are separated from each other by the field insulating film (element separation region) FIL. In the case of FIGS. 44 and 45, the diode forming region RG2b is disposed adjacent to the diode forming region RG2a and the diode forming region RG2c is disposed adjacent to the diode forming region RG2b (on the opposite side of the diode forming region RG2a).

In the semiconductor device according to the third modified example shown in FIGS. 44 and 45, in each of the substrates SUB (epitaxial layers EP) of the diode forming regions RG2a, RG2b, and RG2c, the p-type well PW2, the p-type semiconductor regions PR3a, PR3b, and PR4, the $n^+$-type semiconductor region NR2, and the trench TR2 are formed. The configuration of the p-type well PW2, the p-type semiconductor regions PR3a, PR3b, and PR4, the $n^+$-type semiconductor region NR2, and the trench TR2 in each of the diode forming regions RG2a, RG2b, and RG2c is the same as one of those in FIGS. 4 to 7, FIGS. 36 to 39, FIG. 42, and FIG. 43, so that redundant description will be omitted. Also in the diode forming regions RG2a, RG2b, and RG2c, the dummy gate electrode GED is buried in the trench TR2 through the dummy gate insulating film GID.

However, in the semiconductor device according to the third modified example shown in FIGS. 44 and 45, the coupling relationship between the plug and the wiring formed in the diode forming regions RG2a, RG2b, and RG2c is partially different from that in FIGS. 4 to 7 (or FIGS. 36 to 39). The difference will be described below.

In the diode forming region RG2a, a diode DDa is formed by a PN junction between the n+-type semiconductor region NR2 and the p-type semiconductor region PR3a (hereinafter the diode DD formed in the diode forming region RG2a is referred to as the "diode DDa"). In the diode forming region RG2b, a diode DDb is formed by a PN junction between the n+-type semiconductor region NR2 and the p-type semiconductor region PR3a (hereinafter the diode DD formed in the diode forming region RG2b is referred to as the "diode DDb"). In the diode forming region RG2c, a diode DDc is formed by a PN junction between the n+-type semiconductor region NR2 and the p-type semiconductor region PR3a (hereinafter the diode DD formed in the diode forming region RG2c is referred to as the "diode DDc"). The diodes DDa, DDb, and DDc are coupled in series. Specifically, the anode of the diode DDa in the diode forming region RG2a is coupled to the cathode of the diode DDb in the diode forming region RG2b and the anode of the diode DDb in the diode forming region RG2b is coupled to the cathode of the diode DDc in the diode forming region RG2c.

More specifically, a plug PG3a coupled to the p-type semiconductor region PR4 in the diode forming region RG2a (the plug PG3 in the diode forming region RG2a is referred to as the "plug PG3a") is coupled to a wiring M1AC1, and the wiring M1AC1 is also coupled to a plug PG4b in the diode forming region RG2b (the plug PG4 in the diode forming region RG2b is referred to as the "plug PG4b"). The plug PG4b is coupled to the n+-type semiconductor region NR2 in the diode forming region RG2b. Therefore, the p-type semiconductor region PR4 in the diode forming region RG2a (the anode p-type semiconductor region of the diode DDa) is electrically coupled to the n+-type semiconductor region NR2 in the diode forming region RG2b (the cathode n-type semiconductor region of the diode DDb) through the plug PG3a, the wiring M1AC1, and the plug PG4b. The wiring M1AC1 doubles as both the anode wiring of the diode DDa in the diode forming region RG2a and the cathode wiring of the diode DDb in the diode forming region RG2b.

Further, a plug PG3b coupled to the p-type semiconductor region PR4 in the diode forming region RG2b (the plug PG3 in the diode forming region RG2b is referred to as the "plug PG3b") is coupled to a wiring M1AC2, and the wiring M1AC2 is also coupled to a plug PG4c in the diode forming region RG2c (the plug PG4 in the diode forming region RG2c is referred to as the "plug PG4c"). The plug PG4c is coupled to the n+-type semiconductor region NR2 in the diode forming region RG2c. Therefore, the p-type semiconductor region PR4 in the diode forming region RG2b (the anode p-type semiconductor region of the diode DDb) is electrically coupled to the n+-type semiconductor region NR2 in the diode forming region RG2c (the cathode n-type semiconductor region of the diode DDc) through the plug PG3b, the wiring M1AC2, and the plug PG4c. The wiring M1AC2 doubles as both the anode wiring of the diode DDb in the diode forming region RG2b and the cathode wiring of the diode DDc in the diode forming region RG2c.

A plug PG4a (the plug PG4 in the diode forming region RG2a is referred to as the "plug PG4a") coupled to the n+-type semiconductor region NR2 (the cathode n-type semiconductor of the diode DDa) in the diode forming region RG2a is coupled to a wiring M1C1. A plug PG3c (the plug PG3 in the diode forming region RG2c is referred to as the "plug PG3c") coupled to the p-type semiconductor region PR4 (the anode p-type semiconductor of the diode DDc) in the diode forming region RG2c is coupled to a wiring M1A1.

The wiring M1C1 is the cathode wiring of the diode DDa in the diode forming region RG2a and the wiring M1A1 is the anode wiring of the diode DDc in the diode forming region RG2c. Although the wirings M1A1, M1AC1, M1AC2, and M1C1 are formed of the wiring M1, the wirings M1A1, M1AC1, M1AC2, and M1C1 are separated from each other.

Thereby, the diode DDa in the diode forming region RG2a, the diode DDb in the diode forming region RG2b, and the diode DDc in the diode forming region RG2c are coupled in series between the wiring M1C1 and the wiring M1A1. These diodes coupled in series can be used as the aforementioned diode DD1 for detecting temperature.

Also in the semiconductor device according to the third modified example shown in FIGS. 44 and 45, each cathode n+-type semiconductor region NR2 in the diode forming regions RG2a, RG2b, and RG2c is planarly surrounded by the trench TR2. Thereby, a PN junction that forms a diode is formed in the bottom surface of the cathode n+-type semiconductor region NR2 in each of the diode forming regions RG2a, RG2b, and RG2c. Therefore, even if the crystal defects caused by the ion implantation (corresponding to the crystal defects described in relation to the comparative example in FIG. 35) are formed near the surface of the substrate SUB (epitaxial layer EP), it is possible to prevent the crystal defects from affecting the PN junction of the diode. Therefore, the characteristics of the diode can be improved, so that it is possible to improve performance of the semiconductor device including the trench gate type MISFET and the diode.

Also in the semiconductor device according to the third modified example shown in FIGS. 44 and 45, the dummy gate electrodes GED formed in the diode forming regions RG2a, RG2b, and RG2c are electrically coupled to the anode or the cathode of the diodes DDa, DDb, and DDc.

Specifically, a plug PG5a (the plug PG5 in the diode forming region RG2a is referred to as the "plug PG5a") coupled to the dummy gate electrode GED in the diode forming region RG2a is coupled to the wiring M1AC1. Thereby, the dummy gate electrode GED in the diode forming region RG2a is electrically coupled to the p-type semiconductor region PR4 in the diode forming region RG2a through the plugs PG5a and PG3a and the wiring M1AC1 and is also electrically coupled to the n+-type semiconductor region NR2 in the diode forming region RG2b through the plugs PG5a and PG4b and the wiring M1AC1. In other words, the dummy gate electrode GED in the diode forming region RG2a is electrically coupled to the cathode n-type semiconductor region of the diode DDb and the anode p-type semiconductor region of the diode DDa.

A plug PG5b (the plug PG5 in the diode forming region RG2b is referred to as the "plug PG5b") coupled to the dummy gate electrode GED in the diode forming region RG2b is coupled to the wiring M1AC2. Thereby, the dummy gate electrode GED in the diode forming region RG2b is electrically coupled to the p-type semiconductor region PR4 in the diode forming region RG2b through the plugs PG5b and PG3b and the wiring M1AC2 and is also electrically coupled to the n+-type semiconductor region NR2 in the diode forming region RG2c through the plugs PG5b and PG4c and the wiring M1AC2. In other words, the dummy gate electrode GED in the diode forming region RG2b is electrically coupled to the cathode n-type semiconductor region of the diode DDc and the anode p-type semiconductor region of the diode DDb.

A plug PG5c (the plug PG5 in the diode forming region RG2c is referred to as the "plug PG5c") coupled to the dummy gate electrode GED in the diode forming region RG2c is coupled to the wiring M1A1. Thereby, the dummy gate electrode GED in the diode forming region RG2c is electrically coupled to the p-type semiconductor region PR4 in the diode forming region RG2c (the anode p-type semiconductor of the diode DDc) through the plug PG5c and PG3c and the wiring M1A1.

As another form, it is possible to couple the dummy gate electrode GED in the diode forming region RG2a to the wiring M1A1 through the plug PG5a, couple the dummy gate electrode GED in the diode forming region RG2b to the wiring M1AC1 through the plug PG5b, and couple the dummy gate electrode GED in the diode forming region RG2c to the wiring M1AC2 through the plug PG5c.

Also in the semiconductor device according to the third modified example shown in FIGS. 44 and 45, the dummy gate electrodes GED do not have floating potential, but are electrically coupled to the anode or the cathode of one of the diodes DDa, DDb, and DDc, so that the potential of the dummy gate electrodes GED is stabilized. Therefore, it is possible to control or prevent the characteristics of the diode from varying (fluctuating).

In FIG. 44, the layout is elaborately designed as described below.

The diode forming region RG2b is disposed adjacent to the diode forming region RG2a and the diode forming region RG2c is disposed adjacent to the diode forming region RG2b (on the opposite side of the diode forming region RG2a). The cathode $n^+$-type semiconductor region NR2 in the diode forming region RG2a and the anode p-type semiconductor region (PR4, PR3b) coupled to the plug PG3b in the diode forming region RG2b face each other. The anode p-type semiconductor region (PR4, PR3b) coupled to the plug PG3a in the diode forming region RG2a and the cathode $n^+$-type semiconductor region NR2 in the diode forming region RG2b face each other. The cathode $n^+$-type semiconductor region NR2 in the diode forming region RG2b and the anode p-type semiconductor region (PR4, PR3b) coupled to the plug PG3c in the diode forming region RG2c face each other. The anode p-type semiconductor region (PR4, PR3b) coupled to the plug PG3b in the diode forming region RG2b and the cathode $n^+$-type semiconductor region NR2 in the diode forming region RG2c face each other.

Thereby, it is easy to couple the anode p-type semiconductor region (PR4, PR3b) in the diode forming region RG2a with the cathode $n^+$-type semiconductor region NR2 in the diode forming region RG2b through the plugs PG3a and PG4b and the wiring M1AC1. Also, it is easy to couple the anode p-type semiconductor region (PR4, PR3b) in the diode forming region RG2b with the cathode $n^+$-type semiconductor region NR2 in the diode forming region RG2c through the plugs PG3b and PG4c and the wiring M1AC2. Further, it is easy to arrange the wirings M1AC1, M1AC2, M1A1, and M1C1, and it is easy to process the wirings M1AC1, M1AC2, M1A1, and M1C1. Further, it is possible to reduce the wiring resistance.

To sum up, it is preferable that when coupling a plurality of diodes (here, the diodes DDa, DDb, and DDc), as seen in a direction in which the diode forming regions RG2a, RG2b, and RG2c are arranged, the anode p-type semiconductor region (PR4, PR3b) and the cathode n-type semiconductor region (NR2), which are exposed in the surface of the substrate SUB, are alternately arranged (arranged in a zigzag pattern). By doing so, it is easy to couple a plurality of diodes (here, the diodes DDa, DDb, and DDc) in series.

Next, an operation example in which the diodes DDa, DDb, and DDc are used as the aforementioned diode DD1 for detecting temperature will be described.

When the diodes DDa, DDb, and DDc are used as the diode DD1 for detecting temperature, as schematically shown in FIG. 45, the wiring M1C1 is coupled to the ground potential through the resistance RST. The resistance RST can be formed in the semiconductor device CP2 (control circuit DR). The ground potential is supplied from the semiconductor device CP2 (control circuit DR) to the wiring M1C1 through the resistance RST, and the ground potential is further supplied to the cathode $n^+$-type semiconductor region NR2 in the diode forming region RG2a through the wiring M1C1 and plug PG4a.

Figure 46:
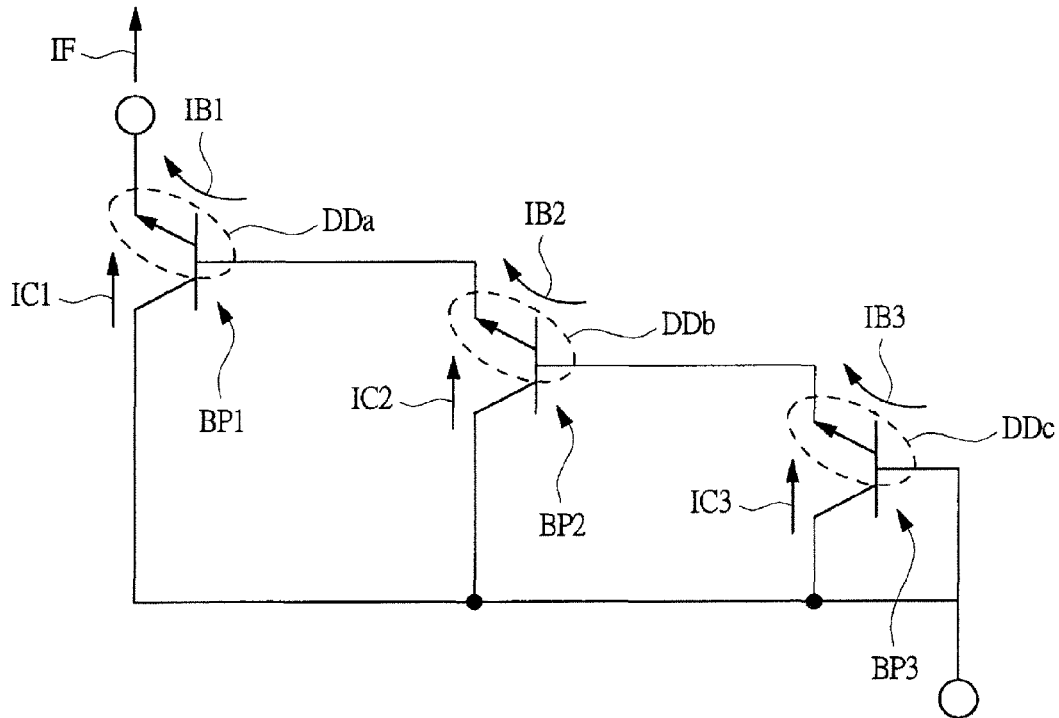
FIG. 46 is a circuit diagram of a temperature detection diode formed by a diode formed in a substrate.

The diodes DDa, DDb, and DDc are formed in the substrate SUB and the substrate SUB is formed of an n-type semiconductor. Therefore, a bipolar transistor is formed by the cathode $n^+$-type semiconductor region NR2, the anode p-type semiconductor region (region including the p-type semiconductor regions PR3a, PR3b, and PR4 and the p-type well PW2), and the n-type substrate SUB (epitaxial layer EP). A bipolar transistor formed by the cathode n-type semiconductor region (NR2), the anode p-type semiconductor region (PR3a, PR3b, PR4, and PW2), and the n-type substrate SUB in the diode forming region RG2a (diode DDa) is referred to as a bipolar transistor BP1. A bipolar transistor formed by the cathode n-type semiconductor region (NR2), the anode p-type semiconductor region (PR3a, PR3b, PR4, and PW2), and the n-type substrate SUB in the diode forming region RG2b (diode DDb) is referred to as a bipolar transistor BP2. A bipolar transistor formed by the cathode n-type semiconductor region (NR2), the anode p-type semiconductor region (PR3a, PR3b, PR4, and PW2), and the n-type substrate SUB in the diode forming region RG2c (diode DDc) is referred to as a bipolar transistor BP3. FIG. 46 is a circuit diagram of the temperature detection diode DD1 formed by the diodes DDa, DDb, and DDc. FIG. 46 shows a state in which the diodes DDa, DDb, and DDc and the bipolar transistors BP1, BP2, and BP3 formed by the substrate SUB are Darlington-connected.

When operating the temperature detection diode DD1, a voltage (potential) higher than the ground potential is supplied to the back surface electrode BE and the wiring M1A1. Thereby, a voltage higher than the voltage supplied to the wiring M1C1 is supplied to the wiring M1A1, so that, as shown in the circuit diagram of FIG. 46, a current flows from the anode to the cathode in each diode DDa, DDb, and DDc. However, at this time, the bipolar transistors BP1, BP2, and BP3 also operate and a current flows from the back surface electrode BE to the cathode of each diode DDa, DDb, and DDc.

The current that flows from the anode to the cathode of the diode DDc is defined as a current IB3. The current that flows from the anode to the cathode of the diode DDb is defined as a current IB2. The current that flows from the anode to the cathode of the diode DDa is defined as a current IB1. A current that flows from the cathode of the diode DDc to the resistance RST through the wiring M1A is defined as a current IF. In this case, "IB2=IB3+IC3 and IB1=IB2+IC2 and IF=IB1+IC1" is established. Here, the current that flows from the back surface electrode BE (n-type substrate SUB) to the cathode of the diode DDc is a current IC3, the current that flows from the back surface electrode BE (n-type substrate SUB) to the cathode of the diode DDb is a current IC2, and the current that flows from the back surface electrode BE (n-type substrate SUB) to the anode of the diode DDa is a current IC1. Then, expressions $IB1 \approx IF/hFE$, $IB2 \approx IF/(hFE)^2$, and $IB3 \approx IF/(hFE)^3$ are established.

As seen from the bipolar transistors BP1, BP2, and BP3, the current IB3 corresponds to the base current of the bipolar transistor BP3 and the current IC3 corresponds to the collector current of the bipolar transistor BP3. The current IB2 corresponds to the base current of the bipolar transistor BP2 and the current IC2 corresponds to the collector current of the bipolar transistor BP2. The current IB1 corresponds to the base current of the bipolar transistor BP1 and the current IC1 corresponds to the collector current of the bipolar transistor BP1. In the above expressions, hFE is a DC current amplification factor.

Figure 47:
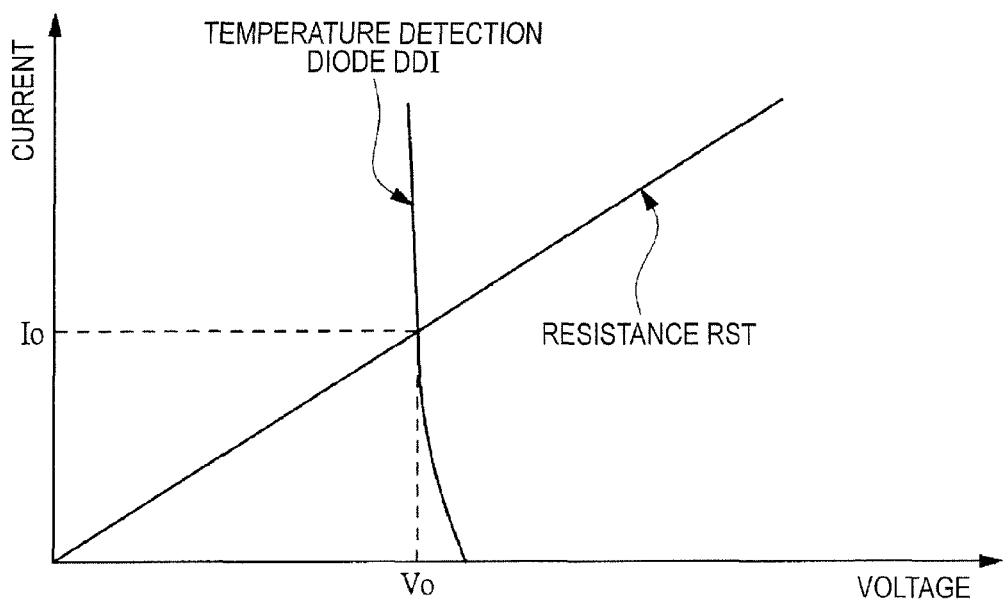
FIG. 47 is a graph showing voltage-current characteristics.

FIG. 47 is a graph showing voltage-current characteristics. Specifically, FIG. 47 shows voltage-current characteristics of the temperature detection diode DD1 and voltage-current characteristics of the resistance RST. The temperature detection diode DD1 is formed by the diodes DDa, DDb, and DDc coupled in series, and actually the temperature detection diode DD1 is formed by the bipolar transistors BP1, BP2, and BP3 which are Darlington-connected as shown in FIG. 46.

When the resistance RST and the temperature detection diode DD1 which have the voltage-current characteristics as shown in FIG. 47 are used, it is balanced when the voltage is $V_0$ and the current is $I_0$. Therefore, the voltage $V_0$ is applied to the temperature detection diode DD1 and the current $I_0$ flows in the temperature detection diode DD1 (the current IF equal to the current $I_0$ flows). However, when the temperature changes, the voltage-current characteristics of the temperature detection diode DD1 also change, and the voltage V0 and the current $I_0$ in a balanced state change. Therefore, the temperature of the temperature detection diode DD1 can be detected by monitoring (detecting) the one or both of the voltage $V_0$ and the current $I_0$.

The temperature detection diode DD1 can be formed by one diode DD or a plurality of diodes DD coupled in series (three diodes are coupled in series in FIGS. 44 to 46). The larger the number of diodes DD coupled in series, the larger the temperature dependence of the voltage-current characteristics of the temperature detection diode DD1. The larger the temperature dependence of the voltage-current characteristics of the temperature detection diode DD1, the more easily the accuracy of temperature detection by the temperature detection diode DD1 can be improved. Therefore, the accuracy of temperature detection by the temperature detection diode DD1 can be further improved by forming the temperature detection diode DD1 by a plurality of diodes DD (a plurality of diodes DD coupled in series).

In the present embodiment and second and third embodiments described below, a case is described in which the field insulating film FIL is formed in a semiconductor device (semiconductor chip). As another form, there may be no field insulating film FIL in the entire semiconductor device (in the entire semiconductor chip).

Second Embodiment

Figure 48:
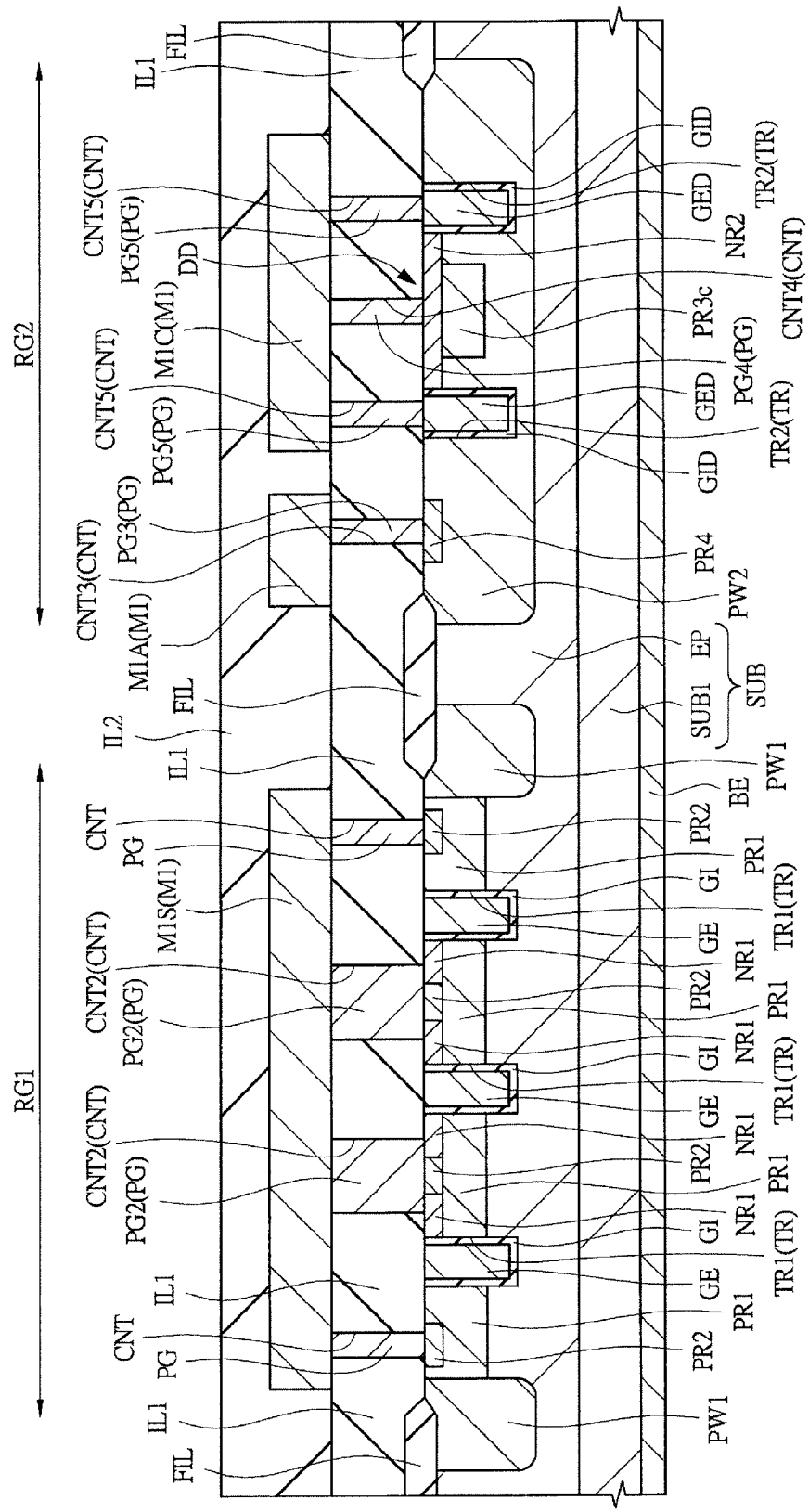
FIG. 48 is a main part cross-sectional view of a semiconductor device according to another embodiment.

FIG. 48 is a main part cross-sectional view of a semiconductor device according to a second embodiment. FIG. 48 corresponds to FIG. 1 in the first embodiment.

The second embodiment is basically the same as the first embodiment except that the p-type semiconductor region PR3b is not formed and a p-type semiconductor region PR3c is formed instead of the p-type semiconductor region PR3a. Hereinafter, the differences from the first embodiment will be mainly described.

In the second embodiment, as shown in FIG. 48, the p-type semiconductor region PR3b is not formed and the p-type semiconductor region PR3c is formed instead of the p-type semiconductor region PR3a in the diode forming region RG2. Specifically, in the first embodiment, the entire bottom surface (lower surface) of the cathode n$^+$-type semiconductor region NR2 is in contact with the p-type semiconductor region PR3a. However, in the second embodiment, a part of the bottom surface (lower surface) of the cathode n$^+$-type semiconductor region NR2 is in contact with the p-type semiconductor region PR3c and the other part is in contact with the p-type well PW2. In other words, in the second embodiment, the bottom surface (lower surface) of the cathode n$^+$-type semiconductor region NR2 includes a part in contact with the p-type semiconductor region PR3c and a part in contact with the p-type well PW2.

The p-type semiconductor region PR3c has an impurity concentration higher than that of the p-type well PW2 and the bottom surface of the p-type semiconductor region PR3c is shallower than the bottom surface of the p-type well PW2. The p-type semiconductor region PR3c and the p-type well PW2 are in contact with each other, so that they are electrically coupled to each other.

In the second embodiment, a PN junction that forms the diode DD is formed in the bottom surface (lower surface) of the cathode n$^+$-type semiconductor region NR2 in the same manner as in the first embodiment. However, while, in the first embodiment, the diode DD is formed by the PN junction between the n$^+$-type semiconductor region NR2 and the p-type semiconductor region PR3a directly below the n$^+$-type semiconductor region NR2, in the second embodiment, the diode DD is formed by a PN junction between the n$^+$-type semiconductor region NR2 and both the p-type semiconductor region PR3c and the p-type well PW2 which are located directly below the n$^+$-type semiconductor region NR2. In other words, in the second embodiment, the diode DD is formed by a PN junction between the n$^+$-type semiconductor region NR2 and the p-type semiconductor region PR3c directly below the n$^+$-type semiconductor region NR2 and a PN junction between the n$^+$-type semiconductor region NR2 and the p-type well PW2 directly below the n$^+$-type semiconductor region NR2.

Further, in the second embodiment, the p-type semiconductor region PR3b is not formed and the region in which the p-type semiconductor region PR3b is formed in the first embodiment is occupied by the p-type well PW2 in the second embodiment. Therefore, in the second embodiment, the p$^+$-type semiconductor region PR4 is in contact with the p-type well PW2 and is electrically coupled to the p-type well PW2. In the first embodiment, the anode p-type semiconductor region is formed by the p-type semiconductor regions PR3a, PR3b, and PR4 and the p-type well PW2. However, in the second embodiment, the anode p-type semiconductor region is formed by the p-type semiconductor regions PR3c and PR4 and the p-type well PW2.

When the p-type semiconductor region PR3c is formed by the same process (the same ion implantation process) as that of the p-type semiconductor region PR1, it is possible to reduce the number of manufacturing processes.

The other components in the second embodiment are substantially the same as those in the first embodiment, so that redundant description is omitted here.

Also in the second embodiment, it is possible to obtain the same effect as that of the first embodiment.

Specifically, also in the second embodiment, the cathode n$^+$-type semiconductor region NR2 is planarly surrounded by the trench TR2. Thereby, the PN junction that forms the diode DD is formed in the bottom surface of the cathode n$^+$-type semiconductor region NR2. Therefore, even if the crystal defects caused by the ion implantation (corresponding to the crystal defects described in relation to the comparative example in FIG. 35) are formed near the surface of the substrate SUB (epitaxial layer EP), it is possible to prevent the crystal defects from affecting the PN junction of the diode.

Therefore, the characteristics of the diode can be improved, so that it is possible to improve performance of the semiconductor device including the trench gate type MISFET and the diode.

Also in the second embodiment, the dummy gate electrodes GED do not have floating potential, but are electrically coupled to the anode or the cathode of the diode DD, so that the potential of the dummy gate electrodes GED is stabilized. Therefore, it is possible to control or prevent the characteristics of the diode from varying (fluctuating).

The p-type semiconductor region PR3c having an impurity concentration higher than that of the p-type well PW2 is provided directly below the n$^+$-type semiconductor region NR2 to be in contact with a part of the bottom surface of the n$^+$-type semiconductor region NR2, so that the diode characteristics can be more stabilized than the case of FIG. 41 (the reason is the same as in the case where the p-type semiconductor region PR3a is provided).

However, from the viewpoint of reduction of the number of manufacturing processes and easiness of manufacturing, the first embodiment is more advantageous than the second embodiment. This is because, in the second embodiment, the p-type semiconductor region PR3c is formed in only a part of the region directly below the n$^+$-type semiconductor region NR2, so that a photoresist pattern (photoresist pattern used as a mask for ion implantation) for forming the p-type semiconductor region PR3c is required. On the other hand, in the first embodiment, the p-type semiconductor region PR3a is formed in the entire region directly below the n$^+$-type semiconductor region NR2, so that a photoresist pattern (photoresist pattern used as a mask for ion implantation) for forming the p-type semiconductor region PR3a is not required.

Third Embodiment

Figure 49:
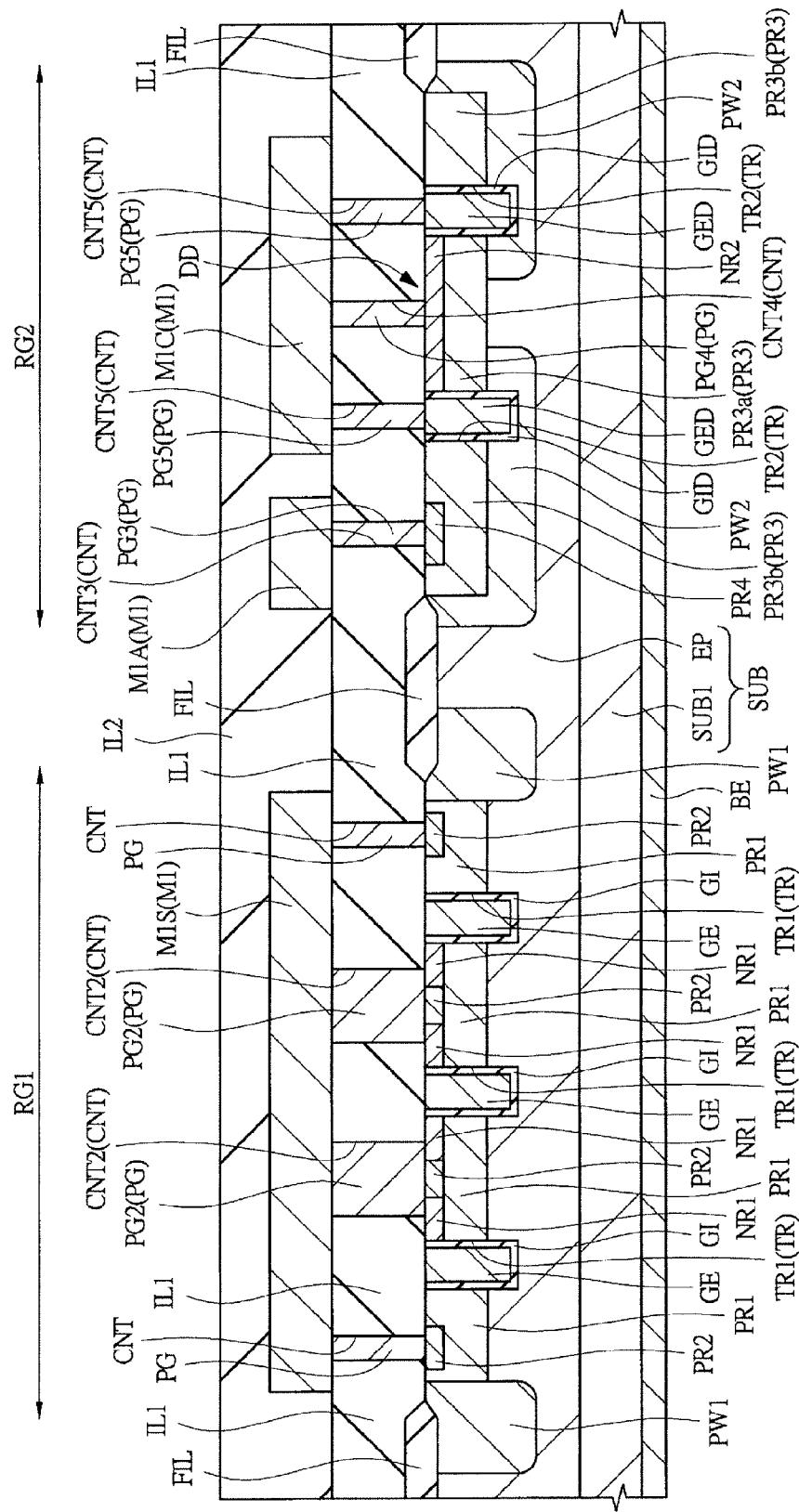
FIG. 49 is a main part cross-sectional view of a semiconductor device according to another embodiment.

FIG. 49 is a main part cross-sectional view of a semiconductor device according to a third embodiment. FIG. 49 corresponds to FIG. 1 in the first embodiment.

The third embodiment is basically the same as the first embodiment except that the p-type well PW2 is not formed directly below a part of the p-type semiconductor region PR3a. Hereinafter, the difference from the first embodiment will be mainly described.

In the third embodiment, as shown in FIG. 49, the diode forming region RG2 includes a region in which the p-type well PW2 is formed and a region in which the p-type well PW2 is not formed below the p-type semiconductor region PR3a. Specifically, in a region directly below a part of the p-type semiconductor region PR3a, the p-type well PW2 is formed and the p-type semiconductor region PR3a and the p-type well PW2 are in contact with each other. However, in a region directly below the other part of the p-type semiconductor region PR3a, the p-type well PW2 is not formed and the p-type semiconductor region PR3a and the n-type epitaxial layer EP are in contact with each other. Therefore, the p-type well PW2 is in contact with a part of the bottom surface (lower surface) of the p-type semiconductor region PR3a and the p-type well PW2 is not in contact with the other part of the bottom surface (lower surface) of the p-type semiconductor region PR3a (the n-type epitaxial layer EP is in contact with the other part).

However, in the third embodiment, the p-type well PW2 extends below the trench TR2 in the same manner as in the first embodiment. Therefore, also in the third embodiment, the p-type semiconductor region PR3a can be electrically coupled to the p-type semiconductor region (p-type well PW2, p-type semiconductor region PR3b, and p$^+$-type semiconductor region PR4) in a region adjacent to the n$^+$-type semiconductor region NR2 with the trench TR2 in between through a part of the p-type well PW2 which is located directly below the p-type semiconductor region PR3a and a part of the p-type well PW2 which is located directly below the trench TR2. Thereby, also in the third embodiment, it is possible to easily electrically couple the anode wiring M1A (plug PG3) to the p-type semiconductor region (p-type semiconductor region PR3a) directly below the cathode n$^+$-type semiconductor region NR2 through the p-type semiconductor region.

The other components in the third embodiment are substantially the same as those in the first embodiment, so that redundant description is omitted here.

Also in the third embodiment, it is possible to obtain the same effect as that of the first embodiment.

Specifically, also in the third embodiment, the cathode n$^+$-type semiconductor region NR2 is planarly surrounded by the trench TR2. Thereby, the PN junction that forms the diode DD is formed in the bottom surface of the cathode n$^+$-type semiconductor region NR2. Therefore, even if the crystal defects caused by the ion implantation (corresponding to the crystal defects described in relation to the comparative example in FIG. 35) are formed near the surface of the substrate SUB (epitaxial layer EP), it is possible to prevent the crystal defects from affecting the PN junction of the diode. Therefore, the characteristics of the diode can be improved, so that it is possible to improve performance of the semiconductor device including the trench gate type MISFET and the diode.

Also in the third embodiment, the dummy gate electrodes GED do not have floating potential, but are electrically coupled to the anode or the cathode of the diode DD, so that the potential of the dummy gate electrodes GED is stabilized. Therefore, it is possible to control or prevent the characteristics of the diode from varying (fluctuating).

When comparing the third embodiment (FIG. 49) with the first embodiment (FIG. 1 and the like), the first embodiment in which the p-type well PW2 is formed in the entire region directly below the p-type semiconductor region PR3a is more preferable than the third embodiment in which the p-type well PW2 is not formed in a part of the region directly below the p-type semiconductor region PR3a. One of reasons is as described below.

In the third embodiment (FIG. 49), the hFE (DC current amplification factor) of the bipolar transistor (corresponding to the bipolar transistors BP1, BP2, and BP3) including the cathode n-type semiconductor region (NR2) of the diode, the anode p-type semiconductor region (PR3a, PR3b, PR4, and PW2) of the diode, and the n-type substrate SUB is higher than that of the first embodiment (FIG. 1 and the like). This is because while the p-type well PW2 is not formed in a part of the region directly below the p-type semiconductor region PR3a in the third embodiment, the p-type well PW2 is formed in the entire region directly below the p-type semiconductor region PR3a in the first embodiment.

It is possible to increase the temperature dependence of the voltage-current characteristics of the temperature detection diode DD1 by forming the temperature detection diode DD1 by a plurality of diodes DD coupled in series and increasing the number of the diodes DD coupled in series, and thereby it is possible to improve the accuracy of temperature detection by the temperature detection diode DD1. However, when the hFE is large, the base current (a current flowing in the diode DD) is small, so that the effect obtained by increasing the number of the diodes DD coupled in series decreases. Therefore, it is preferable that the hFE is low to some extent. Therefore, the first embodiment in which the p-type well PW2 is formed in the entire region directly below the p-type semiconductor region PR3a is more advantageous than the third embodiment in which the p-type well PW2 is not formed in a part of the region directly below the p-type semiconductor region PR3a.

While the invention made by the inventors has been specifically described on the basis of the embodiments, it is needless to say that the present invention is not limited to the foregoing embodiments but can be variously modified without departing from the scope of the invention.

What is claimed is:

1. A method for manufacturing a semiconductor device including a trench gate type field effect transistor and a diode which are formed in a semiconductor substrate, the method comprising the steps of:
   (a) preparing the semiconductor substrate;
   (b) after the step (a), forming a first trench and a second trench in the semiconductor substrate;
   (c) after the step (b), forming a gate electrode of the trench gate type field effect transistor in the first trench through a gate insulating film and forming a dummy gate electrode in the second trench through a dummy gate insulating film;
   (d) after the step (a), forming a first semiconductor region in the semiconductor substrate, the first semiconductor region of a first conductivity type; and
   (e) after the step (a), forming a second semiconductor region in the semiconductor substrate, the second semiconductor region having a second conductivity type opposite to the first conductivity type,
   wherein the second semiconductor region is planarly surrounded by the second trench,
   wherein a part of the first semiconductor region is located directly below the second semiconductor region and a PN junction is formed between the second semiconductor region and the part of the first semiconductor region located directly below the second semiconductor region, and thereby the diode is formed, and
   wherein the dummy gate electrode is electrically coupled to one of the first semiconductor region and the second semiconductor region.

2. The method for manufacturing a semiconductor device according to claim 1, further comprising:
   (f) after the steps (a), (b), (c), (d), and (e), forming an interlayer insulating film over a main surface of the semiconductor substrate;
   (g) forming contact holes in the interlayer insulating film; and
   (h) after the step (g), forming wirings,
   wherein a first wiring of the wirings is electrically coupled to one of the first semiconductor region and the second semiconductor region and also electrically coupled to the dummy gate electrode.

3. The method for manufacturing a semiconductor device according to claim 2,
   wherein a side surface of the second semiconductor region is in contact with the second trench and is not in contact with the first semiconductor region, and
   wherein a bottom of the first semiconductor region is deeper than a bottom of the second trench.

4. The method for manufacturing a semiconductor device according to claim 3,
   wherein the step (d) includes the steps of:
      (d1) forming a second region of the first conductivity type in the semiconductor substrate; and
      (d2) forming a first region of the first conductivity type having an impurity concentration higher than that of the second region in the semiconductor substrate,
   wherein the first semiconductor region includes the first region and the second region,
   wherein a bottom of the second region is deeper than the bottom of the second trench,
   wherein a bottom of the first region is shallower than the bottom of the second trench,
   wherein the first region is in contact with the second region, and
   wherein the first region formed in the step (d2) is located directly below the second semiconductor region formed in the step (e) and in contact with the second semiconductor region.

5. The method for manufacturing a semiconductor device according to claim 4,
   wherein in the step (d2), the first region is formed by the same ion implantation process as that for forming a semiconductor region for a channel region of the trench gate type field effect transistor.

6. The method for manufacturing a semiconductor device according to claim 5,
   wherein in the step (e), the second semiconductor region is formed by the same ion implantation process as that for forming a semiconductor region for a source region of the trench gate type field effect transistor.

7. The method for manufacturing a semiconductor device according to claim 6,
   wherein in the step (c), a gate leader which is integrally formed with the gate electrode and extends over the semiconductor substrate is also formed,
   wherein in the step (d1), the second region is formed by the same ion implantation process as that for forming a fourth semiconductor region of the first conductivity type in the semiconductor substrate,
   wherein the fourth semiconductor region is located below the gate leader, and
   wherein a bottom of the fourth semiconductor region is deeper than a bottom of the first trench.

8. The method for manufacturing a semiconductor device according to claim 7,
   wherein the step (d1) is performed after the step (a) and before the step (b), and
   wherein the steps (d2) and (e) are performed after the step (c) and before the step (f).

9. The method for manufacturing a semiconductor device according to claim 8,
   wherein the semiconductor substrate is of the second conductivity type.

* * * * *

UNITED STATES PATENT AND TRADEMARK OFFICE
CERTIFICATE OF CORRECTION

Page 1 of 1

PATENT NO. : 8,969,150 B2
APPLICATION NO. : 14/324632
DATED : March 3, 2015
INVENTOR(S) : Hiroaki Katou et al.

It is certified that error appears in the above-identified patent and that said Letters Patent is hereby corrected as shown below:

Specification

Column 25, Line 65: Delete "MLA)" and insert -- M1A) --

Signed and Sealed this
Twenty-fourth Day of November, 2015

Michelle K. Lee
*Director of the United States Patent and Trademark Office*